US010416560B2

(12) United States Patent
Matsumoto et al.

(10) Patent No.: US 10,416,560 B2
(45) Date of Patent: Sep. 17, 2019

(54) COLORING AGENT DISPERSION, PHOTOSENSITIVE RESIN COMPOSITION, CURED PRODUCT, ORGANIC EL ELEMENT, METHOD FOR FORMING PATTERN, AND METHOD FOR PRODUCING PHOTOSENSITIVE RESIN COMPOSITION

(71) Applicant: TOKYO OHKA KOGYO CO., LTD., Kawasaki-shi (JP)

(72) Inventors: Naozumi Matsumoto, Kawasaki (JP); Yasuhide Ohuchi, Kawasaki (JP); Tatsuro Ishikawa, Kawasaki (JP); Mayumi Kuroko, Kawasaki (JP); Dai Shiota, Kawasaki (JP)

(73) Assignee: TOKYO OHKA KOGYO CO, LTD., Kawasaki-Shi (JP)

( * ) Notice: Subject to any disclaimer, the term of this patent is extended or adjusted under 35 U.S.C. 154(b) by 72 days.

(21) Appl. No.: 15/791,667

(22) Filed: Oct. 24, 2017

(65) Prior Publication Data
US 2018/0113383 A1    Apr. 26, 2018

(30) Foreign Application Priority Data

Oct. 25, 2016    (JP) ................. 2016-209008

(51) Int. Cl.
| C09B 67/46 | (2006.01) |
| G03F 7/004 | (2006.01) |
| G02B 5/20 | (2006.01) |
| G03F 7/075 | (2006.01) |
| C09B 67/20 | (2006.01) |
| G03F 7/028 | (2006.01) |
| G03F 7/16 | (2006.01) |
| G03F 7/20 | (2006.01) |
| G03F 7/26 | (2006.01) |
| C09B 5/62 | (2006.01) |
| C09B 57/00 | (2006.01) |
| G03F 7/00 | (2006.01) |
| G03F 7/027 | (2006.01) |
| G03F 7/038 | (2006.01) |
| G03F 7/105 | (2006.01) |

(52) U.S. Cl.
CPC .............. *G03F 7/0755* (2013.01); *C09B 5/62* (2013.01); *C09B 57/00* (2013.01); *C09B 67/0069* (2013.01); *G03F 7/0007* (2013.01); *G03F 7/027* (2013.01); *G03F 7/028* (2013.01); *G03F 7/038* (2013.01); *G03F 7/105* (2013.01); *G03F 7/16* (2013.01); *G03F 7/20* (2013.01); *G03F 7/26* (2013.01)

(58) Field of Classification Search
CPC ........ G03F 7/0007; G03F 7/027; G03F 7/028; G03F 7/038; G03F 7/105; G03F 7/0757; G03F 7/20; G03F 7/2002; C09B 67/0069
USPC .......... 430/7, 280.1, 281.1, 287.1, 320, 321
See application file for complete search history.

(56) References Cited

U.S. PATENT DOCUMENTS

| 2014/0231729 A1* | 8/2014 | Shiota .................... G02B 5/223 252/586 |
| 2016/0272765 A1* | 9/2016 | Tang ..................... C08F 220/10 |
| 2017/0174938 A1* | 6/2017 | Shin ....................... C03C 17/32 |

FOREIGN PATENT DOCUMENTS

| WO | WO 2013/069789 A1 | 5/2013 |
| WO | WO 2015/152617 A1 * | 10/2015 |

* cited by examiner

*Primary Examiner* — John A McPherson
(74) *Attorney, Agent, or Firm* — Knobbe, Martens, Olson & Bear LLP

(57) ABSTRACT

A coloring agent dispersion which contains a satisfactorily dispersed pigment, and results in a photosensitive resin composition capable of forming a cured film when mixed in the photosensitive resin composition; a photosensitive resin composition containing the coloring agent dispersion; a cured product of the composition; an organic EL element provided with the cured product; a method for forming a pattern using the composition; and a method for producing a photosensitive resin composition using the dispersion. In a coloring agent dispersion including a coloring agent which contains a pigment and a dispersant, a dispersant containing a silsesquioxane compound of a specific structure is used.

18 Claims, No Drawings

COLORING AGENT DISPERSION, PHOTOSENSITIVE RESIN COMPOSITION, CURED PRODUCT, ORGANIC EL ELEMENT, METHOD FOR FORMING PATTERN, AND METHOD FOR PRODUCING PHOTOSENSITIVE RESIN COMPOSITION

RELATED APPLICATIONS

This application claims priority to Japanese Patent Application No. 2016-209008, filed Oct. 25, 2016, the entire content of which is incorporated herein by reference.

BACKGROUND OF THE INVENTION

Field of the Invention

The present invention relates to a coloring agent dispersion, a photosensitive resin composition containing the coloring agent dispersion, a cured product of the photosensitive resin composition, an organic EL element provided with the cured product, a method for forming a pattern using the photosensitive resin composition mentioned above, and a method for producing a photosensitive resin composition using the coloring agent dispersion mentioned above.

Related Art

There have hitherto been produced optical elements such as an organic EL display element, a color filter, and an organic TFT array by forming a bank (barrier rib) surrounding pixels on a substrate, and providing various functional layers in a region surrounded by the bank. There has been known, as the method for easily forming such bank, a method in which a bank is formed by a photolithography method using a photosensitive resin composition (see Patent Document 1, etc.).

Patent Document 1: Pamphlet of PCT International Publication No. WO2013/069789

SUMMARY OF THE INVENTION

However, when a cured film to be usable as the bank is formed in accordance with the method mentioned in Patent Document 1, there are concerns that the amount of a gas generated from the cured film increases. In an organic EL element, the bank is provided so as to come into contact with an electrode layer made of ITO and a luminous layer. When the electrode layer and the luminous layer are contaminated with a gas generated from the bank, there are concerns that degradation of these layers is accelerated. Therefore, there has been required a photosensitive resin composition capable of forming a cured film which scarcely generates a gas.

Due to various causes, a gas is generated from the cured film of the photosensitive resin composition, and one of causes includes decomposition of various components included in the photosensitive resin composition. In this respect, the photosensitive resin composition to be used to form a cured film, which is used as the bank, usually contains a coloring agent dispersion containing a pigment dispersed by a dispersant, and it is considered that the dispersant is one cause of gas generation due to decomposition. Therefore, it is expected that the generation of a gas from the cured film is suppressed by modification of the dispersant included in the coloring agent dispersion. Meanwhile, since it is a pigment dispersion, as a matter of course, the pigment dispersion is required to maintain satisfactory dispersion of the pigment.

The present invention has been made in light of the problems mentioned above, and an object thereof is to provide a coloring agent dispersion which contains a satisfactorily dispersed pigment, and also gives a photosensitive resin composition capable of forming a cured film, which scarcely generates a gas, when mixed in the photosensitive resin composition; a photosensitive resin composition containing the coloring agent dispersion; a cured product of the photosensitive resin composition; an organic EL element provided with the cured product; a method for forming a pattern using the photosensitive resin composition mentioned above; and a method for producing a photosensitive resin composition using the coloring agent dispersion mentioned above.

The present inventors have intensively studied so as to solve the problems mentioned above and found that the problems mentioned above can be solved by using a dispersant (E2) containing a silsesquioxane compound of a specific structure in a coloring agent dispersion containing a coloring agent (E) which contains a pigment (E1) and the dispersant (E2), and thus the present invention has been completed. Specifically, the present invention provides the following.

A first aspect of the present invention is a coloring agent dispersion comprising a coloring agent (E), wherein
the coloring agent (E) contains a pigment (E1) and a dispersant (E2), and
the dispersant (E2) contains a silsesquioxane compound including a constituent unit represented by the following formula (e2a):

wherein, in the formula (e2a), $R^{e1}$ is a monovalent organic group.

A second aspect of the present invention is a photosensitive resin composition comprising an alkali-soluble resin (A), a photopolymerizable monomer (B), a photopolymerization initiator (C), and the coloring agent dispersion according to the first aspect.

A third aspect of the present invention is a cured product obtained by curing the photosensitive resin composition according to the second aspect.

A fourth aspect of the present invention is an organic EL element comprising the cured product according to the third aspect.

A fifth aspect of the present invention is a method for forming a pattern, the method comprising:
applying the photosensitive resin composition according to the second aspect to form a coating film;
subjecting the coating film to regioselective exposure; and
developing the exposed coating film.

A sixth aspect of the present invention is a method for producing the photosensitive resin composition according to the second aspect, the method comprising: dispersing the pigment (E1) in a liquid in the presence of the dispersant (E2) to prepare the coloring agent dispersion; and
mixing the coloring agent dispersion, the alkali-soluble resin (A), the photopolymerizable monomer (B), and the photopolymerization initiator (C).

According to the present invention, it is possible to provide a photosensitive resin composition capable of forming a cured film which scarcely generates a gas; a bank for demarcation of a luminous layer in a cured film and an organic EL element formed using the photosensitive resin composition mentioned above; a substrate for an organic EL element provided with the bank mentioned above, and an organic EL element; a method for producing a bank for demarcation of a luminous layer in a cured film and an organic EL element, using the photosensitive resin composition mentioned above; and a method for producing an organic EL element, using a substrate for an organic EL element provided with the bank mentioned above.

DETAILED DESCRIPTION OF THE INVENTION

The present invention will be described below by way of preferred embodiments.

"To" as used herein means a range between the lower limit and the upper limit inclusive, unless otherwise specified.

<<Coloring Agent Dispersion>>

A coloring agent dispersion includes a coloring agent (E). The coloring agent (E) includes a pigment (E1) and a dispersant (E2). The dispersant (E2) includes a silsesquioxane compound having a constituent unit represented by the following formula (e2a):

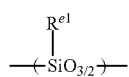

(e2a)

wherein, in the formula (e2a), $R^{e1}$ is a monovalent organic group. The pigment is well dispersed, since such coloring agent dispersion includes the above-mentioned dispersant (E2). Furthermore, in a cured article formed by using a photosensitive resin composition including the above-mentioned dispersant (E2), a generation of gas is suppressed.

Hereinafter, a description will be made of components included in a coloring agent dispersion and a method for producing the coloring agent dispersion.

<Coloring Agent (E)>

The coloring agent dispersion includes a coloring agent (E). The coloring agent (E) essentially includes a pigment (E1) and a dispersant (E2).

The coloring agent (E) may include a dye as a coloring ingredient other than pigment (E1), if necessary. This dye is appropriately selected from known materials. Examples of the dye include an azo dye, a metal complex salt azo dye, an anthraquinone dye, a triphenylmethane dye, a xanthene dye, a cyanine dye, a naphthoquinone dye, a quinoneimine dye, a methine dye, a phthalocyanine dye, and the like. These dyes can also be used as the coloring agent (E) after dispersing in an organic solvent by laking (salification). It is also possible to preferably use, in addition to these dyes, dyes mentioned in Japanese Unexamined Patent Application Publication No. 2013-225132, Japanese Unexamined Patent Application Publication No. 2014-178477, Japanese Unexamined Patent Application Publication No. 2013-137543, Japanese Unexamined Patent Application Publication No. 2011-38085, Japanese Unexamined Patent Application Publication No. 2014-197206, and the like. These dyes can also be used in combination with pigments below-mentioned (e.g., perylene-based pigment, lactam-based pigment, AgSn alloy fine particles, etc.).

[Pigment (E1)]

The pigment (E1) is not particularly limited, but it is preferred to use, for example, compounds which are classified into Pigment in Color Index (C.I.; published by The Society of Dyers and Colorist), and specifically those having the following color index (C.I.) numbers.

Suitable examples of the yellow pigment, which can be suitably used, include C.I. pigment yellow 1 (hereinafter, "C.I. pigment yellow" is the same, and only the numbers are listed), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, and 185.

Suitable examples of the orange pigment, which can be suitably used, include C.I. pigment orange 1 (hereinafter, "C.I. pigment orange" is the same, and only the numbers are listed), 5, 13, 14, 16, 17, 24, 34, 36, 38, 40, 43, 46, 49, 51, 55, 59, 61, 63, 64, 71, and 73.

Suitable examples of the violet pigment, which can be suitably used, include C.I. pigment violet 1 (hereinafter, "C.I. pigment violet" is the same, and only the numbers are listed), 19, 23, 29, 30, 32, 36, 37, 38, 39, 40, and 50.

Suitable examples of the red pigment, which can be suitably used, include C.I. pigment red 1 (hereinafter, "C.I. pigment red" is the same, and only the numbers are listed), 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, and 265.

Suitable examples of the blue pigment, which can be suitably used, include C.I. pigment blue 1 (hereinafter, "C.I. pigment blue" is the same, and only the numbers are listed), 2, 15, 15:3, 15:4, 15:6, 16, 22, 60, 64, and 66.

Suitable examples of the pigment with the other hue, which can be suitably used, include green pigments such as C.I. pigment green 7, C.I. pigment green 36, and C.I. pigment green 37; brown pigments such as C.I. pigment brown 23, C.I. pigment brown 25, C.I. pigment brown 26, and C.I. pigment brown 28; and black pigments such as C.I. pigment black 1 and C.I. pigment black 7.

Furthermore, the coloring agent dispersion may include, as the coloring agent (E), a light shielding agent. The coloring agent dispersion including a light shielding agent is suitably used to prepare a photosensitive resin composition used for forming a black matrix or a black column spacer in a liquid crystal display panel, or a bank for demarcation of a luminous layer in an organic EL element.

A cured product formed by using a photosensitive resin composition including a coloring agent dispersion containing a dispersant (E2) mentioned below scarcely generates a gas. Therefore, a bank formed by using a photosensitive resin composition including a coloring agent dispersion containing a dispersant (E2) is less likely to cause damage to an organic light emitting material (luminous layer) and an electrode in an organic EL element. When the bank contains a light shielding agent, it is easy to prevent internal reflection in the organic EL element and unnecessary entrance of light into the organic EL element. As mentioned above, the photosensitive resin composition containing a light shielding agent and a dispersant (E2) is particularly preferably used for formation of a bank for demarcation of a luminous layer in the organic EL element.

In the case where the coloring agent (E) includes the light shielding agent as the pigment (E1), it is preferred to use a black pigment or a purple pigment as the light shielding agent. Examples of the black pigment and the purple pigment include various types of pigments irrespective of whether it is an organic substance or an inorganic substance, such as carbon black, perylene-based pigment, lactam-based pigment, titanium black, and a metal oxide, a composite oxide, a metal sulfide, a metal sulfate, and a metal carbonate of copper, iron, manganese, cobalt, chromium, nickel, zinc, calcium, silver, or the like.

As the carbon black, known carbon black such as channel black, furnace black, thermal black, and lamp black are usable. Also, a resin-coated carbon black may be used.

As the carbon black, a carbon black having been processed to introduce an acidic group is preferred. The acidic group to be introduced to the carbon black is a functional group which is acidic according to the definition by Bronsted. Specific examples of the acidic group include a carboxy group, a sulfonic group, and a phosphonic group. The acidic group introduced to the carbon black may form a salt. Cation forming the salt with the acidic group and the salt is not particularly limited as long as it does not interfere with the objective of the present invention. As an example of the cation, various metal ions, cations of a nitrogen-containing compound, ammonium ions and the like can be exemplified, and alkali metal ions such as sodium ions, potassium ions, and lithium ions as well as ammonium ions are preferred.

Among the above described carbon black having been processed to introduce an acidic group, carbon black having at least one functional group selected from a group consisting of a carboxylic acid group, a carboxylic acid salt group, a sulfonic group, and a sulfonic acid salt group is preferred, in view of achieving higher insulation properties of a light shielding cured film formed by using the photosensitive resin composition.

A method of introducing an acidic group to the carbon black is not particularly limited. As a method of introducing an acidic group, for example, the following methods may be exemplified:

1) A method of introducing a sulfonic group to the carbon black by means of direct substitution using strong sulfuric acid such as fuming sulfuric acid and chlorosulfonic acid, or indirect substitution using sulfite, hydrogen sulfite and the like;
2) A method of diazo-coupling an organic compound having an amino group and an acidic group with the carbon black;
3) A method of reacting an organic compound having a halogen atom and an acidic group with the carbon black having a hydroxyl group, by the Williamson etherification method;
4) A method of reacting an organic compound having a halo carbonyl group and an acidic group protected by a protecting group with the carbon black having a hydroxyl group; and
5) A method of performing Friedel-Crafts reaction on the carbon black using an organic compound having a halo carbonyl group and an acidic group protected by a protecting group and then deprotecting.

Among these methods, the method 2), allowing easy and safe introduction of an acidic group, is preferred. As the organic compound having an amino group and an acidic group used in the method 2), a compound in which an amino group and an acidic group are bound to an aromatic group is preferred. As such a compound, aminobenzenesulfonic acid such as sulfanilic acid and aminobenzoic acid such as 4-aminobenzoic acid can be exemplified.

A molar number of the acidic group to be introduced to the carbon black is not particularly limited as long as it does not interfere with the objective of the present invention. A molar number of the acidic group to be introduced to the carbon black is preferably 1 mmol or more and 200 mmol or less and more preferably 5 mmol or more and 100 mmol or less with respect to 100 g of carbon black.

Carbon black having an acidic group introduced thereinto may be subjected to a coating treatment with a resin. When using a photosensitive resin composition containing carbon black coated with a resin, it is easy to form a light shielding cured film with excellent light shielding property and insulation properties, and low surface reflectivity. The coating treatment with a resin does not exert an adverse influence particularly on a dielectric constant of a light shielding cured film formed by using the photosensitive resin composition. Examples of the resin, which can be used for coating of carbon black, include thermosetting resins such as a phenol resin, a melamine resin, a xylene resin, a diallyl phthalate resin, a glyptal resin, an epoxy resin, and an alkylbenzene resin, and thermoplastic resins such as polystyrene, polycarbonate, polyethylene terephthalate, polybutylene terephthalate, modified polyphenylene oxide, polysulfone, polyparaphenyleneterephthalamide, polyamideimide, polyimide, polyaminobismaleimide, polyether sulfopolyphenylene sulfone, polyarylate, and polyether ether ketone. The amount of the resin, with which carbon black is coated, is preferably 1% by mass or more and 30% by mass or less, based on the total mass of the carbon black and resin.

The light shielding agent is also preferably a perylene-based pigment. Specific examples of the perylene-based pigment include a perylene-based pigment represented by the following formula (e-1), a perylene-based pigment represented by the following formula (e-2), and a perylene-based pigment represented by the following formula (e-3). It is possible to preferably use, as the perylene-based pigment, commercially available products, for example, K0084 and K0086 (product name) manufactured by BASF Ltd, and Pigment Black 21, 30, 31, 32, 33, and 34.

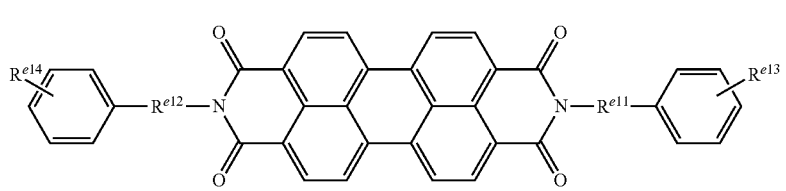

(e-1)

In the formula (e-1), $R^{e11}$ and $R^{e12}$ each independently represent an alkylene group having 1 or more and 3 or less carbon atoms, and $R^{e13}$ and $R^{e14}$ each independently represent a hydrogen atom, a hydroxyl group, a methoxy group, or an acetyl group.

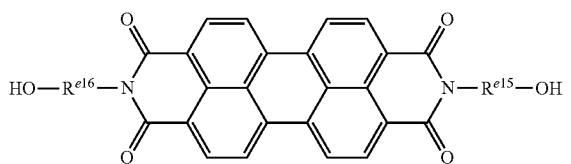

(e-2)

In the formula (e-2), $R^{e15}$ and $R^{e16}$ each independently represent an alkylene group having 1 or more and 7 or less carbon atoms.

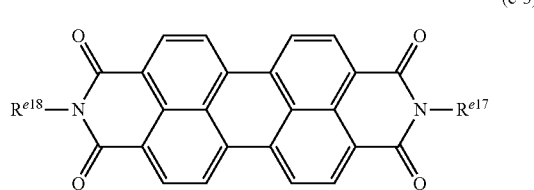

(e-3)

In the formula (e-3), $R^{e17}$ and $R^{e18}$ each independently represent a hydrogen atom, an alkyl group having 1 or more and 22 or less carbon atoms, and may contain a heteroatom of N, O, S, or P. When $R^{e17}$ and $R^{e18}$ are alkyl groups, the alkyl group may be either a straight-chain or branched-chain alkyl group.

The compound represented by the formula (e-1), the compound represented by the formula (e-2), the compound represented by the formula (e-3) can be synthesized by using the method mentioned, for example, in Japanese Unexamined Patent Application Publication No. 62-1753 and Japanese Examined Patent Application Publication No. 63-26784. Using perylene-3,5,9,10-tetracarboxylic acid or a dianhydride thereof and amines as raw materials, a heating reaction is performed in water or an organic solvent. The thus obtained crude product is recrystallized in sulfuric acid, or recrystallized in water, an organic solvent, or a mixed solvent thereof, thus making it possible to obtain an objective substance.

To satisfactorily disperse a perylene-based pigment in the photosensitive resin composition, an average particle diameter of the perylene-based pigment is preferably 10 nm or more and 1,000 nm or less.

It is also possible to contain, as the light shielding agent, a lactam-based pigment. The lactam-based pigment includes, for example, a compound represented by the following formula (e-4).

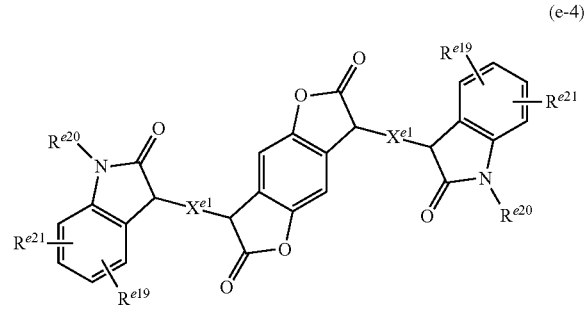

(e-4)

In the formula (e-4), $X^{e1}$ represents a double bond, E form or Z form each independently exists as a geometrical isomer, $R^{e19}$(s) each independently represent a hydrogen atom, a methyl group, a nitro group, a methoxy group, a bromine atom, a chlorine atom, a fluorine atom, a carboxy group, or a sulfo group, $R^{e20}$(s) each independently represent a hydrogen atom, a methyl group, or a phenyl group, and $R^{e21}$(s) each independently represent a hydrogen atom, a methyl group, or a chlorine atom. Compounds represented by the formula (e-4) can be used alone, or two or more compounds can be used in combination. $R^{e19}$ is preferably bonded at the 6-position of a dihydroindolone ring in view of easily producing a compound represented by the formula (e-4), and $R^{e21}$ is preferably bonded at the 4-position of a dihydroindolone ring. From the same viewpoint, $R^{e19}$, $R^{e20}$, and $R^{e21}$ are preferably hydrogen atoms. The compound represented by the formula (e-4) includes, as geometrical isomers, EE form, ZZ form, and EZ form, and may be either a single compound of any one of them, or a mixture of these geometrical isomers. The compound represented by the formula (e-4) can be produced, for example, by the methods mentioned in WO 2000/24736 A, WO 2010/081624 A.

To satisfactorily disperse a lactam-based pigment in the coloring agent dispersion, an average particle diameter of the lactam-based pigment is preferably 10 nm or more and 1,000 nm or less.

It is also possible to use, as the coloring agent, metal particles. These metal particles are preferably formed of metal or metal and a metal compound, and particularly preferably metal. Metal particles may include two or more metals or metal compounds in combination. It is particularly preferred that metal particles contain, as a main component, metal selected from the group consisting of the fourth period, the fifth period, and the sixth period of the long-period periodic table (IUPAC 1991). Metal particles preferably contain, as a main component, metal selected from the group consisting of groups 2 to 14, and more preferably metal selected from the group consisting of group 2, group 8, group 9, group 10, group 11, group 12, group 13, and group 14. Metal particles are still more preferably particles of metal of the fourth period, the fifth period, or the sixth period, and of group 2, group 10, group 11, group 12, or group 14.

Preferred examples of metal included in metal particles include at least one selected from copper, silver, gold, platinum, palladium, nickel, tin, cobalt, rhodium, iridium, iron, calcium, ruthenium, osmium, manganese, molybdenum, tungsten, niobium, tantalum, titanium, bismuth, antimony, lead, and alloys thereof. Among these metals, copper, silver, gold, platinum, palladium, nickel, tin, cobalt, rhodium, calcium, iridium, and alloys thereof are preferred; at least one selected from copper, silver, gold, platinum, palladium, tin, calcium, and alloys thereof is more preferred; and at least one selected from copper, silver, gold, platinum, tin, and alloys thereof is particularly preferred. These metal particles may have a core-shell structure.

Among the above-exemplified metal particles, an inorganic pigment consisting of fine particles containing a silver-tin (AgSn) alloy as a main component (hereinafter referred to as "AgSn alloy fine particles") are also preferably used as a light shielding agent. The AgSn alloy fine particles only need to contain an AgSn alloy as a main component, and also may contain Ni, Pd, Au, and the like as a metal component. An average particle diameter of the AgSn alloy fine particles is preferably 1 nm or more and 300 nm or less.

When the AgSn alloy is represented by the chemical formula AgxSn, a chemically stable AgSn alloy is obtained if x satisfies the inequality expression: $1 \leq x \leq 10$, and the chemical stability and blackness are simultaneously obtained if x satisfies the inequality expression: $3 \leq x \leq 4$. When a mass ratio of Ag in an AgSn alloy is determined in the above range of x, the following relations:
when x=1, Ag/AgSn=0.4762
when x=3, 3.Ag/Ag3Sn=0.7317
when x=4, 4.Ag/Ag4Sn=0.7843
when x=10, 10.Ag/Ag10Sn=0.9008
are obtained. Therefore, this AgSn alloy becomes chemically stable when containing 47.6% by mass or more and 90% by mass or less of Ag, and it is possible to obtain the chemical stability and blackness effectively to the amount of Ag when containing 73.17% by mass or more and 78.43% by mass or less of Ag.

The AgSn alloy fine particles can be fabricated by using a usual fine particle synthesis method. Examples of fine particle synthesis method include a gas phase reaction method, an atomized pyrolysis method, an atomizing method, a liquid phase reaction method, a freeze-drying method, a hydrothermal method, and the like.

Although AgSn alloy fine particles have high insulation properties, a surface thereof may be covered with an insulation film depending on applications of the photosensitive resin composition prepared by using the coloring agent dispersion to further enhance insulation properties. The material of the insulation film is suitably metal oxide or an organic polymer compound. It is possible to suitably use, as the metal oxide, metal oxides with insulation properties, for example, silicon oxide (silica), aluminum oxide (alumina), zirconium oxide (zirconia), yttrium oxide (yttria), titanium oxide (titania), and the like. It is also possible to suitably use, as the organic polymer compound, resins with insulation properties, for example, polyimide, polyether, poly acrylate, polyamine compound, and the like.

To sufficiently enhance insulation properties of a surface of AgSn alloy fine particles, a thickness of the insulation film is preferably 1 nm or more and 100 nm or less, and more preferably 5 nm or more and 50 nm or less. The insulation film can easily be formed by surface modification technique or surface coating technique. Particularly, when using an alkoxide such as tetraethoxysilane or aluminum triethoxide, an insulation film with a uniform thickness can be formed at comparatively low temperature, preferably.

The above-mentioned perylene-based pigment, lactam-based pigment, and AgSn alloy fine particles may be used alone as the light shielding agent, or these materials may be used in combination. For the purpose of adjusting color tone, the light shielding agent may contain colors with red, blue, green, and yellow hues, together with black pigments or violet pigments mentioned above. It is possible to appropriately select colors with other hues of black pigments and violet pigments from known colors. It is possible to use, as colors with other hues of black pigments and violet pigments, various pigments mentioned above. The amount of colors with other hues of black pigments and violet pigments to be used is preferably 15% by mass or less, and more preferably 10% by mass or less, based on the total mass of the light shielding agent.

Inorganic pigments and organic pigments may be used alone or in combination. When using in combination, the organic pigment is preferably used in the amount of 10 parts by mass or more and 80 parts by mass or less, and more preferably 20 parts by mass or more and 40 parts by mass or less, based on 100 parts by mass of the total amount of the inorganic and organic pigments.

The amount of the pigment (E1) in the coloring agent dispersion is preferably 30% by mass or more and 95% by mass or less, more preferably 40% by mass or more and 90% by mass or less, and still more preferably 50% by mass or more and 85% by mass or less, based on the mass of the total solid component of the coloring agent dispersion. When using the pigment (E1) in the amount in such range based on the mass of the total solid component of the coloring agent dispersion, it is easy to satisfactorily disperse the pigment (E1) into the coloring agent dispersion.

<Dispersant (E2)>

The coloring agent dispersion includes a dispersant (E2) with the pigment (E1). By the action of the dispersant (E2), the pigment (E1) is well dispersed in the coloring agent dispersion.

The dispersant (E2) include a silsesquioxane compound having a constituent unit represented by the following formula (e2a):

(e2a)

wherein, in the formula (e2a), $R^{e1}$ is a monovalent organic group.

There have been well known, as a general structure of the silsesquioxane compound, a cage-like structure, an incomplete cage-like structure, a ladder-like structure, a random-like structure and the like. The structure of the silsesquioxane compound used as the dispersant (E2) is not particularly limited, and may be any structures which have conventionally been known, such as a cage-like structure, an incomplete cage-like structure, a ladder-like structure, and a random-like structure.

Such silsesquioxane compounds have a pigment dispersing effect due to silsesquioxane structure.

In addition, the silsesquioxane compound is chemically or thermally stable. Therefore, when a cured product is formed by using the photosensitive resin composition containing the silsesquioxane compound as the dispersant (E2), a generation of gas due to the dispersant (e2) is suppressed.

The silsesquioxane compound preferably includes at least one selected from the group consisting of an aromatic group, an amide bond, and a urethane bond. Generally, these group or bond is a chemical structure providing a dispersing effect to a dispersant for pigments. Therefore, the silsesquioxane compound including at least one selected from the group consisting of an aromatic group, an amide bond, and a urethane bond is more preferred, since pigments are easily dispersed.

A position of an aromatic group, an amide bond, or a urethane bond in the silsesquioxane compound may be a position in an organic group represented by $R^{e1}$ in the constituent unit represented by the formula (e2a), or other position than a position in the constituent unit represented by the formula (e2a). The position is preferably a position in an organic group represented by $R^{e1}$ in the constituent unit represented by the formula (e2a). For example, the silsesquioxane compound may bond to a constituent unit represented by the following formula (e2a-1) or (e2a-2). When $R^{e0}$ is an organic group, the organic group may have one or more selected from the group consisting of an aromatic group, an amide bond, and a urethane bond.

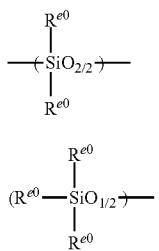

(e2a-1)

(e2a-2)

In the formulae (e2a-1) and (e2a-2), $R^{e0}$(s) each independently represent a hydrogen atom or a monovalent organic group. When $R^{e0}$ is an organic group, the organic group is same as below-mentioned $R^{e1}$.

When $R^{e1}$ in the formula (e2a) is an organic group, the number of carbon atoms of the organic group is not particularly limited. The number of carbon atoms of the organic group is preferably 1 or more and 50 or less, more preferably 1 or more and 30 or less, and particularly preferably 1 or more and 20 or less. A structure of the organic group may be linear, branched, or cyclic, and may be a combination thereof. The organic group may have one or more unsaturated bond. The organic group may include a hetero atom. Examples of the hetero atom include a halogen atom, an oxygen atom, a sulfur atom, a nitrogen atom, a phosphorus atom, and the like.

Preferred examples of the organic group include an alkyl group, an alkoxy group, a cycloalkyl group, a cycloalkoxy group, a saturated aliphatic acyl group, a saturate aliphatic acyloxy group, an alkoxycarbonyl group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, and an amino group substituted with one or two organic groups.

Examples of the substituent, which these groups may have a phenyl group, include an alkyl group having 1 or more and 20 or less carbon atoms, an alkoxy group having 1 or more and 20 or less carbon atoms, a cycloalkyl group having 3 or more and 10 or less carbon atoms, a cycloalkoxy group having 3 or more and 10 or less carbon atoms, a saturated aliphatic acyl group having 2 or more and 20 or less carbon atoms, an alkoxycarbonyl group having 2 or more and 20 or less carbon atoms, a saturated aliphatic acyloxy group having 2 or more and 20 or less carbon atoms, a phenyl group, a phenoxy group, a phenylthio group, a benzoyl group, a phenoxycarbonyl group, a benzoyloxy group, a phenylalkyl group having 7 or more and 20 or less carbon atoms, a naphthyl group, a naphthoxy group, a naphthoyl group, a naphthoxycarbonyl group, a naphthoyloxy group, a naphthylalkyl group having 11 or more and 20 or less carbon atoms, a heterocyclyl group, a heterocyclylcarbonyl group, an amino group substituted with one or two organic groups having 1 or more and 20 or less carbon atoms, a nitro group, a hydroxy group, a halogen atom, a cyano group, a carboxy group, and the like.

In the formula (e2a), $R^{e1}$ is a monovalent organic group. The organic group preferably is a group represented by the following formula (e2a-I):

   (e2a-I)

or a group represented by the following formula (e2a-II):

   (e2-II).

In the formula (e2a-I), $X^e$ is a single bond, an alkylene group having 1 or more and 6 or less carbon atoms, an arylene group having 6 or more and 12 or less carbon atoms, or a group represented by —$R^{e6}$—NH—$R^{e7}$—. $R^{e6}$ and $R^{e1}$ are each independently an alkylene group having 1 or more and 3 or less carbon atoms. $Y^e$ is a divalent cyclic organic group, or a chain aliphatic hydrocarbon group having 1 or more and 20 or less carbon atoms. $B^e$ is —NH—CO—, —CO—NH—, —NH—CO—O—, —O—CO—NH—, or —NH—CO—NH—. $X^e$ and $Y^e$ may be each independently substituted with one or more groups selected from the group consisting of a (meth)acryloyloxy group, a vinyl group, and an epoxy group-containing organic group. $Z^e$ is a single bond, an alkylene group having 1 or more and 6 or less carbon atoms, or an arylene group having 6 or more and 12 or less. $A^e$ is a (meth)acryloyloxy group, a vinyl group, or an epoxy group-containing organic group.

The silsesquioxane compound preferably includes, as a constituent unit represented by the formula (e2a), a constituent unit (A) having a group represented by the formula (e2a-I) as $R^{e1}$. When the silsesquioxane compound includes a constituent unit (A) and $R^{e1}$ is not substituted with a (meth)acryloyloxy group, a vinyl group, or an epoxy group-containing organic group in all of the constituent units (A) in the silsesquioxane compound, it is preferred that the silsesquioxane compound essentially includes a constituent unit (B) which is represented by the above formula (e2a) and has a group represented by the formula (eta-II) as $R^{e1}$.

Specific examples of the alkylene group having 1 or more and 6 or less carbon atoms in $X^e$ include a methylene group, an ethane-1,2-diyl group, an ethane-1,1-diyl group, a propane-1,3-diyl group, a propane-1,2-diyl group, a butane-1,4-diyl group, a penetane-1,5-diyl group, a hexane-1,6-diyl group, and the like.

The number of carbon atoms of an arylene group for $X^e$ is 6 or more and 12 or less, and preferably 6 or more and 10 or less. Suitable specific examples of the arylene group include, o-phenylene group, m-phenylene group, p-phenylene group, naphthalene-1,4-diyl group, naphthalene-1,5-diyl group, naphthalene-2,6-diyl group, biphenyl-4,4'-diyl group, and the like.

Specific examples of —$R^{e6}$—NH—$R^{e7}$— include —CH$_2$—NH—CH$_2$—, —(CH$_2$)$_2$—NH—(CH$_2$)$_2$—, —(CH$_2$)$_3$—NH—(CH$_2$)$_3$—, —CH$_2$—NH—(CH$_2$)$_2$—, —(CH$_2$)$_2$—NH—CH$_2$—, —(CH$_2$)$_2$—NH—(CH$_2$)$_3$—, —(CH$_2$)$_3$—NH—(CH$_2$)$_2$—, —CH$_2$—NH—(CH$_2$)$_3$—, —(CH$_2$)$_3$—NH—CH$_2$—, and the like.

A divalent cyclic organic group may be a group in which two hydrogen atoms are removed from an aromatic ring, or a group in which two hydrogen atoms are removed from an aliphatic ring. When $Y^e$ is a divalent group including an aromatic ring, as a divalent cyclic group, a group in which two hydrogen atoms are removed from an aromatic ring having 6 or more and 10 or less, and optionally substituted with one or two substituents having 1 or 2 carbon atoms. Suitable examples of the aromatic ring having 6 or more and 10 or less carbon atoms include a benzene ring, a naphthalene ring, a methylbenzene ring, a dimethylbenzene ring, and the like. When $Y^e$ is a divalent group including an aliphatic ring, as a divalent cyclic group, a group in which two hydrogen atoms are removed form an aliphatic ring having 5 or more and 16 or less carbon atoms. Suitable examples of the aliphatic ring having 5 or more and 16 or less carbon atoms include a cyclopentane ring, a cyclohexane ring, a cycloheptane ring, a cyclooctane ring, a cyclononane ring, a cyclodecane ring, a dicyclopentadiene ring, a norbornane ring, a norbornene ring, a cubane ring, a basketane ring, and the like.

When $Y^e$ is a chain aliphatic hydrocarbon group having 1 or more and 20 or less carbon atoms, the chain aliphatic hydrocarbon group may be linear or branched, and be a saturated hydrocarbon group or an unsaturated hydrocarbon group. Examples of the chain aliphatic hydrocarbon group having 1 or more and 20 or less carbon atoms include an alkylene group, an alkylene group having double bond, and a branched alkylene group having 1 or more 9 or less carbon atoms such as a methylene group, an ethane-1,2-diyl group, an ethane-1,1-diyl group, a propane-1,3-diyl group, a propane-1,2-diyl group, a propane-1,3-diyl group, a propane-1,2-diyl group, a vinylene group, a (2-octenyl)ethylene group, a (2,4,6-trimethyl-2-nonenyl)ethylene group, and the like.

In the formula (e2a-II), when $Z^e$ is an alkylene group having 1 or more and 6 or less carbon atoms, suitable examples of the alkylene group include a methylene group, an ethane-1,2-diyl group, an ethane-1,1-diyl group, a propane-1,3-diyl group, a propane-1,2-diyl group, a butane-1,4-diyl group, a pentane-1,5-diyl group, a hexane-1,5-diyl group, and the like.

The number of carbon atoms of the arylene group in $Z^e$ is 6 or more and 12 or less, and preferably 6 or more and 10 or less. Suitable specific examples of the arylene group include o-phenylene group, m-phenylene group, p-phenylene group, naphthalene-1,4-diyl group, naphthalene-1,5-diyl group, naphthalene-2,6-diyl group, biphenyl-4,4'-diyl group, and the like.

In the formula (e2a-II), $A^e$ is a (meth)acryloyloxy group, a vinyl group, or an epoxy group-containing organic group. The epoxy group-containing organic group is not particularly limited, and the examples thereof include an oxiranyl group, a glycidyl group, and glycidyloxy group.

Specific examples of a group represented by the formula (e2a-I) include a group having a combination of $X^e$, $B^e$, and $Y^e$ shown in the below table 1. $Y^e$ in the table 1 has two bonds. $Y^e$ bonds to a carboxy group via one of two bonds, and bonds to $B^e$ via the other bond. $B^e$ in the table 1 bonds to $X^e$ and $Y^e$ same as $Y^e$.

TABLE 1

|   | $X^e$ | $B^e$ | $Y^e$ |
|---|---|---|---|
| 1 | —(CH$_2$)$_3$— | —NH—CO— | 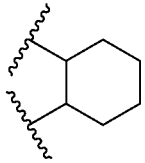 [SMILES: *C1CCCCC1*] |
| 2 | —(CH$_2$)$_3$— | —NH—CO— | 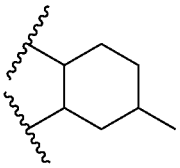 [SMILES: *C1CCC(C)CC1*] |
| 3 | —(CH$_2$)$_3$— | —NH—CO— | 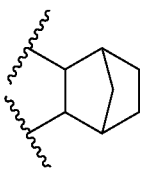 [SMILES: *C1C2CCC(C2)C1*] |
| 4 | —(CH$_2$)$_3$— | —NH—CO— | 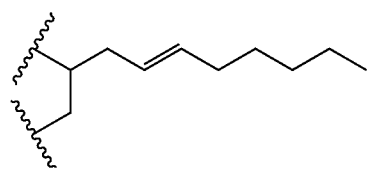 [SMILES: *CC(*)C/C=C/CCCCC] |
| 5 | —(CH$_2$)$_3$— | —NH—CO— | 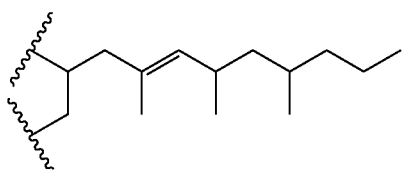 [SMILES: *CC(*)C/C(C)=C/C(C)CC(C)CCC] |

TABLE 1-continued

| | $X^e$ | $B^e$ | $Y^e$ |
|---|---|---|---|
| 6 | —(CH$_2$)$_3$— | —NH—CO— | cyclopentyl group with —(CH$_2$)$_3$—Si(OCH$_3$)$_3$ substituent |
| 7 | —(CH$_2$)$_3$—NH—(CH$_2$)$_2$— | —NH—CO— | decahydronaphthyl (bicyclic cyclohexane-fused) group |
| 8 | —(CH$_2$)$_3$—NH—(CH$_2$)$_2$— | —NH—CO— | methyl-substituted decahydronaphthyl group |
| 9 | —(CH$_2$)$_3$—NH—(CH$_2$)$_2$— | —NH—CO— | norbornyl (bicyclic) group |
| 10 | —(CH$_2$)$_3$—NH—(CH$_2$)$_2$— | —NH—CO— | cyclopentyl group with —CH=CH—(CH$_2$)$_4$—CH$_3$ alkenyl chain |
| 11 | —(CH$_2$)$_3$—NH—(CH$_2$)$_2$— | —NH—CO— | cyclopentyl group with branched methyl-substituted alkenyl chain |
| 12 | —(CH$_2$)$_3$—NH—(CH$_2$)$_2$— | —NH—CO— | cyclopentyl group with —(CH$_2$)$_3$—Si(OCH$_3$)$_3$ substituent |

Specific examples of a group represented by the formula (e2a-II) include a group having a combination of $Z^e$ and $A^e$ shown in the below table 2.

TABLE 2

| | $Z^e$ | $A^e$ |
|---|---|---|
| 1 | —(CH$_2$)$_3$— | Methacryloyl group |
| 2 | —(CH$_2$)$_3$— | Acryloyloxy group |
| 3 | —(CH$_2$)$_3$— | Glycidyloxy group |
| 4 | -(Single bond)- | Vinyl group |
| 5 | —CH$_2$— | Vinyl group |
| 6 | —(CH$_2$)$_3$— | Vinyl group |
| 7 | —(C$_6$H$_5$)— | Vinyl group |

The silsesquioxane compound preferably includes a constituent unit (a) represented by the following formula (e2b) and a constituent unit (b) represented by the following formula (e2c).

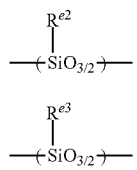

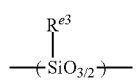

In the formula (e2b), $R^{e2}$ represents a group represented by above-mentioned formula (e2a-I). $X^e$ and $Y^e$ in the group represented by the formula (e2a-I) do not have a (meth) acryloyloxy group, a vinyl group, and an epoxy group-containing organic group as a substituent. In the formula (e2c), $R^{e3}$ represents a group represented by above-mentioned formula (e2a-II).

Examples of the silsesquioxane compound include a silsesquioxane compound containing a constituent unit represented by the following formula (e2d).

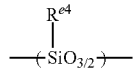

In the formula (e2d), $R^{e4}$ is a group represented by the above-mentioned formula (e2a-I). At least one of $X^e$ and $Y^e$ in the group represented by the formula (e2a-I) has at least one group selected from the group consisting of a (meth) acryloyloxy group, a vinyl group, and an epoxy group-containing organic group as a substituent.

The silsesquioxane compound may have a constituent unit (d) represented by the following formula (e2e) in addition to above-mentioned constituent unit(s).

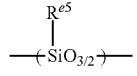

In the formula (e2e), $R^{e5}$ represents an alkyl group having 1 or more and 12 or less carbon atoms, an aryl group having 6 or more and 12 or less carbon atoms, or an aralkyl group having 7 or more and 12 or less carbon atoms.

When $R^{e5}$ is the alkyl group, for example, a methyl group, an ethyl group, and an n-propyl group are preferred. When $R^{e5}$ is the aryl group or the aralkyl group, for example, a phenyl group, a benzyl group, a xylyl group and a naphthyl group are preferred.

In the silsesquioxane compound, it is preferred to include at least one unit having a group represented by the formula (e2a-I) among the constituent units mentioned above. In the silsesquioxane compound, when the group represented by the formula (e2a-I) in any of constituent units is not substituted with any one of a (meth)acryloyloxy group, a vinyl group, and an epoxy group-containing organic group, it is preferred that the silsesquioxane compound includes at least one constituent unit having a group represented by the formula (e2a-I).

In the silsesquioxane compound, the amount of the constituent unit having at least one group selected from the group consisting of a (meth)acryloyloxy group, a vinyl group, and an epoxy group-containing organic group is preferably 10 mol % or more, and more preferably 30 mol % or more.

In the silsesquioxane compound, regarding a content ratio of the constituent unit, when including a constituent unit (a) and a constituent unit (b), a molar ratio (a):(b) is preferably within a range of 20:80 to 80:20. When the silsesquioxane compound includes a constituent unit (d), the content thereof is preferably 10 mol % or more and 80 mol % or less.

A silsesquioxane skeleton in the silsesquioxane compound is generally a polysiloxane skeleton represented by the general formula of $(RSiO_{3/2})n$ formed via a hydrolyzation and a polycondensation reaction of trialkoxy silanes.

A range of weight average molecular weight Mw of a generally obtainable silsesquioxane compound is 1,000 or more and 10,000 or less.

1,500 or more and 5,000 or less is preferred.

When the silsesquioxane compound having above-mentioned constituent units (a) to (d), trialkoxy silanes having a corresponding R substituent can be used as a raw material trialkoxy silane. Desired R substituent may be formed by modification with an appropriate reagent after forming a silsesquioxane skeleton.

For example, examples of substituted trialkoxy silanes having a (meth)acryl group as R substituent include 3-methacryloxypropyltrimethoxy silane, 3-methacryloxypropyltriethoxy silane, 3-acryloxypropyltrimethoxy silane, 3-acryloxypropyltriethoxy silane, and the like. These may be used alone or may be used in combination of two or more types thereof. Among these, 3-methacryloxypropyltrimethoxy silane and 3-acryloxypropyltrimethoxy silane are preferred in view of reactivity.

Example of substituted trialkoxy silane having an aryl group or a alkyl group having 1 or more and 12 or less carbon atoms includes methyltrimethoxy silane, methyltriethoxy silane, ethyltrimethoxy silane, ethyltriethoxy silane, n-propyltrimethoxy silane, hexyltrimethoxy silane, hexyltriethoxy silane, phenyltrimethoxy silane, phenyltriethoxy silane, 1-naphtyltrimethoxy silane, 1-naphtyltriethoxy silane, p-methoxyphenyltrimethoxy silane, p-methoxyphenyltriethoxy silane, and the like. These may be used alone or may be used in combination of two or more types thereof. Among these, methyltrimethoxy silane, ethyltrimethoxy silane, and phenyltrimethoxy silane are preferred in view of heat resistance and reactivity.

To form a desired R substituent by modifying with an appropriate reagent after forming a silsesquioxane skeleton, for example, an amino group may be introduced into silsesquioxane in advance, followed by modification of the amino group to give amic acid. To introduce an amino group into silsesquioxane, trialkoxysilane, the substituent of which is an amino group, may be used.

As a method for producing a silsesquioxane skeleton, a method including hydrolyzation and polycondensation of a raw material trialkoxy silane is exemplified. For example, conventionally known conditions can be employed as a condition of hydrolyzation and polycondensation. When hydrolyzation and polycondensation are conducted, a catalyst may be used. Examples of a catalyst include tetrabutylammonium hydroxide, benzyltrimethylammonium hydroxide, benzyltriethylammonium hydroxide, tetramethylammonium hydroxide, tetrabutylammonium hydroxide, hydrochloric acid, sulfuric acid, formic acid, and oxalic acid. As a reaction condition, a time of 1 hour or longer and 10 hours or shorter and a temperature of 25° C. or higher and 100° C. or lower are exemplified.

The dispersant (E2) may be used in combination with a dispersant other than the silsesquioxane compound described above as long as it does not interfere with the object of the present invention. Examples of the dispersant to be usable together with the silsesquioxane compound include polyethylene imine-based, urethane resin-based, and acryl resin-based polymer dispersants. When the dispersant (E2) is used in combination with a dispersant other than the silsesquioxane compound, the content of the silsesquioxane compound including a constituent unit represented by the formula (e2a) in the dispersant (E2) is preferably 10% by mass or more, more preferably 20% by mass or more, particularly preferably 30% by mass or more, and still more preferably 40% by mass or more. Meanwhile, the upper limit of the content of the silsesquioxane compound including a constituent unit represented by the formula (e2a) in the dispersant (E2) is not particularly limited and, for example, it can be adjusted to 100% by mass or less and also can be adjusted to 95% by mass or less.

The amount of the above described dispersant (E2) to be used is preferably 5% by mass or more and 70% by mass or less, more preferably 10% by mass or more and 60% by mass or less, and particularly preferably 15% by mass or more and 50% by mass or less, based on the mass of the total solid component of the coloring agent dispersion. The amount of the dispersant (E2) to be used is preferably 10 parts by mass or more and 90 parts by mass or less, and more preferably 20 parts by mass or more and 80 parts by mass or less, based on 100 parts by mass of the pigment (E1)

<Dispersion Medium>

The coloring agent dispersion usually includes a dispersion medium for dispersing the coloring agent (E). A type of the dispersion medium is not particularly limited, and typically an organic solvent.

Examples of the organic solvent used as the dispersion medium in the coloring agent dispersion include (poly)alkyleneglycol monoalkylethers such as ethyleneglycol monomethylether, ethyleneglycol monoethylether, ethyleneglycol-n-propylether, ethyleneglycol-n-butylether, diethyleneglycol monomethylether, diethyleneglycol monoethylether, diethyleneglycol mono-n-propylether, diethyleneglycol mono-n-butylether, triethyleneglycol monomethylether, triethyleneglycol monoethylether, propyleneglycol monomethylether, propyleneglycol monoethylether, propyleneglycol mono-n-propylether, propyleneglycol mono-n-butylether, dipropyleneglycol monomethylether, dipropyleneglycol monoethylether, dipropyleneglycol mono-n-propylether, dipropyleneglycol mono-n-butylether, tripropyleneglycol monomethylether, and tripropyleneglycol monoethylether; (poly)alkyleneglycol monoalkylether acetates such as ethyleneglycol monomethylether acetate, ethyleneglycol monoethylether acetate, diethyleneglycol monomethylether acetate, diethyleneglycol monoethylether acetate, propyleneglycol monomethylether acetate, and propyleneglycol monoethylether acetate; other ethers such as diethyleneglycol dimethylether, diethyleneglycol methylethylether, diethyleneglycol diethylether, and tetrahydrofuran; ketones such as methylethylketone, cyclohexanone, 2-heptanone, and 3-heptanone; lactic acid alkyl esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, ethyl ethoxyacetate, ethyl hydroxyacetate, methyl 2-hydroxy-3-methylbutanoate 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; amides such as N-methylpyrrolidone, N,N-dimethylformamide, and N,N-dimethylacetamide. These organic solvents may be used alone or may be used in combination of two or more types thereof.

Among the above-mentioned organic solvents, propyleneglycol monomethylether, ethyleneglycol monomethylether acetate, propyleneglycol monomethylether acetate, propyleneglycol monoethylether acetate, diethyleneglycol dimethylether, diethyleneglycol methylethylether, cyclohexanone, and 3-methoxybutyl acetate are preferred, since these organic solvents have a good solubility to an alkali-soluble resin, a photopolymerizable monomer, and a photopolymerization initiator below-mentioned, and above-mentioned coloring agent can be well dispersed. Propyleneglycol monomethylether acetate and 3-methoxybutyl acetate are particularly preferably used.

The content of a dispersion medium in the coloring agent dispersion is not particularly limited as long as it is possible to satisfactorily disperse the coloring agent (E). The amount of the dispersion medium is preferably an amount so that the solid component concentration of the coloring agent dispersion becomes 1% by mass or more and 50% by mass or less, and more preferably an amount so that the solid component concentration of the coloring agent dispersion becomes 5% by mass or more and 30% by mass or less.

<Method for Producing Coloring Agent Dispersion>

The coloring agent dispersion can be produced by mixing (dispersing and kneading) a pigment (E1), a dispersant (E2) and, if necessary, other components such as a dye, and a dispersion medium, kneading using a stirrer such as a triple roll mill, a ball mill, or a sand mill, and optionally filtering through filter such as a membrane filter having a pore diameter of about 5 μm. It is considered that, in the production of the coloring agent dispersion, by mixing (dispersing and kneading) of a pigment (E1) and a dispersant (E2) using a stirrer or a kneader, an interaction occurs between the pigment (E1) and the dispersant (E2), thus obtaining the effect of satisfactory pigment dispersion. After a dispersion treatment of the pigment (E1) in accordance with the above method, the solid component concentration of the coloring agent dispersion may be adjusted to a desired concentration by concentrating the thus obtained dispersion or diluting the dispersion with a desired solvent.

<<Photosensitive Resin Composition>>22

The photosensitive resin composition includes an alkali-soluble resin (A), a photopolymerizable monomer (B), a photopolymerization initiator (C), and the coloring agent dispersion mentioned above. The photosensitive resin composition with the above configuration can form a cured film in which gas generation is suppressed. Hereinafter, a description will be made of essential or optional components of a photosensitive resin composition, and a method for preparing the photosensitive resin composition.

<Coloring Agent Dispersion>

The dispersion mentioned above is used as the coloring agent dispersion. The amount of the coloring agent dispersion is not particularly limited as long as the photosensitive resin composition is colored with desired color hue and color density. The amount of the coloring agent dispersion to be used is preferably an amount so that the amount of the pigment (E1) becomes 5% by mass or more and 80% by mass or less, more preferably 25% by mass or more and 60% by mass or less, and particularly preferably 30% by mass or more and 55% by mass or less, based on the mass of the total solid component of the photosensitive resin composition.

<Alkali-Soluble Resin (A)>

The photosensitive resin composition includes an alkali-soluble resin (hereinafter referred to as "(A) component"). Herein, in the present specification, the alkali-soluble resin (A) is a resin having a functional group imparting alkali-solubility (for example, a phenolic hydroxy group, a carboxy group, a sulfonic group, and the like).

It is possible to use, as the alkali-soluble resin (A), an alkali-soluble resin which has conventionally been mixed in the photosensitive resin composition without particular limitation. The alkali-soluble resin (A) preferably contains (A1) a resin having a cardo structure (hereinafter also referred to as "cardo resin (A1)") in view of the fact that it is easy to suppress the generation of a gas from a cured product formed by using the photosensitive resin composition.

It is considered that, when the photosensitive resin composition of the present embodiment includes a cardo resin (A1), the following influence is exerted on the fact that it is possible to form a cured product in which gas generation is particularly suppressed, but that isn't certain. First, the cardo resin (A1) has bulkiness of a cardo structure. Meanwhile, when a cured film is formed by using the photosensitive resin composition, crosslinking occurs between the cardo resin (A1), and a photopolymerizable monomer (B) or a below-mentioned polyfunctional crosslinkable compound (D) having plural epoxy groups or oxetanyl groups in one molecule. It is considered that these influences, working together, suppress the generation of a gas from the cured product when a cured product is formed by using the photosensitive resin composition, when various elements are formed by processing a laminated structure provided with a cured product of the photosensitive resin composition, and when using various products provided with a cured product of the photosensitive resin composition.

The resin including a cardo skeleton (A1) is not particularly limited as long as it is a resin having predetermined alkali solubility. The cardo skeleton means a skeleton in which a second cyclic structure and a third cyclic structure are bonded to one ring carbon atom constituting the first cyclic structure. The second cyclic structure and the third cyclic structure may be the same or different. Typical examples of the cardo skeleton include a skeleton in which two aromatic rings (for example, benzene ring) are bonded to the carbon atom at the 9-position of a fluorene ring.

The (A1) resin having cardo structure is not particularly limited, and conventionally known resins can be used. Among the conventionally known resins, a resin represented by the following formula (a-1) is preferred.

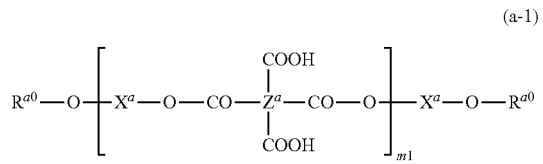
(a-1)

In the formula (a-1), $X^a$ represents a group represented by the following formula (a-2). m1 represents an integer of 0 or more and 20 or less.

In the formula (a-2), $R^{a1}$s each independently represent a hydrogen atom, a hydrocarbon group having 1 or more and 6 or less, or a halogen atom, $R^{a2}$s each independently represent a hydrogen atom or methyl group, $R^{a3}$s each independently represent a linear or branched alkylene group, m2 represents 0 or 1, and $W^a$ represents a group represented by the following formula (a-3).

(a-3)

In the formula (a-2), $R^{a3}$ is preferably an alkylene group having 1 or more and 20 or less carbon atoms, more preferably an alkylene group having 1 or more and 10 or less carbon atoms, particularly preferably an alkylene group having 1 or more and 6 or less carbon atoms, and the most preferably an ethane-1,2-diyl group, a propane-1,2-diyl group, and a propane-1,3-diyl group.

The ring A in the formula (a-3) represents an optionally substituted alicyclic ring which may be fused with an aromatic ring. The alicyclic ring may be an aliphatic hydrocarbon ring or an aliphatic heterocycle. Examples of the alicyclic ring include monocycloalkanes, bicycloalkanes, tricycloalkanes, tetracycloalkanes, and the like. Specific examples include monocycloalkanes such as cyclopentane, cyclohexane, cycloheptane and cyclooctane, and adamantane, norbornane, isobornane, tricyclodecane and tetracyclododecane. The aromatic ring which may be fused with the alicyclic ring may be an aromatic hydrocarbon ring or an aromatic heterocycle, and preferably an aromatic hydrocarbon ring. Specifically, a benzene ring and a naphthalene ring are preferred.

Suitable examples of the divalent group represented by the formula (a-3) include following groups.

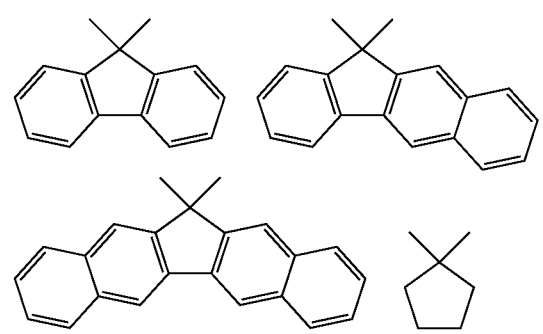

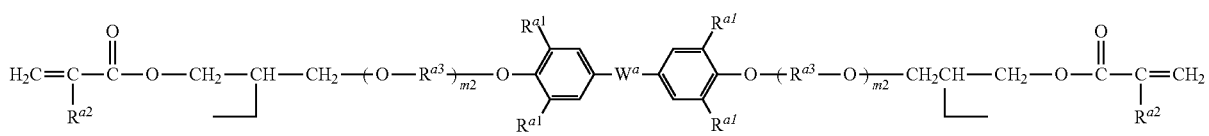
(a-2)

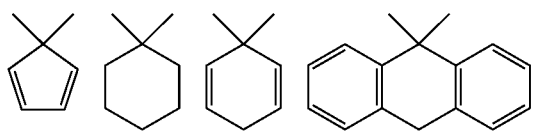

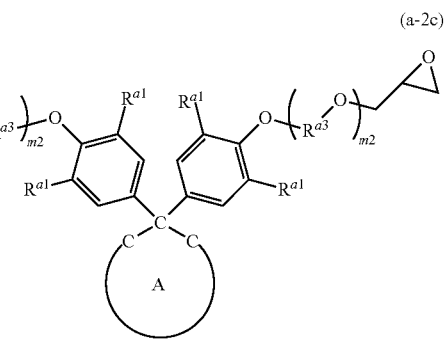

The divalent group $X^a$ in the formula (a-1) is introduce in the (A1) cardo resin by reacting a tetracarboxylic acid anhydride providing a residual group $Z^a$ with a diol compound represented by the following formula (a-2a).

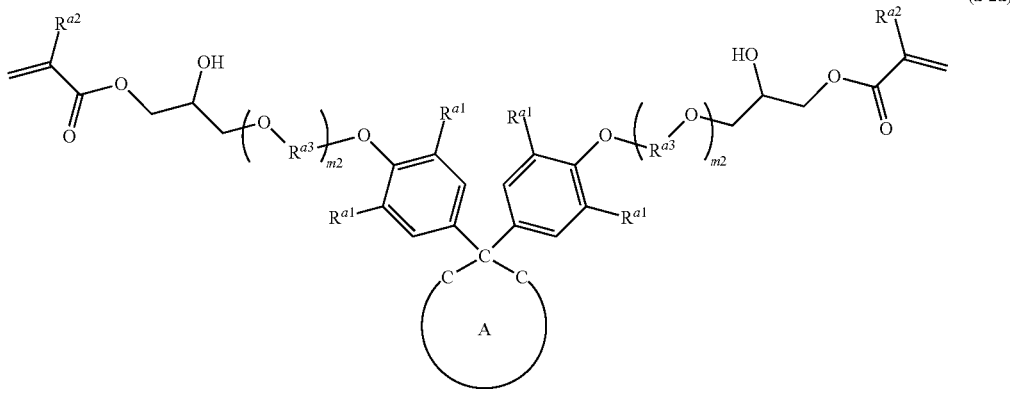

In the formula (a-2a), $R^{a1}$, $R^{a2}$, $R^{a3}$, and m2 are the same as those described for the formula (a-2). In the formula (a-2a), Ring A is the same as that described for the formula (a-3).

A diol compound represented by the formula (a-2a) can be produced, for example, by the following method. First, the hydrogen atom in a phenolic hydroxyl group possessed by the diol compound represented by the following formula (a-2b) is optionally substituted with a group represented by —$R^{a3}$—OH in accordance with a conventional method, followed by glycidylization with epichlorohydrin to obtain an epoxy compound represented by the following formula (a-2c). Then, the epoxy compound represented by the following formula (a-2c) is reacted with acrylic acid or methacrylic acid to obtain a diol compound represented by the formula (a-2a). In the formula (a-2b) and the formula (a-2c), $R^{a1}$, $R^{a3}$, and m2 are as described for the formula (a-2). The ring A in the formula (a-2b) and the formula (a-2c) is as described for the formula (a-3). The method for producing a diol compound represented by the formula (a-2a) is not limited to the method mentioned above.

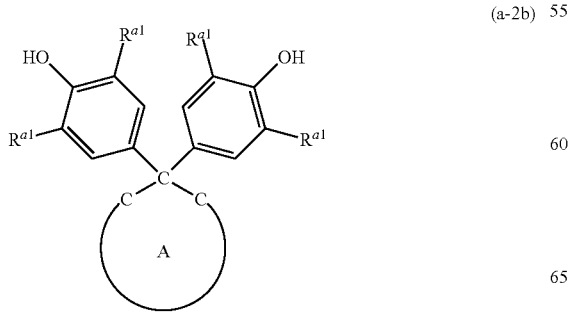

Suitable examples of the diol compound represented by the formula (a-2b) include following diol compounds.

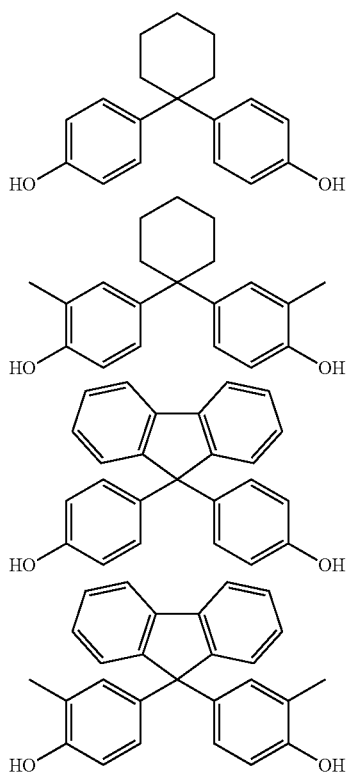

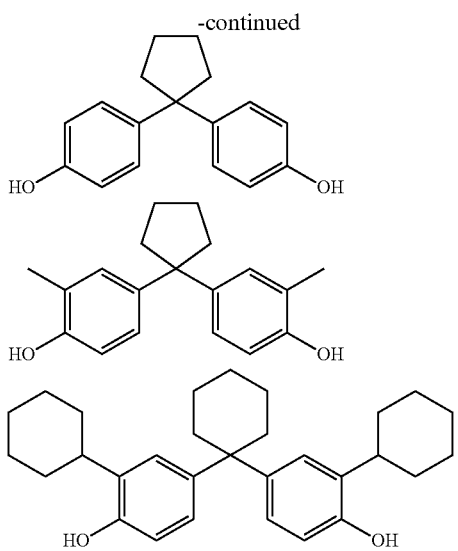

In the formula (a-1), $R^{a0}$ is a hydrogen atom or a group represented by —CO—$Y^a$—COOH. Herein, $Y^a$ represents a residue obtainable by removing an acid anhydride group (—CO—O—CO—) from dicarboxylic acid anhydride. Examples of the dicarboxylic anhydride include maleic anhydride, succinic anhydride, itaconic anhydride, phthalic anhydride, tetrahydrophthalic anhydride, hexahydrophthalic anhydride, methylendomethylenetetrahydrophthalic anhydride, chlorendic anhydride, methyltetrahydrophthalic anhydride, anhydrous glutaric acid, and the like.

Furthermore, in the formula (a-1), $Z^a$ is a residue obtainable by removing 2 acid anhydride groups from tetracarboxylic acid dianhydride. Examples of the tetracarboxylic acid dianhydride include tetracarboxylic acid dianhydride represented by the following formula (a-4), pyromellitic dianhydride, benzophenonetetracarboxylic dianhydride, biphenyltetracarboxylic dianhydride, biphenylethertetracarboxylic dianhydride, and the like. In addition, in the formula (a-1), m represents an integer of 0 or more and 20 or less.

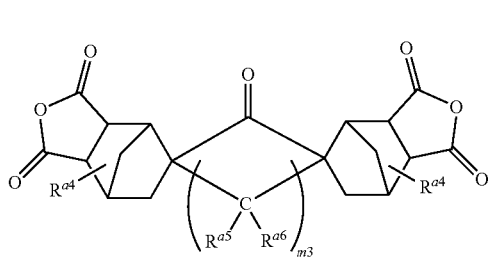

(a-4)

In the formula (a-4), $R^{a4}$, $R^{a5}$, and $R^{a6}$ each independently represent one selected from the group consisting of a hydrogen atom, an alkyl group having 1 or more and 10 or less, and a fluorine atom, and m3 represents an integer of 0 or more and 12 or less.

An alkyl group which may be selected as $R^{a4}$ in the formula (a-4) is an alkyl group having 1 or more and 10 or less carbon atoms. When the number of carbon atoms of the alkyl group is in this range, heat resistance of the obtained carboxylic acid ester is especially improved. When $R^{a4}$ is alkyl group, the number of carbon atoms thereof is preferably 1 or more and 6 or less, more preferably 1 or more and 5 or less, further preferably 1 or more and 4 or less, and particularly preferably 1 or more and 3 or less, since a cardo resin having excellent heat resistance is easily obtained. When $R^{a4}$ is alkyl group, the alkyl group may be any one of straight chain and branched chain alkyl groups.

As $R^{a4}$ in the formula (a-4), a hydrogen atom or an alkyl group having 1 or more and 10 or less carbon atoms are preferred. $R^{a4}$ in the formula (a-4) is preferably a hydrogen atom, a methyl group, an ethyl group, an n-propyl group or an isopropyl group, and more preferably a hydrogen atom or a methyl group. Plural $R^{a4}$s in the formula (a-4) are preferably the same group, since a tetracarboxylic acid dianhydride with high purity can easily be prepared.

In the formula (a-4), m3 represent 0 or more and 12 or less. When value of m3 is 12 or less, purification of the tetracarboxylic acid dianhydride is easy. Upper limit of m3 is preferably 5, and more preferably 3, since purification of the tetracarboxylic acid dianhydride is easy. Lower limit of m3 is preferably 1, and more preferably 2 in view of the chemical stability of the tetracarboxylic acid dianhydride. In the formula (a-4), m3 is preferably 2 or 3.

An alkyl group having 1 or more and 10 or less carbon atoms which may be selected as $R^{a5}$ and $R^{a6}$ in the formula (a-4) is same as the alkyl group having 1 or more and 10 or less carbon atoms which may be selected as $R^{a4}$. $R^{a5}$ and $R^{a6}$ are preferably a hydrogen atom or an alkyl group having 1 or more and 10 or less (preferably 1 or more and 6 or less, more preferably 1 or more and 5 or less, further preferably 1 or more and 4 or less, and particularly preferably 1 or more and 3 or less), and more preferably a hydrogen atom or an methyl group, since purification of tetracarboxylic acid dianhydride is easy.

Examples of the tetracarboxylic dianhydride represented by the formula (a-4) include norbornane-2-spiro-α-cyclopentanone-α'-spiro-2"-norbornane-5,5",6,6"-tetracarboxylic dianhydride (another name "norbornane-2-spiro-2'-cyclopentanone-5'-spiro-2"-norbornane-5,5",6,6"-tetracarboxylic dianhydride"), methylnorbornane-2-spiro-α-cyclopentanone-α'-spiro-2"-(methylnorbornane)-5,5",6,6"-tetracarboxylicf dianhydride, norbornane-2-spiro-α-cyclohexanone-α'-spiro-2"-norbornane-5,5",6,6"-tetracarboxylic dianhydride (another name "norbornane-2-spiro-2'-cyclohexanone-6'-spiro-2"-norbornane-5,5",6,6"-tetracarboxylic dianhydride"), methylnorbornane-2-spiro-α-cyclohexanone-α'-spiro-2"-(methylnorbornane)-5,5",6,6"-tetracarboxylic dianhydride, norbornane-2-spiro-α-cyclopropanone-α'-spiro-2"-norbornane-5,5",6,6"-tetracarboxylic dianhydride, norbornane-2-spiro-α-cyclobutanone-α'-spiro-2"-norbornane-5,5",6,6"-tetracarboxylic dianhydride, norbornane-2-spiro-α-cycloheptanone-α'-spiro-2"-norbornane-5,5",6,6"-tetracarboxylic dianhydride, norbornane-2-spiro-α-cyclooctanone-α'-spiro-2"-norbornane-5,5",6,6"-tetracarboxylic dianhydride, norbornane-2-spiro-α-cyclononanone-α'-spiro-2"-norbornane-5,5",6,6"-tetracarboxylic dianhydride, norbornane-2-spiro-α-cyclodecanone-α'-spiro-2"-norbornane-5,5",6,6"-tetracarboxylic dianhydride, norbornane-2-spiro-α-cycloundecanone-α'-spiro-2"-norbornane-5,5",6,6"-tetracarboxylic dianhydride, norbornane-2-spiro-α-cyclododecanone-α'-spiro-2"-norbornane-5,5",6,6"-tetracarboxylic dianhydride, norbornane-2-spiro-α-cyclotridecanone-α'-spiro-2"-norbornane-5,5",6,6"-tetracarboxylic dianhydride, norbornane-2-spiro-α-cyclotetradecanone-α'-spiro-2"-norbornane-5,5",6,6"-tetracarboxylic dianhydride, norbornane-2-spiro-α-cyclopentadecanone-α'-spiro-2"-norbornane-5,5",6,6"-tetracarboxylic dianhydride, norbornane-2-spiro-α-

(methylcyclopentanone)-α'-spiro-2"-norbornane-5,5",6,6"-tetracarboxylic dianhydride, norbornane-2-spiro-α-(methylcyclohexanone)-α'-spiro-2"-norbornane-5,5",6,6"-tetracarboxylic dianhydride, and the like.

A weight average molecular weight of (A1) cardo resin is preferably 1,000 or more and 40,000 or less, and more preferably 2,000 or more and 30,000 or less. When the weight average molecular weight is in above-mentioned range, sufficient heat resistance and strength of film can be obtained while excellent developing property is obtained.

Using an (A2) acrylic resin as the alkali-soluble resin (A) is also preferred. The (A2) acrylic resin can be used alone or in combination of with other alkali-soluble resin. Since there are above-mentioned advantages by using the (A1) cardo resin as the alkali-soluble resin (A), the (A2) acrylic resin and the (A1) cardo resin are preferably used in combination.

As the (A2) acrylic resin, a resin containing a constituent derived from a (meth)acrylic acid and/or a constituent unit derived from a (meth)acrylic acid ester is used. The (meth)acrylic acid is an acrylic acid or a methacrylic acid. The (meth)acrylic acid ester is represented by the following formula (a-5), and is not particularly limited as long as the object of the present invention is not inhibited.

In the formula (a-5), $R^{a7}$ represents a hydrogen atom or a methyl group. $R^{a8}$ is a monovalent organic group. This organic group may have a bond or a substituent, other than a hydrocarbon group such as a heteroatom, in the organic group. This organic group may be linear, branched or cyclic.

A substituent in an organic group as $R^{a8}$ is not particularly limited, and examples of the substituent include a halogen atom, a hydroxy group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxy group, a carboxylate group, an acyl group, an acyloxy group, a sulfino group, a sulfo group, a sulfonato group, a phosphino group, a phosphinyl group, a phosphono group, a phosphonato group, a hydroxyimino group, an alkylether group, an alkylthioether group, an arylether group, an arylthioether group, an amino group (—NH$_2$, —NHR, and —NRR': wherein R and R' each independently represent a hydrocarbon group), and the like. A hydrogen atom included in the above-mentioned substituent may be substituted with a hydrocarbon group. Furthermore, the hydrocarbon group included in the above-mentioned substituent may be linear, branched or cyclic.

$R^{a8}$ is preferably an alkyl group, an aryl group, an aralkyl group, or a heterocyclic group. These groups may be substitute with a halogen atom, a hydroxy group, an alkyl group or a heterocyclic group. When these groups include an alkylene part, the alkylene part is interrupted by an ether bond, thioether bond, or ester bond.

When the alkyl group is linear or branched, the number of carbon atoms thereof is preferably 1 or more and 20 or less, more preferably 1 or more and 15 or less, and particularly preferably 1 or more and 10 or less. Suitable examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, and isooctyl group, a sec-octyl group, a tert-octyl group, an n-nonyl group, an isononyl group, an n-decyl group, an isodecyl group, and the like.

When the alkyl group is an alicyclic group or a group including an alicyclic group, examples of the alicyclic group included in the alkyl group include a monocyclic alicyclic group such as cyclopentyl group and cyclohexyl group, and a polycyclic alicyclic group such as adamantyl group, norbornyl group, isobornyl group, tricyclononyl group, and tetracyclododecyl group.

Furthermore, in the (A2) acrylic resin, a compound other compounds than (meth)acrylic acid and (meth)acrylic acid ester may further be copolymerized. Examples of such other compounds include (meth)acrylamides, unsaturated carboxylic acids, allyl compounds, vinyl ethers, vinyl esters, styrenes, and the like. These compounds can be used alone or in combination of two or more types thereof.

Examples of (meth)acrylamides include (meth)acrylamide, N-alkyl(meth)acrylamide, N-aryl(meth)acrylamide, N,N-dialkyl(meth)acrylamide, N,N-diaryl(meth)acrylamide, N-methyl-N-phenyl(meth)acrylamide, N-hydroxyethyl-N-methyl(meth)acrylamide, and the like.

Examples of unsaturated carboxylic acids include mono carboxylic acid such as crotonic acid; dicarboxylic acid such as maleic acid, fumaric acid, citraconic acid, mesaconic acid, and itaconic acid; anhydrides of these dicarboxylic acids and the like.

Examples of the allyl compounds include allyl esters such as allyl acetate, allyl caproate, allyl caprylate, allyl laurate, allyl palmitate, allyl stearate, allyl benzoate, allyl acetoacetate, and allyl lactate; allyloxyethanol, and the like.

Examples of vinyl ethers include alkyl vinyl ethers such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether; vinylaryl ethers such as vinyl phenyl ether, vinyl tolyl ether, vinyl chlorophenyl ether, vinyl-2,4-dichlorophenyl ether, vinyl naphthyl ether, and vinyl anthranyl ether; and the like.

Examples of vinyl esters include vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl benzoate, vinyl salicylate, vinyl chlorobenzoate, vinyl tetrachlorobenzoate, vinyl naphthoate, and the like.

Examples of styrenes include styrene; alkylstyrenes such as methylstyrene, dimethylstyrene, trimethyl styrene, ethyl styrene, diethyl styrene, isopropylstyrene, butyl styrene, hexyl styrene, cyclohexylstyrene, decylstyrene, benzylstyrene, chloromethyl styrene, trifluoromethylstyrene, ethoxymethylstyrene, and acetoxymethylstyrene; alkoxystyrenes such as methoxystyrene, 4-methoxy-3-methylstyrene, and dimethoxystyrene; halostyrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene; and the like.

In the (A2) acrylic resin, the content of the constituent unit derived from (meth)acrylic acid and the content of the constituent unit derived from (meth)acrylic acid ester are not limited as long as the object of the present invention is not inhibited. In the (A2) acrylic resin, the content of the constituent unit derived from (meth)acrylic acid is preferably 5% by mass or more and 50% by mass or less, and more preferably 10% by mass or more and 30% by mass or less with respect to the mass of the acrylic resin. Furthermore, in the (A2) acrylic resin, the content of the constituent unit derived from (meth)acrylic acid ester is preferably 10% by mass or more and 95% by mass or less, and more preferably 30% by mass or more and 90% by mass or less with respect to the mass of the acrylic resin.

In the (A2) acrylic resin, the sum of the content of the constituent unit derived from (meth)acrylic acid and the content of the constituent unit derived from (meth)acrylic acid ester is not particularly limited as long as the object of the present invention is not inhibited, preferably 5% by mass or more and 100% by mass or less, and more preferably 10% by mass or more and 100% by mass or less with respect to the mass of the acrylic resin.

The weight average molecular weight of the (A2) acrylic resin is preferably 2,000 or more and 200,000 or less, and more preferably 5,000 or more and 30,000 or less. When the content is in the above-mentioned range, a balance of film-forming property and developing property after exposure tends to be easily achieved.

In the case where the (A1) cardo resin is used as the alkali-soluble resin (A), the content of the (A1) cardo resin is preferably 50% by mass or more, more preferably 70% by mass or more, further preferably 80% by mass or more, particularly preferably 90% by mass or more, and the most preferably 100% by mass with respect to the mass of the alkali-soluble resin.

The content of the alkali-soluble resin (A) is preferably 20% by mass or more and 85% by mass or less, and more preferably 25% by mass or more and 75% by mass or less, based on the mass (total solid component) of the photosensitive resin composition, excluding the mass of an organic solvent (S) mentioned below. By adjusting the content in the above range, it is possible to form a cured film which is less likely to generate a gas, and thus a photosensitive resin composition having excellent developability is easily obtained.

<Photopolymerizable Monomer (B)>

As a photopolymerizable monomer (B), a monomer having an ethylenically unsaturated group can preferably be used. This monomer having an ethylenically unsaturated group includes a monofunctional monomer and a polyfunctional monomer.

Examples of the monofunctional monomer include (meth)acrylamide, methylol(meth)acrylamide, methoxymethyl (meth)acrylamide, ethoxymethyl(meth)acrylamide, propoxymethyl(meth)acrylamide, butoxymethoxymethyl (meth)acrylamide, N-methylol(meth)acrylamide, N-hydroxymethyl(meth)acrylamide, (meth)acrylic acid, fumaric acid, maleic acid, maleic anhydride, itaconic acid, itaconic anhydride, citraconic acid, citraconic anhydride, crotonic acid, 2-acrylamide-2-methylpropanesulfonic acid, tert-butylacrylamidesulfonic acid, methyl (meth)acrylate, ethyl (meth)acrylate, butyl (meth)acrylate, 2-ethylhexyl (meth) acrylate, cyclohexyl (meth)acrylate, 2-hydroxyethyl (meth) acrylate, 2-hydroxypropyl (meth)acrylate, 2-hydroxybutyl (meth)acrylate, 2 phenoxy-2-hydroxypropyl (meth)acrylate, 2-(meth)acryloyloxy-2-hydroxypropyl phthalate, glycerin mono(meth)acrylate, tetrahydrofurfuryl (meth)acrylate, dimethylaminoethyl (meth)acrylate, glycidyl (meth)acrylate, 2,2,2-trifluoroethyl (meth)acrylate, 2,2,3,3-tetrafluoropropyl (meth)acrylate, a half (meth)acrylate of a phthalic acid derivative, and the like. These monofunctional monomers may be used alone, or two or more monofunctional monomers may be used in combination.

Examples of the polyfunctional monomer include ethylene glycol di(meth)acrylate, diethylene glycol di(meth)acrylate, triethylene glycol di(meth)acrylate, tetraethylene glycol di(meth)acrylate, propylene glycol di(meth)acrylate, polypropylene glycol di(meth)acrylate, butylene glycol di(meth) acrylate, neopentyl glycol di(meth)acrylate, 1,6-hexane glycol di(meth)acrylate, trimethylolpropane tri(meth)acrylate, glycerin di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri(meth)acrylate, pentaerythritol tetra (meth)acrylate, dipentaerythritol penta(meth)acrylate, dipentaerythritol hexa(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, glycerin triacrylate, glycerin polyglycidyl ether poly (meth) acrylate, urethane (meth)acrylate (i.e., a reaction product of such as tolylene diisocyanate, trimethylhexamethylene diisocyanate, hexamethylene diisocyanate, and 2-hydroxyethyl (meth)acrylate), methylenebis(meth)acrylamide, (meth) acrylamide methylene ether, a polyfunctional monomer such as a fused product of polyvalent alcohol and N-methylol (meth)acrylamide, triacryl formal, and the like. These polyfunctional monomers may be used alone, or two or more polyfunctional monomers may be used in combination.

Among these monomers having an ethylenically unsaturated group, a trifunctional or higher polyfunctional monomer is preferred, a teterafunctional or higher polyfunctional monomer is more preferred, and a pentafunctional or higher polyfunctional monomer is still more preferred, in view of the fact that they tend to enhance the adhesion of the photosensitive resin composition to the substrate and the strength of the photosensitive resin composition after curing.

The content of the photopolymerizable monomer (B) in the composition is preferably 1% by mass or more and 50% by mass or less, and more preferably 5% by mass or more and 40% by mass or less, based on the mass (total solid component) of the photosensitive resin composition, excluding the mass of an organic solvent (S) mentioned below. By adjusting the content in the above range, it is easy to keep a balance among sensitivity, developability, and resolution.

<Photopolymerization Initiator (C)>

Photopolymerization initiator (C) is not particularly limited, and it is possible to use a conventionally known photopolymerization initiator.

Specific examples of the photopolymerization initiator (C) include 1-hydroxycyclohexyl phenyl ketone, 2-hydroxy-2-methyl-1-phenylpropan-1-one, 1-[4-(2-hydroxyethoxy) phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl)ketone, 2-methyl-1-[4-(methylthio) phenyl]-2-morpholinopropan-1-one, 2-benzyl-2-dimethylamino-1-(4-morpholinophenyl)-butan-1-one, ethanone, 1-[9-ethyl-6-(2-methylbenzoyl)-9H-carbazol-3-yl], 1-(O-acetyloxime), (9-ethyl-6-nitro-9H-carbazol-3-yl)[4-(2-methoxy-1-methylethoxy)-2-methylphenyl]methanone O-acetyl oxime, 2 (benzoyloxyimino)-1-[4-(phenylthio)phenyl]-1-octanone, 2,4,6-trimethylbenzoyl diphenylphosphine oxide, 4-benzoyl-4'-methyldimethyl sulfide, 4 dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethylacetal, benzyldimethylketal, 1-phenyl-1,2-propanedione-2-(O-ethoxycarbonyl)oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2 isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene hydroperoxide, 2-mercaptobenzimidazole, 2-mercaptobenzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzyl, benzoin, benzoin methyl ether, benzoin ethyl ether, benzoin isopropyl ether, benzoin n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl-4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, and the like. These photopolymerization initiators can be used alone, or two or more photopolymerization initiators can be used in combination.

Among these, an oxime-based photopolymerization initiator is particularly preferably used in view of the sensitivity. Among oxime-based photopolymerization initiators, O-acetyl-1-[6-(2-methylbenzoyl)-9-ethyl-9H-carbazol-3-yl] ethanone oxime, ethanone, 1-[9-ethyl-6-(pyrrol-2-ylcarbonyl)-9H-carbazol-3-yl], 1-(O-acetyloxime),and 1,2-octanedione, 1-[4-(phenylthio)-,2-(O-benzoyloxime)] are particularly preferred.

It is also preferred to use, as the photopolymerization initiator, an oxime-based compound represented by the following formula (c1):

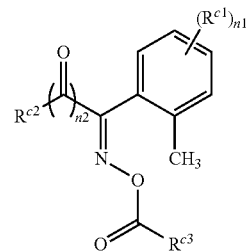

(c1)

wherein $R^{c1}$ is a group selected from the group consisting of a monovalent organic group, an amino group, halogen, a nitro group, and a cyano group, n1 is an integer of 0 or more and 4 or less, n2 is 0 or 1, $R^{c2}$ is an optionally substituted phenyl group or an optionally substituted carbazolyl group, and $R^{c3}$ is a hydrogen atom, or an alkyl group having 1 or more and 6 or less carbon atoms.

In the formula (c1), $R^{c1}$ is not particularly limited as long as the object of the present invention is not inhibited, and is appropriately selected from various organic groups. When $R^{c1}$ is an organic group, suitable examples include an alkyl group, an alkoxy group, an cycloalkyl group, an cycloalkoxy group, a saturated aliphatic acyl group, a saturated aliphatic acyloxy group, an alkoxycarbonyl group, a phenyl group which may have a substituent, a phenoxy group which may have a substituent, a benzoyl group which may have a substituent, a phenoxycarbonyl group which may have a substituent, a benzoyloxy group which may have a substituent, a phenylalkyl group which may have a substituent, a naphthyl group which may have a substituent, a naphthoxy group which may have a substituent, a naphthoyl group which may have a substituent, a naphthoxycarbonyl group which may have a substituent, a naphthoyloxy group which may have a substituent, a naphthylalkyl group which may have a substituent, a heterocyclyl group which may have a substituent, an amino group, an amino group substituted with one or two organic groups, a morpholin-1-yl group, a piperazin-1-yl group, a halogen, a nitro group, a cyano group, and the like. When n1 is an integer of 2 or more and 4 or less, $R^{c1}$ may be the same or different. The number of carbon atoms of the substituent does not include the number of carbon atoms of the substituent possessed by the substituent.

When $R^{c1}$ is an alkyl group, the number of carbon atoms of the alkyl group is preferably 1 or more and 20 or less, and more preferably 1 or more and 6 or less. When $R^{c1}$ is an alkyl group, the alkyl group may be either one of a straight chain or branched chain alkyl group. When $R^{c1}$ is an alkyl group, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. When $R^{c1}$ is an alkyl group, the alkyl group may contain an ether bond (—O—) in the carbon chain. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group, and the like.

When $R^{c1}$ is an alkoxy group, the number of carbon atoms of the alkoxy group is preferably 1 or more and 20 or less, and more preferably 1 or more and 6 or less. When $R^{c1}$ is an alkoxy group, the alkoxy group may be either one of a straight chain or branched chain alkoxy group. When $R^{c1}$ is an alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group, and the like. When $R^{c1}$ is an alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group, and the like.

When $R^{c1}$ is a cycloalkyl group or a cycloalkoxy group, the number of carbon atoms of the cycloalkyl group or cycloalkoxy group is preferably 3 or more and 10 or less, and more preferably 3 or more and 6 or less. When $R^{c1}$ is a cycloalkyl group, specific examples include a cyclopropyl group, a cyclobutyl group, a cyclopentyl group, a cyclohexyl group, a cycloheptyl group, a cyclooctyl group, and the like. When $R^{c1}$ is a cycloalkoxy group, specific examples include a cyclopropyloxy group, a cyclobutyloxy group, a cyclopentyloxy group, a cyclohexyloxy group, a cycloheptyloxy group, a cyclooctyloxy group, and the like.

When $R^{c1}$ is a saturated aliphatic acyl group or a saturated aliphatic acyloxy group, the number of carbon atoms of the saturated aliphatic acyl group or saturated aliphatic acyloxy group is preferably 2 or more and 20 or less, and more preferably 2 or more and 7 or less. When $R^{c1}$ is a saturated aliphatic acyl group, specific examples include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, n-hexadecanoyl group, and the like. When $R^{c1}$ is a saturated aliphatic acyloxy group, specific examples include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group, and the like.

When $R^{c1}$ is an alkoxycarbonyl group, the number of carbon atoms of the alkoxycarbonyl group is preferably 2 or more and 20 or less, and more preferably 2 or more and 7 or less. When $R^{c1}$ is an alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group, and the like.

When $R^{c1}$ is a phenylalkyl group, the number of carbon atoms of the phenylalkyl group is preferably 7 or more and 20 or less, and more preferably 7 or more and 10 or less. When $R^{c1}$ is a naphthylalkyl group, the number of carbon atoms of the naphthylalkyl group is preferably 11 or more and 20 or less, and more preferably 11 or more and 14 or less. When $R^{c1}$ is a phenylalkyl group, specific examples include a benzyl group, a 2-phenylethyl group, a 3-phenylpropyl group, and a 4-phenylbutyl group. When $R^{c1}$ is a naphthylalkyl group, specific examples include an α-naphthylmethyl group, a β-naphthylmethyl group, a 2-(α-naphthyl)ethyl group, and a 2-(β-naphthyl)ethyl group. When $R^{c1}$ is a phenylalkyl group or naphthylalkyl group, $R^{c1}$ may further have a substituent on a phenyl group or a naphthyl group.

When $R^{c1}$ is a heterocyclyl group, the heterocyclyl group is a 5- or 6-membered single ring containing one or more N, S, and O, or a heterocyclyl group in which single rings are fused each other, or a single ring is fused with a benzene ring. When the heterocyclyl group is a fused ring, the number of rings in the fused ring is 3 or less. Examples of the heterocycle constituting the heterocyclyl group include furan, thiophene, pyrrole, oxazole, isoxazole, triazole, thiadiazole, isothiazole, imidazole, pyrazole, triazole, pyridine, pyrazine, pyrimidine, pyridazine, benzofuran, benzothiophene, indole, isoindole, indolizine, benzoimidazole, benzotriazole, benzoxazole, benzothiazole, carbazole, purine, quinoline, isoquinoline, quinazoline, phthalazine, cinnoline, quinoxaline, and the like. When $R^{c1}$ is a heterocyclyl group, the heterocyclyl group may have a substituent.

When $R^{c1}$ is an amino group substituted with one or two organic groups, suitable examples of the organic group include an alkyl group having 1 or more and 20 or less carbon atoms, a cycloalkyl group having 3 or more and 10 or less carbon atoms, a saturated aliphatic acyl group having 2 or more and 20 or less carbon atoms, a phenyl group which may have a substituent, a benzoyl group which may have a substituent, a phenylalkyl group having 7 or more and 20 or less carbon atoms which may have a substituent, a naphthyl group which may have a substituent, a naphthoyl group which may have a substituent, a naphthylalkyl group having 11 or more and 20 or less carbon atoms which may have a substituent, a heterocyclyl group, and the like. Specific examples of suitable organic group are the same as those in $R^{c1}$. Specific examples of the amino group substituted with one or two organic group include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, an propanoylamino group, an n-butanoylamino group, an n-pentanoylamino group, an n-hexanoylamino group, an n-heptanoylamino group, an n-octanoylamino group, an n-decanoylamino group, a benzoylamino group, an α-naphthoylamino group, a β-naphthoylamino group, and the like.

When an phenyl group, an naphthyl group, and a heterocyclyl group included in $R^{c1}$ have a substituent, examples of the substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group which has an alkyl group having 1 or more and 6 or less carbon atoms, a dialkylamino group which has two alkyl groups having 1 or more and 6 or less carbon atoms, a morpholin-1-yl group, an piperazin-1-yl group, halogen, a nitro group, a cyano group, and the like. When a phenyl group, a naphthyl group, and a heterocyclyl group included in $R^{c1}$ further have a substituent, the number of substituents is not particularly limited as long as the object of the present invention is not inhibited, and is preferably 1 or more and 4 or less. When a phenyl group, a naphthyl group, and a heterocyclyl group included in $R^{c1}$ have plural substituents, plural substituents may be the same as or different each other.

Among $R^{c1}$(s), a group selected from the group consisting of an alkyl group having 1 or more and 6 or less carbon atoms, an alkoxy group having 1 or more and 6 or less carbon atoms, and a saturated aliphatic acyl group having 2 or more and 7 or less carbon atoms is preferred, an alkyl having 1 or more and 6 or less carbon atoms is more preferred, and a methyl group is particularly preferred, since these are chemically stable and facilitates the synthesis of an oxime ester compound due to little steric hindrance.

When the position of a bond of a phenyl group and a main skeleton of an oxime ester compound is regarded as the 1-position and the position of a methyl group is regarded as the 2-position with respect to the phenyl group to which $R^{c1}$ is bonded, the position at which $R^{c1}$ is bonded to a phenyl group is preferably the 4-position or the 5-position, more preferably the 5-position. n1 is preferably an integer of 0 or more and 3 or less, more preferably an integer of 0 or more and 2 or less, and particularly preferably 0 or 1.

$R^{c2}$ is a phenyl group which may have a substituent, or a carbazolyl group which may have a substituent. When $R^{c2}$ is a carbazolyl group which may have a substituent, the nitrogen atom on the carbazolyl group may be substituted with an alkyl group having 1 or more and 6 or less carbon atoms.

For $R^{c2}$, there is no particular limitation for substituents on the phenyl group or the carbazolyl group as long as they do not interfere with the object of the present invention. Examples of suitable substituents which the phenyl group or carbazolyl group may have on the carbon atom include an alkyl group having 1 or more and 20 or less carbon atoms, an alkoxy group having 1 or more and 20 or less carbon atoms, a cycloalkyl group having 3 or more and 10 or less carbon atoms, a cycloalkoxy group having 3 or more and 10 or less carbon atoms, a saturated aliphatic acyl group having 2 or more and 20 or less carbon atoms, an alkoxycarbonyl group having 2 or more and 20 or less carbon atoms, a saturated aliphatic acyloxy group having 2 or more and 20 or less carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 or more and 20 or less carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 or more and 20 or less carbon atoms, an optionally substituted heterocyclyl group, an optionally substituted heterocyclylcarbonyl group, an amino group, an amino group substituted with 1 or 2 organic groups, a morpholine-1-yl group, a piperazine-1-yl group, halogen, a nitro group, a cyano group and the like.

In a case where $R^{c2}$ is a carbazolyl group, examples of suitable substituent which the carbazolyl group may have on the nitrogen atom include an alkyl group having 1 or more and 20 or less carbon atoms, a cycloalkyl group having 3 or more and 10 or less carbon atoms, a saturated aliphatic acyl group having 2 or more and 20 or less carbon atoms, an alkoxycarbonyl group having 2 or more and 20 or less carbon atoms, an optionally substituted phenyl group, an optionally substituted benzoyl group, an optionally substituted phenoxycarbonyl group, an optionally substituted phenylalkyl group having 7 or more and 20 or less carbon atoms, an optionally substituted naphthyl group, an optionally substituted naphthoyl group, an optionally substituted naphthoxycarbonyl group, an optionally substituted naphthylalkyl group having 11 or more and 20 or less carbon atoms, an optionally substituted heterocyclyl group, an optionally substituted heterocyclylcarbonyl group and the like. Among these substituents, an alkyl group having 1 or more and 20 or less carbon atoms is preferred, and an alkyl group having 1 or more and 6 or less carbon atoms is more preferred, and in particular an ethyl group is preferred.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group and an amino group substituted with 1 or 2 organic groups, specific examples of optional substituents on the phenyl group or the carbazolyl group are same as those in $R^{c1}$.

In a case where the phenyl group, the naphthyl group and the heterocyclyl group included in the substituent on the phenyl group or the carbazolyl group in $R^{c2}$ further have a substituent, examples of the substituent include an alkyl group having 1 or more and 6 or less carbon atoms; an alkoxy group having 1 or more and 6 or less carbon atoms; a saturated aliphatic acyl group having 2 or more and 7 or less carbon atoms; an alkoxycarbonyl group having 2 or more and 7 or less carbon atoms; a saturated aliphatic acyloxy group having 2 or more and 7 or less carbon atoms; a phenyl group; a naphthyl group; a benzoyl group; a naphthoyl group; a benzoyl group substituted with a group selected from the group consisting of an alkyl group having 1 or more and 6 or less carbon atoms, a morpholine-1-yl group, a piperazine-1-yl group and a phenyl group; a monoalkylamino group having an alkyl group having 1 or more and 6 or less carbon atoms; a dialkylamino group having alkyl groups having 1 or more and 6 or less carbon atoms; a morpholine-1-yl group; a piperazine-1-yl group; halogen; a nitro group; and a cyano group. In a case where the phenyl group, the naphthyl group and the heterocyclyl group included in the substituent on the phenyl group or the carbazolyl group further have a substituent, the number of the substituent is not limited as far as objects of the present invention are not inhibited, but 1 or more and 4 or less is preferred. In a case where the phenyl group, the naphthyl group and the heterocyclyl group have multiple substituents, the substituents may be different from or the same as each other.

Among $R^{c2}$(s), a group represented by the following formula (c2) or (c3) is preferred, a group represented by the following formula (c2) is more preferred, and a group represented by the following formula (c2) in which A is S is particularly preferred, since a photopolymerization initiator with excellent sensitivity is easily obtained.

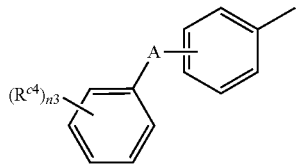

(c2)

$R^{c4}$ is a group selected from the group consisting of a monovalent organic group, an amino group, halogen, a nitro group and a cyano group; A is S or O; and n3 is an integer of 0 or more and 4 or less.

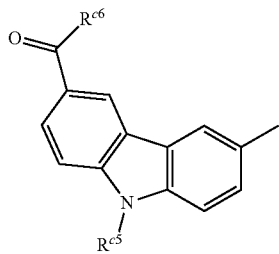

(c3)

$R^{c5}$ and $R^{c6}$ each are a monovalent organic group.

When $R^{c4}$ in formula (c2) is an organic group, $R^{c4}$ can be selected from various kinds of organic groups as far as objects of the present invention are not inhibited. Preferred examples when $R^{c4}$ is an organic group in formula (c2) include alkyl groups having 1 or more and 6 or less carbon atoms; alkoxy groups having 1 or more and 6 or less carbon atoms; saturated aliphatic acyl groups having 2 or more and 7 or less carbon atoms; alkoxycarbonyl groups having 2 or more and 7 or less carbon atoms; saturated aliphatic acyloxy groups having 2 or more and 7 or less carbon atoms; a phenyl group; a naphthyl group; a benzoyl group; a naphthoyl group; benzoyl groups substituted with a group selected from the group consisting of an alkyl group having 1 or more and 6 or less carbon atoms, a morpholine-1-yl group, a piperazine-1-yl group and a phenyl group; monoalkylamino groups having an alkyl group having 1 or more and 6 or less carbon atoms; dialkylamino groups having alkyl groups having 1 or more and 6 or less carbon atoms; a morpholine-1-yl group; a piperazine-1-yl group; halogen; a nitro group; and a cyano group.

Among $R^{c4}$, a benzoyl group; a naphthoyl group; a benzoyl groups substituted with a group selected from the group consisting of an alkyl group having 1 or more and 6 or less carbon atoms, a morpholine-1-yl group, a piperazine-1-yl group, and a phenyl group; and a nitro group are preferred, and a benzoyl group; a naphthoyl group; a 2-methylphenyl carbonyl group; a 4-(piperazine-1-yl) phenyl carbonyl group; and a 4 (phenyl) phenyl carbonyl group are more preferred.

In formula (c2), n3 is preferably an integer of 0 or more and 3 or less, more preferably an integer of 0 or more and 2 or less, and particularly preferably 0 or 1. When n3 is 1, the position at which $R^{c4}$ bonds is preferably the para-position to the bonding through which the phenyl group (to which $R^{c4}$ bonds) bonds to an oxygen atom or a sulfur atom.

$R^{c5}$ in the formula (c3) can be selected from various organic groups as long as they do not interfere with the object of the present invention. Suitable examples of $R^{c5}$ include an alkyl group having 1 or more and 20 or less carbon atoms, a cycloalkyl group having 3 or more and 10 or less carbon atoms, a saturated aliphatic acyl group having 2 or more and 20 or less carbon atoms, an alkoxycarbonyl group having 2 or more and 20 or less carbon atoms, an optionally substituted phenyl group, an optionally substituted benzoyl group, an optionally substituted phenoxycarbonyl group, an optionally substituted phenylalkyl group having 7 or more and 20 or less carbon atoms, an optionally substituted naphthyl group, an optionally substituted naphthoyl group, an optionally substituted naphthoxycarbonyl group, an optionally substituted naphthylalkyl group having 11 or more and 20 or less carbon atoms, an optionally substituted heterocyclyl group, an optionally substituted heterocyclylcarbonyl group, and the like.

Among $R^{c5}$, an alkyl group having 1 or more and 20 or less carbon atoms is preferred, an alkyl group having 1 or more and 6 or less carbon atoms is more preferred, and an ethyl group is particularly preferred.

There is no particular limitation for $R^{c6}$ in the formula (c3) as long as they do not interfere with the object of the present invention, and it can be selected from various organic groups. Specific examples of the suitable group for $R^{c6}$ include an alkyl group having 1 or more and 20 or less carbon atoms, an optionally substituted phenyl group, an optionally substituted naphthyl group and an optionally substituted heterocyclyl group. Among these groups, $R^{c6}$ is more preferably an optionally substituted phenyl group, and in particular preferably a 2-methylphenyl group.

when a phenyl group, a naphthyl group, and a heterocyclyl group included in $R^{c4}$, $R^{c5}$, or $R^{c6}$ further has a substituent, examples of the substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group having an alkyl group which has 1 or more and 6 or less carbon atoms, a dialkylamino group having an alkyl group which has 1 or more and 6 or less carbon atoms, a morpholin-1-yl group, a piperazin-1-yl group, halogen, a nitro group, and a cyano group. When the phenyl group, naphthyl group, and heterocyclyl group included in $R^{c4}$, $R^{c5}$, or $R^{c6}$ further has a substituent, the number of substituents is not particularly limited as long as it does not interfere with the object of the present invention, but is preferably 1 or more and 4 or less. When the phenyl group, naphthyl group, and heterocyclyl group included in $R^{c4}$, $R^{c5}$, or $R^{c6}$ further has plural substituents, plural substituents may be the same or different.

$R^{c3}$ in the formula (c1) is a hydrogen atom, or an alkyl group having 1 or more and 6 or less carbon atoms. $R^{c3}$ is preferably a methyl group or an ethyl group, and more preferably a methyl group.

Among the oxime ester compounds represented by the formula (c1), the particularly suitable compounds include the following PI-1 to PI-42.

PI-1
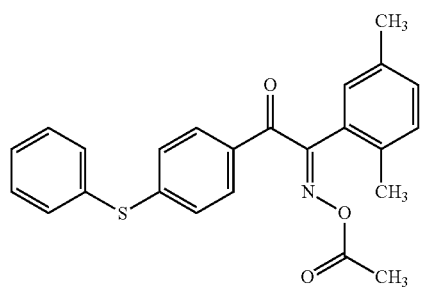
PI-6
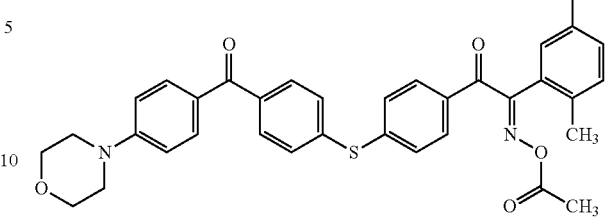
PI-2
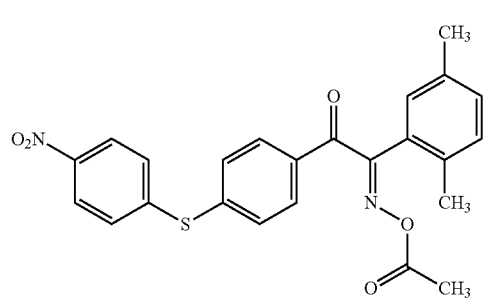
PI-7
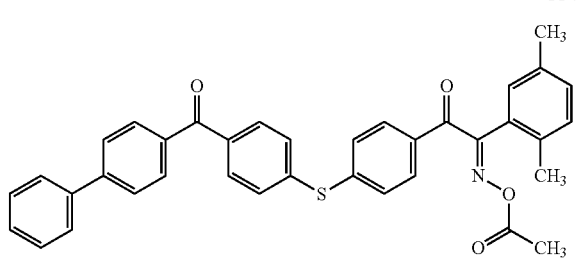
PI-3
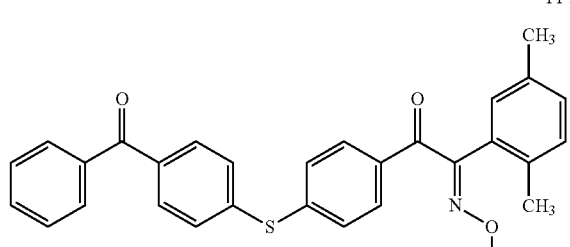
PI-8
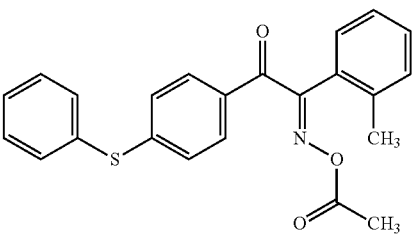
PI-4
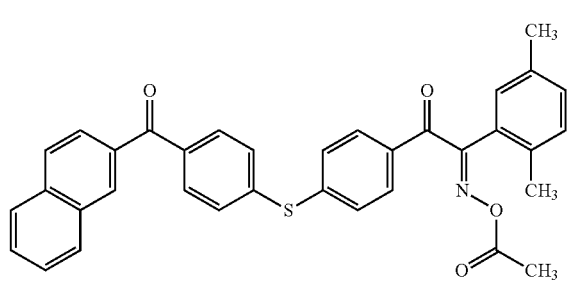
PI-9
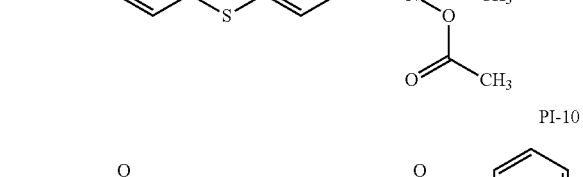
PI-5
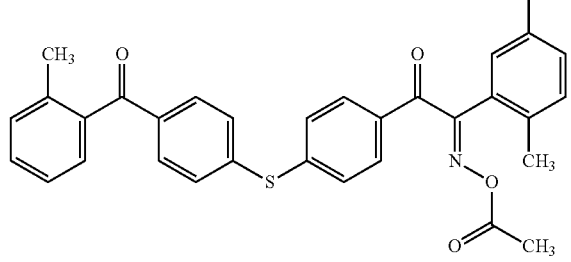
PI-10
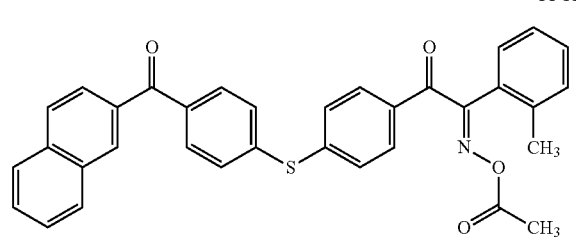

PI-12
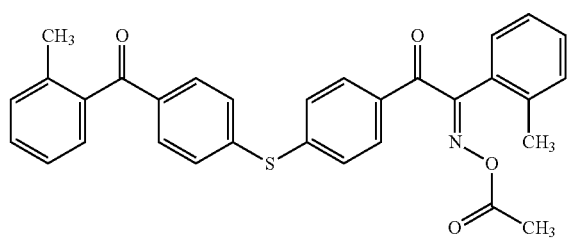
PI-13
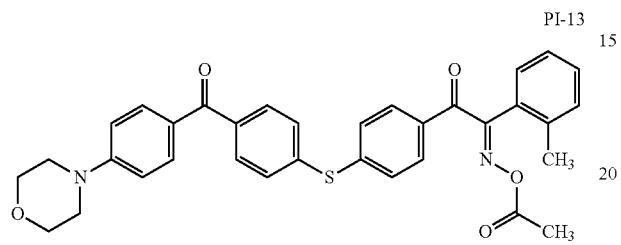
PI-14
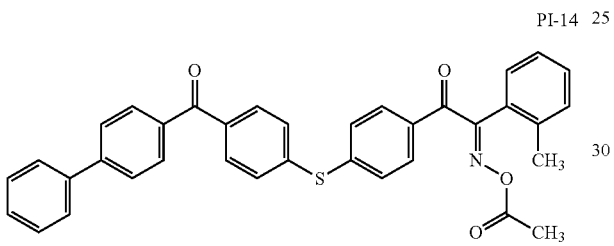
PI-15
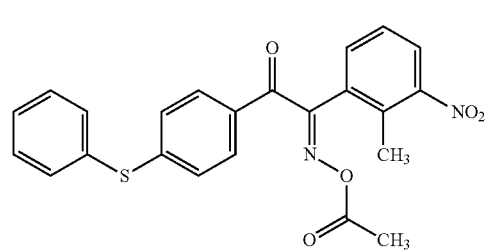
PI-16
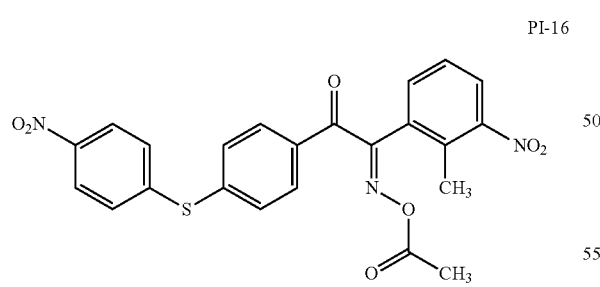
PI-17
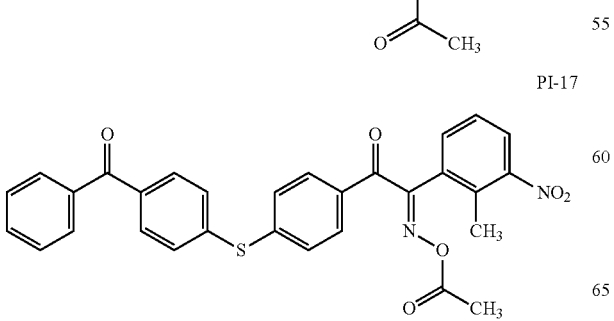
PI-18
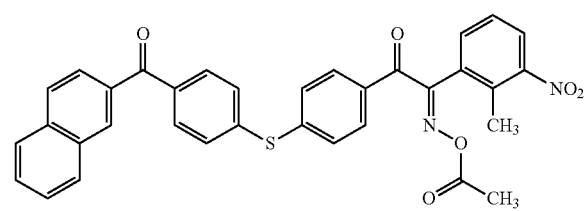
PI-19
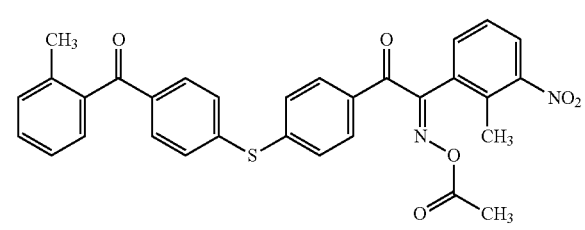
PI-20
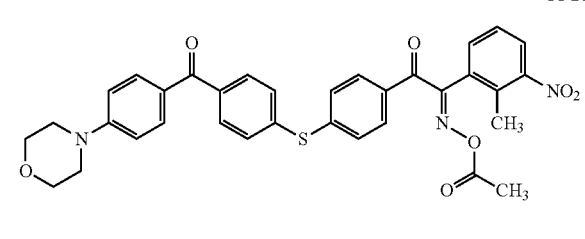
PI-21
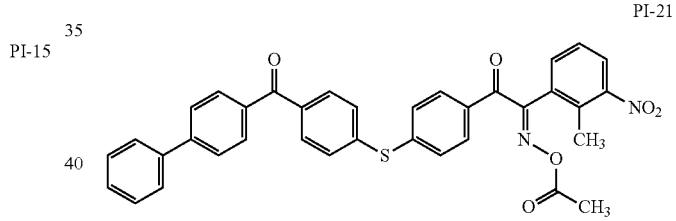
PI-22
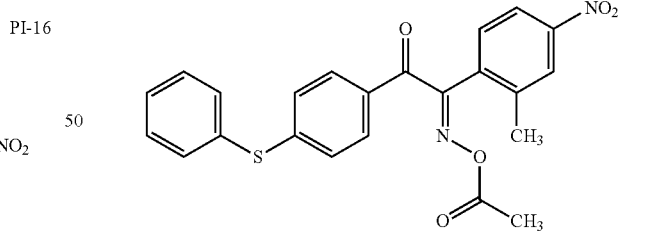
PI-23
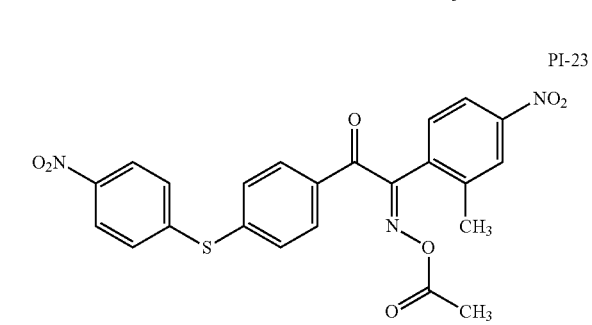

-continued
PI-24
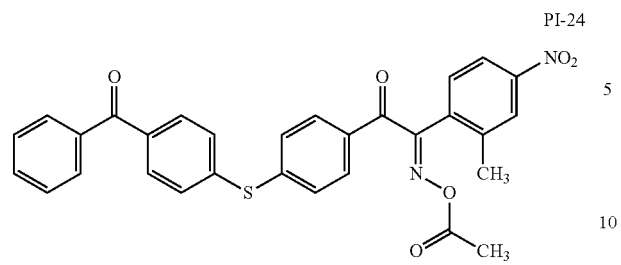
PI-25
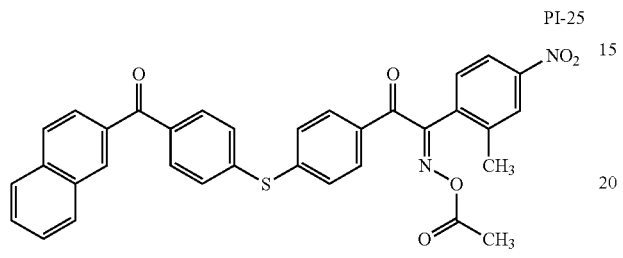
PI-26
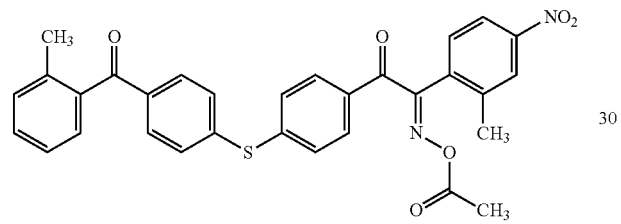
PI-27
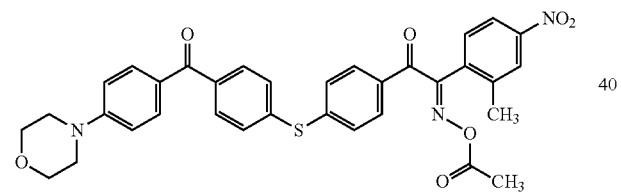
PI-28
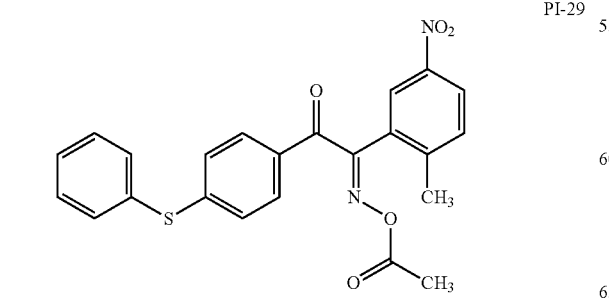
PI-29
-continued
PI-30
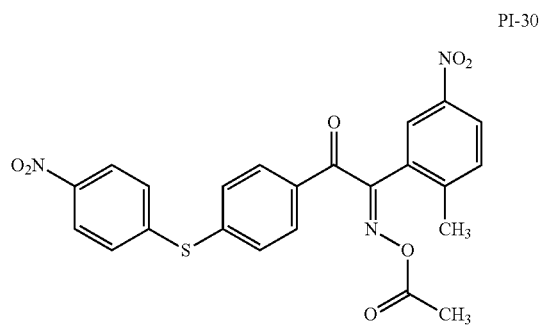
PI-31
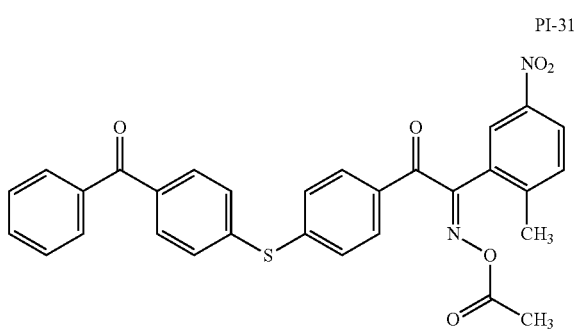
PI-32
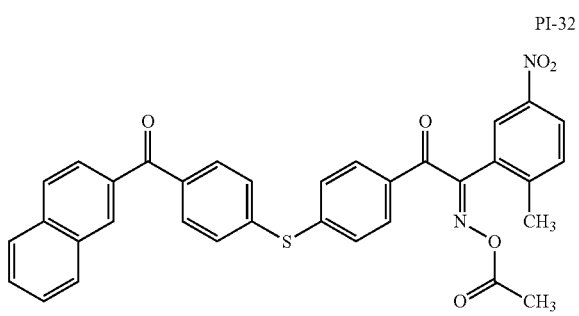
PI-33
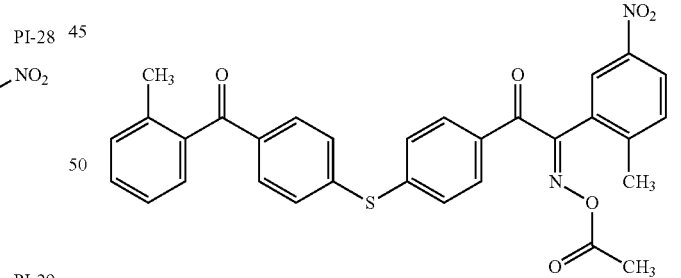
PI-34
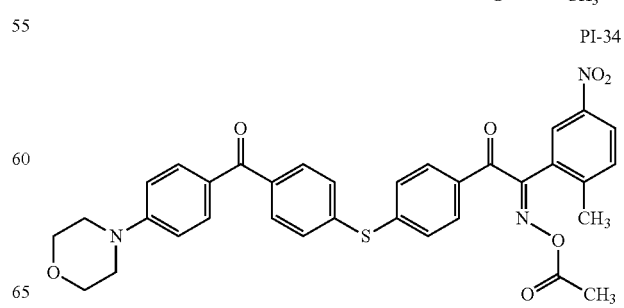

PI-35
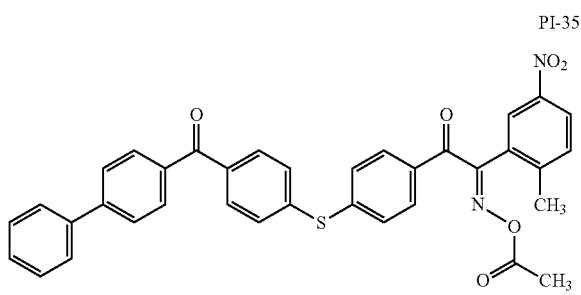

PI-36
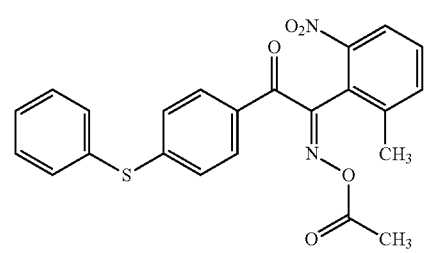

PI-37
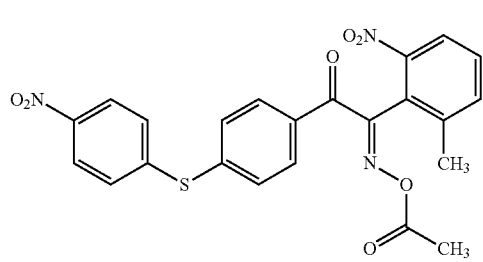

PI-38
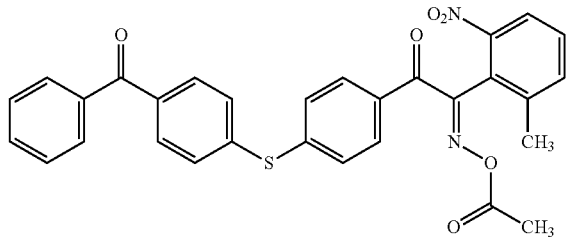

PI-39
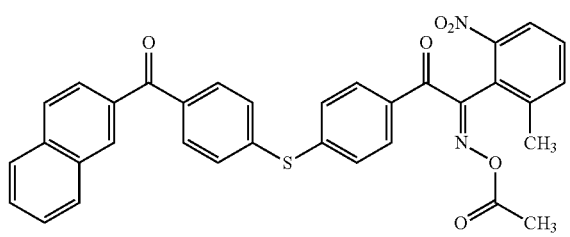

PI-40
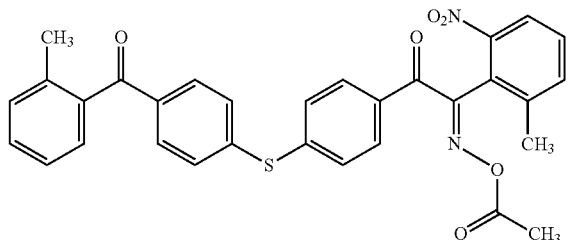

PI-41
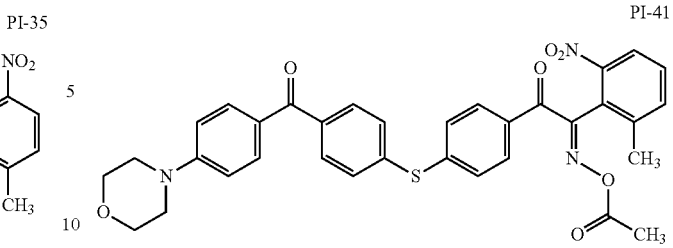

PI-42
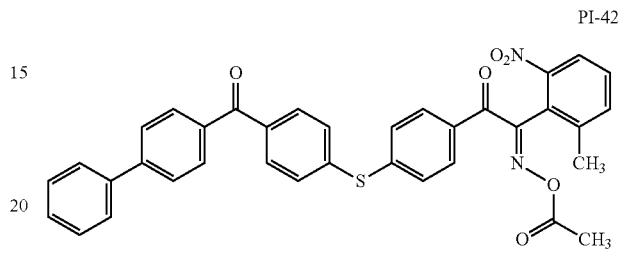

Also preferred as a photopolymerization initiator is an oxime ester compound represented by the following formula (c4).

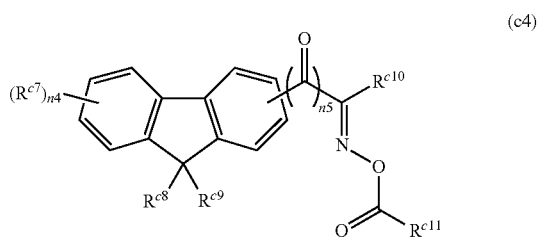

(c4)

$R^{c7}$ is a hydrogen atom, a nitro group, or a monovalent organic group, $R^{c8}$ and $R^{c9}$ each represent an optionally substituted chain alkyl group, an optionally substituted cyclic organic group, or a hydrogen atom, $R^{c8}$ and $R^{c9}$ may be bonded to one another to form a ring, $R^{c10}$ is a monovalent organic group, $R^{c11}$ is a hydrogen atom, an optionally substituted alkyl group having 1 or more and 11 or less carbon atoms, or an optionally substituted aryl group, n4 is an integer of 0 or more and 4 or less, and n5 is 0 or 1.

An oxime compound for producing an oxime ester compound of the formula (c4) is suitably a compound represented by the following formula (c5).

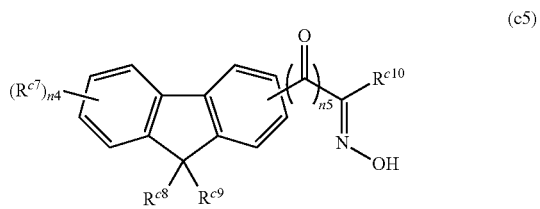

(c5)

$R^{c7}$, $R^{c8}$, $R^{c9}$, $R^{c10}$, n4, and n5 are the same as defined in the formula (c4).

In the formula (c4) and (c5), $R^{c7}$ is a hydrogen atom, a nitro group, or a monovalent organic group. $R^{c7}$ is bonded to a 6-membered aromatic ring which is different from the 6-membered aromatic ring bonded to a group represented as —(CO)$_{n5}$— on a fluorene ring in the formula (c4). In the formula (c4), the bond position of R$^{c7}$ to a fluorene ring is not particularly limited. When a compound represented by the formula (c4) has 1 or more R$^{c7}$(s), one of the one or more R$^{c7}$(s) is preferably bonded at the 2-position in the fluorene ring since the synthesis of the compound represented by the formula (b4) becomes easy. When plural R$^{c7}$s exist, the plural R$^{c7}$s may be the same or different.

When R$^{c7}$ is an organic group, R$^{c7}$ is not particularly limited as long as it does not interfere with the object of the present invention, and is appropriately selected from various organic groups. When R$^{c7}$ is an organic group, suitable examples include an alkyl group, an alkoxy group, a cycloalkyl group, a cycloalkoxy group, a saturated aliphatic acyl group, a saturated aliphatic acyloxy group, an alkoxycarbonyl group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an optionally substituted heterocyclylcarbonyl group, an amino group substituted with one or two organic groups, a morpholin-1-yl group, and a piperazin-1-yl group.

When R$^{c7}$ is an alkyl group, the number of carbon atoms of the alkyl group is preferably 1 or more and 20 or less, and more preferably 1 or more and 6 or less. When R$^{c7}$ is an alkyl group, the alkyl group may be either one of a straight chain or branched chain alkyl group. When R$^{c7}$ is an alkyl group, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. When R$^{c7}$ is an alkyl group, the alkyl group may contain an ether bond (—O—) in the carbon chain. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group, and the like.

When R$^{c7}$ is an alkoxy group, the number of carbon atoms of the alkoxy group is preferably 1 or more and 20 or less, and more preferably 1 or more and 6 or less. When R$^{c7}$ is an alkoxy group, the alkoxy group may be a straight-chain or branched-chain group. When R$^{c7}$ is an alkoxy group, specific examples thereof include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, and an isodecyloxy group. When R$^{c7}$ is an alkoxy group, the alkoxy group may contain an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, and a methoxypropyloxy group.

When R$^{c7}$ is a cycloalkyl group or a cycloalkoxy group, the number of carbon atoms of the cycloalkyl group or cycloalkoxy group is preferably 3 or more and 10 or less, and more preferably 3 or more and 6 or less. When R$^{c7}$ is a cycloalkyl group, specific examples thereof include a cyclopropyl group, a cyclobutyl group, a cyclopentyl group, a cyclohexyl group, a cycloheptyl group, and a cyclooctyl group. When R$^{c7}$ is a cycloalkoxy group, specific examples thereof include a cyclopropyloxy group, a cyclobutyloxy group, a cyclopentyloxy group, a cyclohexyloxy group, a cycloheptyloxy group, and a cyclooctyloxy group.

When R$^{c7}$ is a saturated aliphatic acyl group or a saturated aliphatic acyloxy group, the number of carbon atoms of the saturated aliphatic acyl group or saturated aliphatic acyloxy group is preferably 2 or more and 21 or less, and more preferably 2 or more and 7 or less. When R$^{c7}$ is a saturated aliphatic acyl group, specific examples thereof include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, and an n-hexadecanoyl group. When R$^{c7}$ is a saturated aliphatic acyloxy group, specific examples thereof include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, and an n-hexadecanoyloxy group.

When R$^{c7}$ is an alkoxycarbonyl group, the number of carbon atoms of the alkoxycarbonyl group is preferably 2 or more and 20 or less, and preferably 2 or more and 7 or less. When R$^{c7}$ is an alkoxycarbonyl group, specific examples thereof include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, and an isodecyloxycarbonyl group.

When R$^{c7}$ is a phenylalkyl group, the number of carbon atoms of the phenylalkyl group is preferably 7 or more and 20 or less, and more preferably 7 or more and 10 or less. When R$^{c7}$ is a naphthylalkyl group, the number of carbon atoms of the naphthylalkyl group is preferably 11 or more and 20 or less, and more preferably 11 or more and 14 or less. When R$^{c7}$ is a phenylalkyl group, specific examples thereof include a benzyl group, a 2-phenylethyl group, a 3-phenylpropyl group, and a 4-phenylbutyl group. When R$^{c7}$ is a naphthylalkyl group, specific examples thereof include an α-naphthylmethyl group, a β-naphthylmethyl group, a 2-(α-naphthyl)ethyl group, and a 2-(β-naphthyl)ethyl group.

When $R^{c7}$ is a phenylalkyl group or a naphthylalkyl group, $R^{c7}$ may further have a substituent on a phenyl group or a naphthyl group.

When $R^{c7}$ is a heterocyclyl group, the heterocyclyl group is a 5- or 6-membered single ring containing one or more N, S, and O, or a heterocyclyl group in which single rings are fused each other, or a single ring is fused with a benzene ring. When the heterocyclyl group is a fused ring, the number of fused ring is 3 or less. The heterocyclyl group may be any one of an aromatic group (heteroaryl group) and a non-aromatic group. Examples of the heterocycle constituting the heterocyclyl group include furan, thiophene, pyrrole, oxazole, isoxazole, triazole, thiadiazole, isothiazole, imidazole, pyrazole, triazole, pyridine, pyrazine, pyrimidine, pyridazine, benzofuran, benzothiophene, indole, isoindole, indolizine, benzoimidazole, benzotriazole, benzoxazole, benzothiazole, carbazole, purine, quinoline, isoquinoline, quinazoline, phthalazine, cinnoline, quinoxaline, piperidine, piperazine, morpholine, piperidine, tetrahydropyran, and tetrahydrofuran. When $R^{c7}$ is a heterocyclyl group, the heterocyclyl group may further have a substituent.

When $R^{c7}$ is a heterocyclylcarbonyl group, a heterocyclyl group included in the heterocyclylcarbonyl group is the same as that in the case where $R^{c7}$ is a heterocyclyl group.

When $R^{c7}$ is an amino group substituted with one or two organic group(s), suitable examples of the organic group(s) include an alkyl group having 1 or more and 20 or less carbon atoms, a cycloalkyl group having 3 or more and 10 or less carbon atoms, a saturated aliphatic acyl group having 2 or more and 21 or less carbon atoms, an optionally substituted phenyl group, an optionally substituted benzoyl group, an optionally substituted phenylalkyl group having 7 or more and 20 or less carbon atoms, an optionally substituted naphthyl group, an optionally substituted naphthoyl group, an optionally substituted naphthylalkyl group having 11 or more 20 or less carbon atoms, and a heterocyclyl group. The specific examples of these suitable organic groups are the same as those of $R^{c7}$. Specific examples of the amino group substituted with one or two organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoylamino group, an n-hexanoylamino group, an n-heptanoylamino group, an n-octanoylamino group, an n-decanoylamino group, an benzoylamino group, an α-naphthoylamino group, and a β-naphthoylamino group.

When the phenyl group, the naphthyl group, and the heterocyclyl group included in $R^{c7}$ further have a substituent, examples thereof include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group having an alkyl group which has 1 or more and 6 or less carbon atoms, a dialkylamino group having an alkyl group which has 1 or more and 6 or less carbon atoms, a morpholin-1-yl group, a piperazin-1-yl group, halogen, a nitro group, and a cyano group. When a phenyl group, a naphthyl group, and a heterocyclyl group included in $R^{c7}$ further have substituents, the number of substituents is not particularly limited as long as it does not interfere with the object of the present invention, but is preferably 1 or more 4 or less. When a phenyl group, a naphthyl group, and a heterocyclyl group included in $R^{c7}$ have plural substituents, the plural substituents may be the same or different.

Among the above-described groups, $R^{c7}$ is preferably a nitro group or a group represented as $R^{c12}$—CO— since the sensitivity tends to be improved. $R^{c12}$ is not particularly limited as long as it does not interfere with the object of the present invention, and can be selected from various organic groups. Examples of the group suitable as $R^{c12}$ include an alkyl group having 1 or more and 20 or less carbon atoms, an optionally substituted phenyl group, an optionally substituted naphthyl group, and an optionally substituted heterocyclyl group. Among these groups, $R^{c12}$ is particularly preferably a 2-methylphenyl group, a thiophen-2-yl group, and an α-naphthyl group. Moreover, it is preferred that $R^{c7}$ is a hydrogen atom since the transparency tends to be satisfactory. When $R^{c7}$ is a hydrogen atom and $R^{c10}$ is a group represented by the formula (c4a) or (c4b) mentioned later, the transparency tends to be even more satisfactory.

In the formula (c4), $R^{c8}$ and $R^{c9}$ each represent an optionally substituted chain alkyl group, an optionally substituted cyclic organic group, or a hydrogen atom. $R^{c8}$ and $R^{c9}$ may be bonded to one another to form a ring. Among these, preferably, $R^{c8}$ and $R^{c9}$ are optionally substituted chain alkyl groups. When $R^{c8}$ and $R^{c9}$ are optionally substituted chain alkyl groups, a chain alkyl group may be either a straight-chain alkyl group or a branched-chain alkyl group.

When $R^{c8}$ and $R^{c9}$ are chain alkyl groups having no substituent, the number of carbon atoms of the chain alkyl group is preferably 1 or more and 20 or less, more preferably 1 or more and 10 or less, and particularly preferably 1 or more and 6 or less. When $R^{c8}$ and $R^{c9}$ are chain alkyl groups, specific examples thereof include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, and an isodecyl group. When $R^{c8}$ and $R^{c9}$ are alkyl groups, the alkyl group may have an ether bond (—O—) in a carbon chain. Examples of the alkyl group having an ether bond in a carbon chain include a methoxyethyl group, an ethoxyethyl group, a methoxyethoxyethyl group, an ethoxyethoxyethyl group, a propyloxyethoxyethyl group, and a methoxypropyl group.

When $R^{c8}$ and $R^{c9}$ are chain alkyl groups having a substituent, the number of carbon atoms of the chain alkyl group is preferably 1 or more and 20 or less, more preferably 1 or more and 10 or less, and particularly preferably 1 or more and 6 or less. In this case, the number of carbon atoms of the substituent is not included in the number of carbon atoms of the chain alkyl group. The chain alkyl group having a substituent is preferably a straight-chain group. The substituent, with which the alkyl group is optionally substituted, is not particularly limited as long as it does not interfere with the object of the present invention. Suitable examples of the substituent include a cyano group, a halogen atom, a cyclic organic group, and an alkoxycarbonyl group. Examples of the halogen atom include a fluorine atom, a chlorine atom, a bromine atom, and an iodine atom. Among these, a fluorine atom, a chlorine atom, and a bromine atom are preferred. Examples of the cyclic organic group include a cycloalkyl group, an aromatic hydrocarbon group, and a heterocyclyl group. Specific examples of the cycloalkyl group are the same as suitable examples in case $R^{c7}$ is a cycloalkyl group. Specific examples of the aromatic hydrocarbon group include a phenyl group, a naphthyl group, a biphenylyl group, an anthryl group, and a phenanthryl group. Specific examples of the heterocyclyl group are the same as suitable examples in case $R^{c7}$ is a heterocyclyl group. When $R^{c7}$ is an alkoxycarbonyl group, an alkoxy group included in the alkoxycarbonyl group may be either a straight-chain or branched-chain group, and preferably a straight-chain group. The number of carbon atoms of an alkoxy group included in the alkoxycarbonyl group is preferably 1 or more and 10 or less, and more preferably 1 or more and 6 or less.

When the chain alkyl group has a substituent, the number of substituents is not particularly limited. The number of substituents preferably varies depending on the number of carbon atoms of the chain alkyl group. The number of substituents is typically 1 or more and 20 or less, preferably 1 or more and 10 or less, and more preferably 1 or more and 6 or less.

When $R^{c8}$ and $R^{c9}$ are cyclic organic groups, the cyclic organic group may be either an alicyclic group or an aromatic group. Examples of the cyclic organic group include an aliphatic cyclic hydrocarbon group, an aromatic hydrocarbon group, and a heterocyclyl group. When $R^{c8}$ and $R^{c9}$ are cyclic organic groups, the substituent, with which the cyclic organic group is optionally substituted, is the same as in case $R^{c8}$ and $R^{c9}$ are chain alkyl groups.

When $R^{c8}$ and $R^{c9}$ are aromatic hydrocarbon groups, the aromatic hydrocarbon group is preferably a phenyl group, or a group formed by bonding plural benzene rings through a carbon-carbon bond, or a group formed by condensing plural benzene rings. When the aromatic hydrocarbon group is a phenyl group, or a group formed by bonding or condensing plural benzene rings, the number of rings of a benzene ring included in the aromatic hydrocarbon group is not particularly limited, and is preferably 3 or less, more preferably 2 or less, and particularly preferably 1. Preferred specific examples of the aromatic hydrocarbon group include a phenyl group, a naphthyl group, a biphenylyl group, an anthryl group, and a phenanthryl group.

When $R^{c8}$ and $R^{c9}$ are aliphatic cyclic hydrocarbon groups, the aliphatic cyclic hydrocarbon group may be either a monocyclic or polycyclic group. The number of carbon atoms of the aliphatic cyclic hydrocarbon group is not particularly limited, and is preferably 3 or more 20 or less, and more preferably 3 or more and 10 or less. Examples of the monocyclic cyclic hydrocarbon group include cyclopropyl group, a cyclobutyl group, a cyclopentyl group, a cyclohexyl group, a cycloheptyl group, a cyclooctyl group, a norbornyl group, a isobornyl group, a tricyclononyl group, a tricyclodecyl group, a tetracyclododecyl group, and an adamantyl group.

When $R^{c8}$ and $R^{c9}$ are heterocyclyl groups, the heterocyclyl group is a 5-membered or 6-membered monocycle containing one or more N, S, and O, or a heterocyclyl group in which these monocycles are condensed, or the monocycle and a benzene ring are condensed. When the heterocyclyl group is a condensation ring, the number of rings is 3 or less. The heterocyclyl group may be either an aromatic group (heteroaryl group) or a non-aromatic group. Examples of the heterocycle constituting the heterocyclyl group include furan, thiophene, pyrrole, oxazole, isoxazole, triazole, thiadiazole, isothiazole, imidazole, pyrazole, triazole, pyridine, pyrazine, pyrimidine, pyridazine, benzofuran, benzothiophene, indole, isoindole, indolizine, benzoimidazole, benzotriazole, benzoxazole, benzothiazole, carbazole, purine, quinoline, isoquinoline, quinazoline, phthalazine, cinnoline, quinoxaline, piperidine, piperazine, morpholine, piperidine, tetrahydropyran, and tetrahydrofuran.

$R^{c8}$ and $R^{c9}$ may be bonded to one another to form a ring. The group composed of the ring formed by $R^{c8}$ and $R^{c9}$ is preferably a cycloalkylidene group. When $R^{c8}$ and $R^{c9}$ are bonded to form a cycloalkylidene group, the ring constituting the cycloalkylidene group is preferably a 5- to 6-membered ring, and more preferably a 5-membered ring.

When the group formed by bonding $R^{c8}$ and $R^{c9}$ is a cycloalkylidene group, the cycloalkylidene group may be fused with one or more other rings. Examples of the ring which may be fused with the cycloalkylidene group include a benzene ring, a naphthalene ring, a cyclobutane ring, a cyclopentane ring, a cyclohexane ring, a cycloheptane ring, a cyclooctane ring, a furan ring, a thiophene ring, a pyrrole ring, a pyridine ring, a pyrazine ring, a pyrimidine ring, and the like.

Examples of suitable group among $R^{c8}$ and $R^{c9}$ descried above include a group represented by the formula: -$A^1$-$A^2$. In the formula, $A^1$ is a straight chain alkylene group, and $A^2$ is an alkoxy group, a cyano group, a halogen atom, a halogenated alkyl group, a cyclic organic group, or an alkoxycarbonyl group.

The number of carbon atoms of the straight chain alkylene group for $A^1$ is preferably 1 or more and 10 or less, and more preferably 1 or more and 6 or less. When $A^2$ is an alkoxy group, the alkoxy group may be any one of straight chain and branched chain alkoxy groups, and preferably a straight chain alkoxy group. The number of carbon atoms of the alkoxy group is preferably 1 or more and 10 or less, and more preferably 1 or more and 6 or less. When $A^2$ is a halogen atom, a fluorine atom, a chlorine atom, a bromine atom, or an iodine atom is preferred, and a fluorine atom, a chlorine atom, or a bromine atom is more preferred. When $A^2$ is a halogenated alkyl group, a halogen atom included in the halogenated alkyl group is preferably a fluorine atom, a chlorine atom, a bromine atom, or an iodine atom, and more preferably is a fluorine atom, a chlorine atom, or a bromine atom. The halogenated alkyl group may be any one of straight chain and branched chain halogenated alkyl groups, and preferably a straight chain halogenated alkyl group. When $A^2$ is a cyclic organic group, examples of the cyclic organic group are the same as the cyclic organic group possessed by $R^{c8}$ and $R^{c9}$ as the substituent. When $A^2$ is an alkoxycarbonyl group, examples of the alkoxycarbonyl group are the same as the alkoxycarbonyl group possessed by $R^{c8}$ and $R^{c9}$ as the substituent.

Suitable specific examples of $R^{c8}$ and $R^{c9}$ include alkyl groups such as an ethyl group, an n-propyl group, an n-butyl group, an n-hexyl group, an n-heptyl group, and an n-octyl group; alkoxyalkyl groups such as a 2-methoxyethyl group, a 3-methoxy-n-propyl group, a 4 methoxy-n-butyl group, a 5-methoxy-n-pentyl group, a 6-methoxy-n-hexyl group, a 7-methoxy-n-heptyl group, a 8-methoxy-n-octyl group, 2-ethoxyethyl group, a 3-ethoxy-n-propyl group, a 4-ethoxy-n-butyl group, a 5-ethoxy-n-pentyl group, a 6-ethoxy-n-hexyl group, a 7 ethoxy-n-heptyl group, and a 8-ethoxy-n-octyl group; cyanoalkyl groups such as a 2-cyanoethyl group, a 3-cyano-n-propyl group, a 4-cyano-n-butyl group, a 5-cyano-n-pentyl group, a 6-cyano-n-hexyl group, a 7 cyano-n-heptyl group, and a 8-cyano-n-octyl group; phenylalkyl groups such as a 2-phenylethyl group, a 3-phenyl-n-propyl group, a 4-phenyl-n-butyl group, a 5-phenyl-n-pentyl group, a 6-phenyl-n-hexyl group, a 7-phenyl-n-heptyl group, and a 8-phenyl-n-octyl group; cycloalkylalkyl groups such as a 2-cyclohexylethyl group, a 3-cyclohexyl-n-propyl group, a 4-cyclohexyl-n-butyl group, a 5-cyclohexyl-n-pentyl group, a 6-cyclohexyl-n-hexyl group, a 7-cyclohexyl-n-heptyl group, a 8-cyclohexyl-n-octyl group, a 2-cyclopentylethyl group, a 3-cyclopentyl-n-propyl group, a 4-cyclopentyl-n-butyl group, a 5-cyclopentyl-n-pentyl group, a 6-cyclopentyl-n-hexyl group, a 7-cyclopentyl-n-heptyl group, and a 8-cyclopentyl-n-octyl group; alkoxycarbonylalkyl groups such as a 2-methoxycarbonylethyl group, a 3-methoxycarbonyl-n-propyl group, a 4-methoxycarbonyl-n-butyl group, a 5-methoxycarbonyl-n-pentyl group, a 6-methoxycarbonyl-n-hexyl group, a 7-methoxycarbonyl-n-heptyl group, a 8-methoxycarbonyl-n-octyl group, a 2-ethoxycarbonylethyl group, a 3-ethoxycarbonyl-n-propyl group, a 4-ethoxycarbonyl-n-butyl group, a 5-ethoxycarbonyl-n-pentyl group, a 6-ethoxycarbonyl-n-hexyl group, a 7-ethoxycarbonyl-n-heptyl group, and a 8-ethoxycarbonyl-n-octyl group; and halogenated alkyl groups such as a 2-chloroethyl group, a 3-chloro-n-propyl group, a 4-chloro-n-butyl group, a 5-chloro-n-pentyl group, a 6-chloro-n-hexyl group, a 7-chloro-n-heptyl group, a 8-chloro-n-octyl group, a 2-bromoethyl group, a 3-bromo-n-propyl group, a 4-bromo-n-butyl group, a 5-bromo-n-pentyl group, a 6-bromo-n-hexyl group, a 7-bromo-n-heptyl group, a 8-bromo-n-octyl group, a 3,3,3-trifluoropropyl group, and a 3,3,4,4,5,5,5-heptafluoro-n-pentyl group.

Among groups mentioned above, groups suitable as $R^{c8}$ and $R^{c9}$ are an ethyl group, an n-propyl group, an n-butyl group, an n-pentyl group, a 2-methoxyethyl group, a 2-cyanoethyl group, a 2-phenylethyl group, a 2-cyclohexylethyl group, a 2-methoxycarbonylethyl group, a 2-chloroethyl group, a 2-bromoethyl group, a 3,3,3-trifluoropropyl group, and a 3,3,4,4,5,5,5-heptafluoro-n-pentyl group.

In the same manner as $R^{c7}$, examples of suitable organic group for $R^{c10}$ include an alkyl group, an alkoxy group, a cycloalkyl group, a cycloalkoxy group, a saturated aliphatic acyl group, an alkoxycarbonyl group, a saturated aliphatic acyloxy group, a phenyl group which may have a substituent, a phenoxy group which may have a substituent, a benzoyl group which may have a substituent, a phenoxycarbonyl group which may have a substituent, a benzoyloxy group which may have a substituent, a phenylalkyl group which may have a substituent, a naphthyl group which may have a substituent, a naphthoxy group which may have a substituent, a naphthoyl group which may have a substituent, a naphthoxycarbonyl group which may have a substituent, a naphthoyloxy group which may have a substituent, a naphthylalkyl group which may have a substituent, a heterocyclyl group which may have a substituent, a heterocyclylcarbonyl group which may have a substituent, an amino group substituted with one or two organic groups, a morpholin-1-yl group, a piperazin-1-yl group, and the like. Specific examples of these groups are the same as those described for $R^{c7}$. $R^{c10}$ is also preferably a cycloalkylalkyl group, a phenoxyalkyl group which may have a substituent on an aromatic ring, and a phenylthioalkyl group which may have a substituent on an aromatic ring. The substituent which may be possessed by a phenoxyalkyl group and phenylthioalkyl group is the same as the substituent which may be possessed by a phenyl group included in $R^{c7}$.

Among organic groups, $R^{c10}$ is preferably an alkyl group, a cycloalkyl group, a phenyl group which may have a substituent or cycloalkylalkyl group, or a phenylthioalkyl group which may have a substituent on an aromatic ring. The alkyl group is preferably an alkyl group having 1 or more and 20 or less carbon atoms, more preferably, an alkyl group having 1 or more and 8 or less carbon atoms, particularly preferably, an alkyl group having 1 or more and 4 or less carbon atoms, and most preferably a methyl group. Among phenyl groups which may have a substituent, a methylphenyl group is preferred and a 2-methylphenyl group is more preferred. The number of carbon atoms of the cycloalkyl group included in the cycloalkylalkyl group is preferably 5 or more and 10 or less, more preferably 5 or more and 8 or less, and particularly preferably 5 or 6. The number of carbon atoms of the alkylene group included in the cycloalkylalkyl group is preferably 1 or more and 8 or less, more preferably 1 or more and 4 or less, and particularly preferably 2. Among cycloalkylalkyl groups, a cyclopentylethyl group is preferred. The number of carbon atoms of the alkylene group which may have a substituent on an aromatic ring included in the phenylthioalkyl group, is preferably 1 or more and 8 or less, more preferably 1 or more and 4 or less, and particularly preferably 2. Among the phenylthioalkyl group which may have a substituent on an aromatic ring, a 2-(4-chlorophenylthio)ethyl group is preferred.

$R^{c10}$ is also preferably a group represented by -A$^3$-CO—O-A$^4$. A$^3$ is a divalent organic group, preferably a divalent hydrocarbon group, and more preferably an alkylene group. A$^4$ is a monovalent organic group, and preferably a monovalent hydrocarbon group.

When A$^3$ is an alkylene group, alkylene group may be any one of straight chain and branched chain alkylene groups, and preferably a straight chain alkylene group. When A$^3$ is an alkylene group, the number of carbon atoms of the alkylene group is preferably 1 or more and 10 or less, more preferably 1 or more and 6 or less, and particularly preferably 1 or more and 4 or less.

Suitable examples of A$^4$ include an alkyl group having 1 or more and 10 or less carbon atoms, an aralkyl group having 7 or more and 20 or less carbon atoms, and an aromatic hydrocarbon group having 6 or more and 20 or less carbon atoms. Suitable specific examples of A$^4$ include a methyl group, an ethyl group, an n-propyl group, an isopropyl group, an n-butyl group, an isobutyl group, a sec-butyl group, an tert-butyl group, an n-pentyl group, an n-hexyl group, a phenyl group, a naphthyl group, a benzyl group, a phenethyl group, an α-naphthylmethyl group, a β-naphthylmethyl group, and the like.

Suitable specific examples of the group represented by -A$^3$-CO—O-A$^4$ include a 2-methoxycarbonylethyl group, a 2-ethoxycarbonylethyl group, a 2-n-propyloxycarbonylethyl group, a 2-n-butyloxycarbonylethyl group, a 2-n-pentyloxycarbonylethyl group, a 2-n-hexyloxycarbonylethyl group, a 2-benzyloxycarbonylethyl group, a 2-phenoxycarbonylethyl group, a 3-methoxycarbonyl-n-propyl group, a 3-ethoxycarbonyl-n-propyl group, a 3-n-propyloxycarbonyl-n-propyl group, a 3-n-butyloxycarbonyl-n-propyl group, a 3-n-pentyloxycarbonyl-n-propyl group, a 3-n-hexyloxycarbonyl-n-propyl group, a 3-benzyloxycarbonyl-n-propyl group, a 3-phenoxycarbonyl-n-propyl group, and the like.

While $R^{c10}$ has been described above, $R^{c10}$ is preferably a group represented by the following formula (c4a) or (c4b):

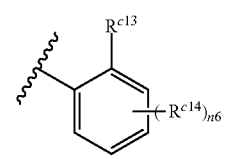

(c4a)

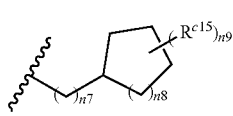
(c4b)

in which, in the formulas (c4a) and (c4b), $R^{c13}$ and $R^{c14}$ each are an organic group, n6 is an integer of 0 or more and 4 or less; when $R^{c13}$ and $R^{c14}$ exist at adjacent positions on a benzene ring, $R^{c13}$ and $R^{c14}$ may be bonded to one another to form a ring; n7 is an integer of 1 or more and 8 or less; n8 is an integer of 1 or more and 5 or less; n9 is an integer of 0 or more and (n8+3) or less; and $R^{c15}$ is an organic group.

Examples of the organic group for $R^{c13}$ and $R^{c14}$ in the formula (c4a) are the same as those in $R^{c7}$. $R^{c13}$ is preferably an alkyl group or a phenyl group. When $R^{c13}$ is an alkyl group, the number of carbon atoms thereof is preferably 1 or more and 10 or less, more preferably 1 or more and 5 or less, preferably 1 or more and 3 or less, and most preferably 1. Namely, $R^{c13}$ is most preferably a methyl group. When $R^{c13}$ and $R^{c14}$ are bonded to form a ring, the ring may be either one of an aromatic ring or an aliphatic ring. Suitable examples of the group represented by the formula (c4a) in which $R^{c13}$ and $R^{c14}$ form a ring include a naphthalen-1-yl group, a 1,2,3,4-tetrahydronaphthalen-5-yl group, and the like. In the above formula (c4a), n6 is an integer of 0 or more and 4 or less, preferably 0 or 1, and more preferably 0.

In the above formula (c4b), $R^{c15}$ is an organic group. Examples of the organic group include the same group as the organic group described for $R^{c7}$. Among the organic groups, an alkyl group is preferred. The alkyl group may be any one of straight chain and branched chain alkyl groups. The number of carbon atoms of the alkyl group is preferably 1 or more and 10 or less, more preferably, 1 or more and 5 or less, and particularly preferably 1 or more and 3 or less. Preferred examples of $R^{c15}$ include a methyl group, an ethyl group, a propyl group, an isopropyl group, a butyl group, and the like. Among these, a methyl group is more preferred.

In the above formula (c4b), n8 is an integer of 1 or more and 5 or less, preferably 1 or more and 3 or less, and more preferably 1 or 2. In the formula (c4b), n9 is 0 or more and (n8+3) or less, preferably an integer of 0 or more and 3 or less, more preferably an integer of 0 or more and 2 or less, and particularly preferably 0. In the formula (c4b), n7 is an integer of 1 or more and 8 or less, preferably an integer of 1 or more and 5 or less, more preferably an integer of 1 or more and 3 or less, and particularly preferably 1 or 2.

In the formula (c4), $R^{c11}$ is a hydrogen atom, an alkyl group having 1 or more and 11 or less carbon atoms which may have a substituent, or an aryl group which may have a substituent. When $R^{c11}$ is an alkyl group, preferred examples of the substituent which may be possessed include a phenyl group, a naphthyl group, or the like. When $R^{c7}$ is an aryl group, preferred examples of the substituent which may be possessed include an alkyl group having 1 or more and 5 or less carbon atoms, an alkoxy group, a halogen atom, or the like.

In the formula (c4), preferred examples of $R^{c11}$ include a hydrogen atom, a methyl group, an ethyl group, an n-propyl group, an isopropyl group, an n-butyl group, a phenyl group, a benzyl group, a methylphenyl group, a naphthyl group, and the like. Among these, a methyl group or a phenyl group is more preferred.

Suitable specific examples of the compound represented by the formula (c4) include the following PI-43 to PI-83.

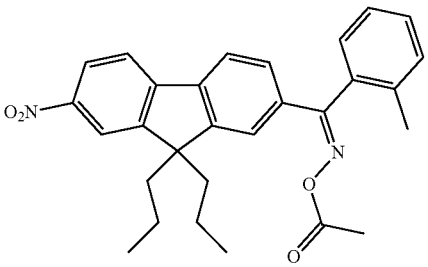
PI-43

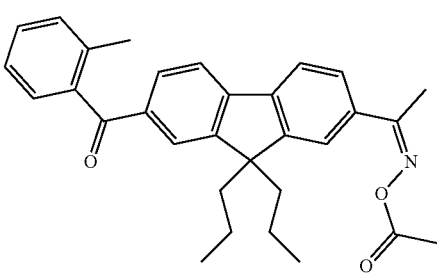
PI-44

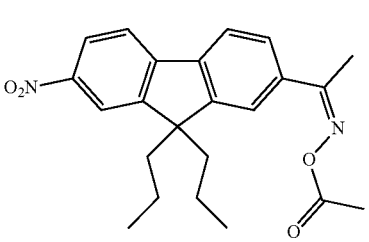
PI-45

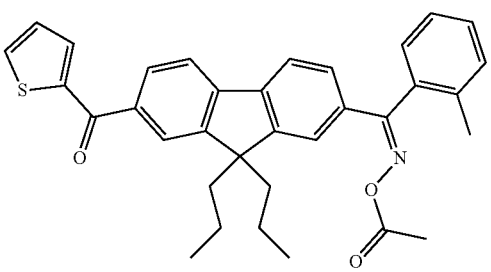
PI-46

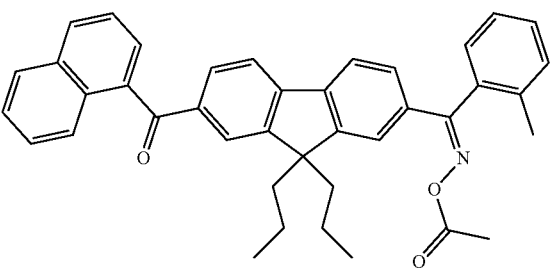
PI-47

PI-48
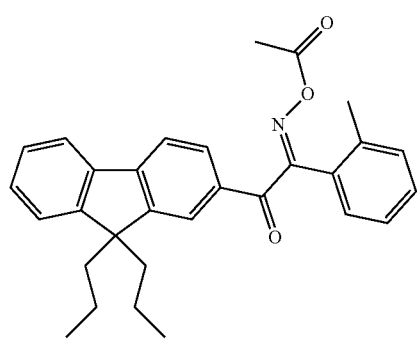
PI-49
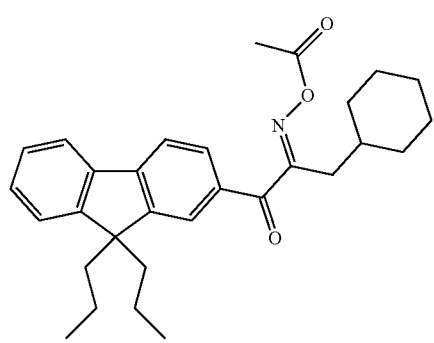
PI-50
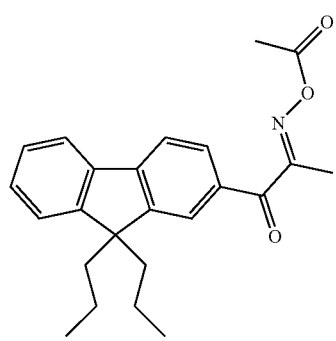
PI-51
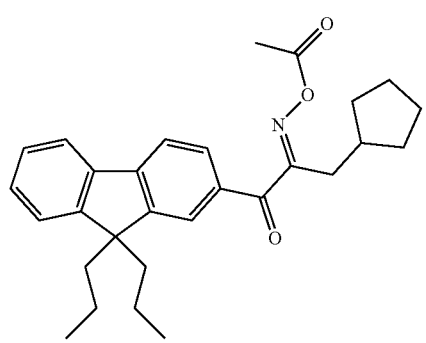
PI-52
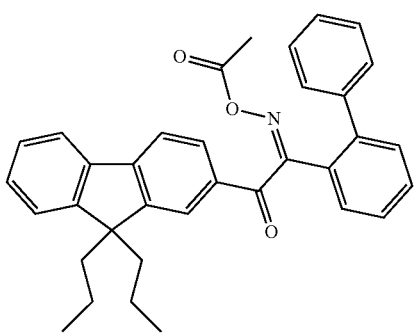
PI-53
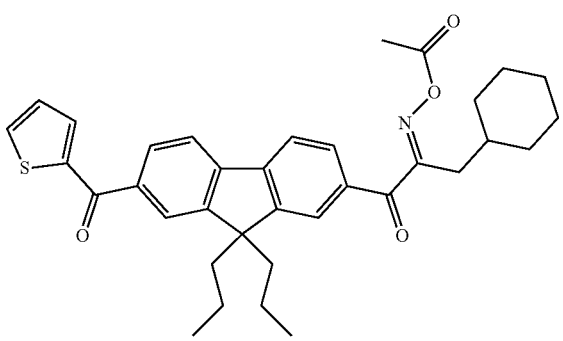
PI-54
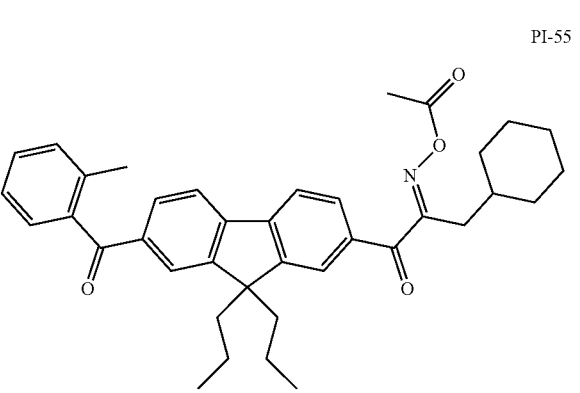
PI-55

-continued
PI-56
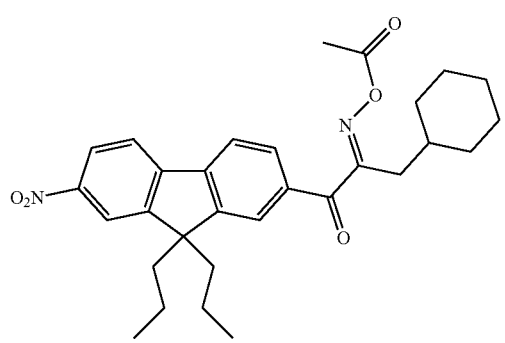
PI-57
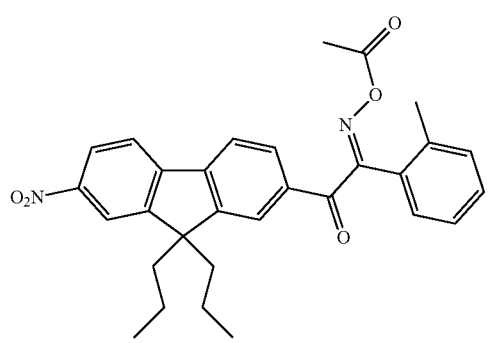
PI-58
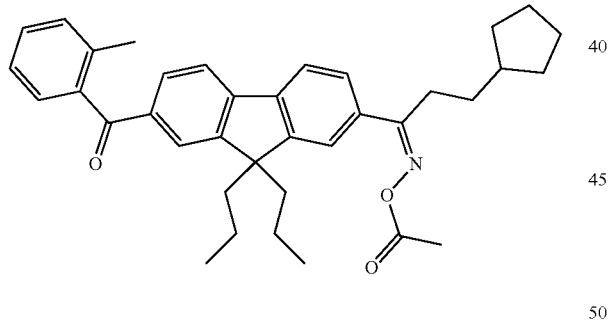
PI-59
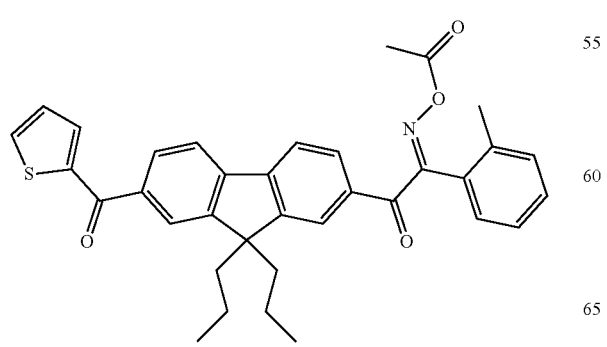
-continued
PI-60
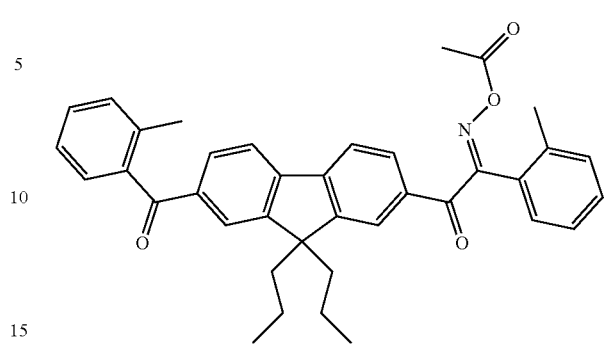
PI-61
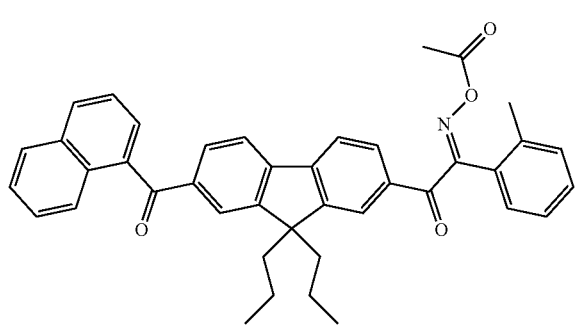
PI-62
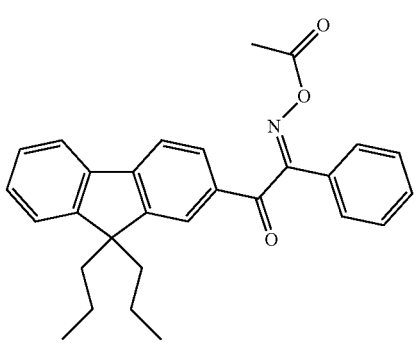
PI-63
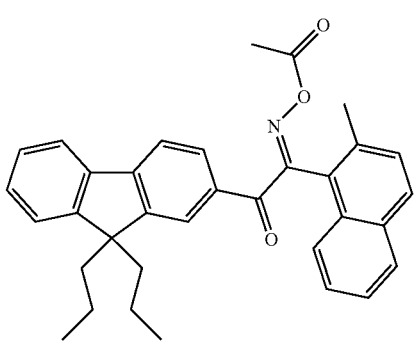

PI-64
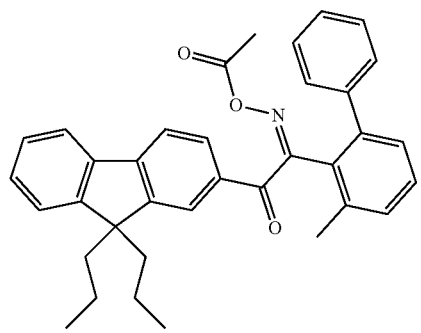
PI-68
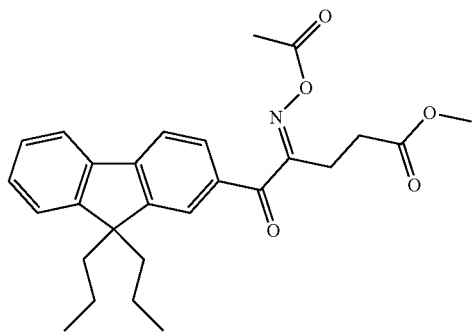
PI-65
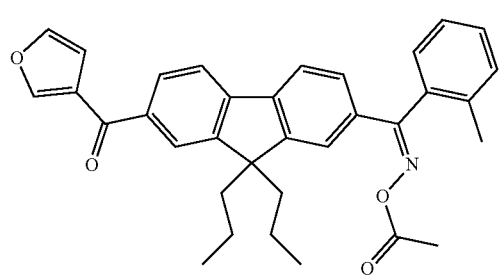
PI-69
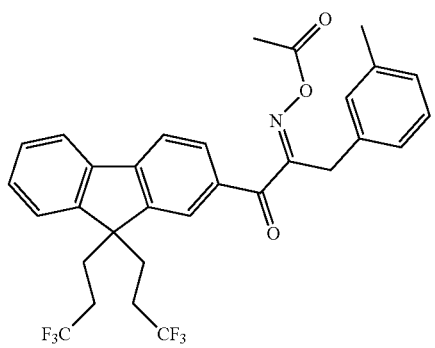
PI-66
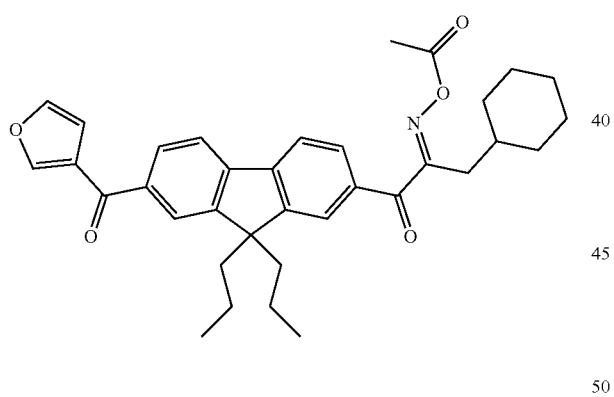
PI70
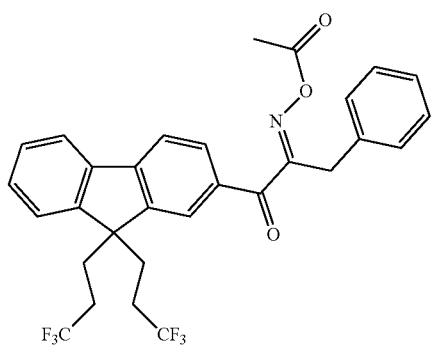
PI-67
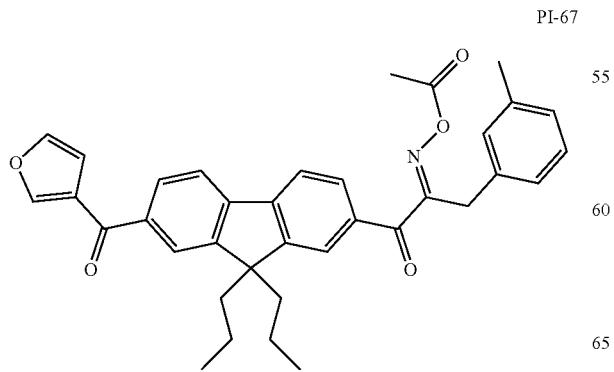
PI-71
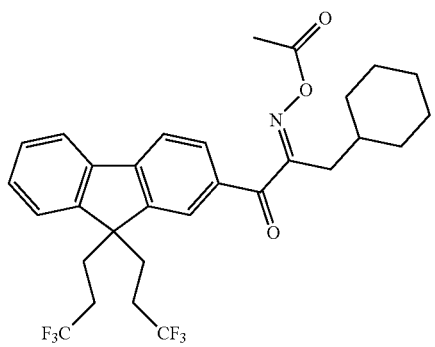

PI-72
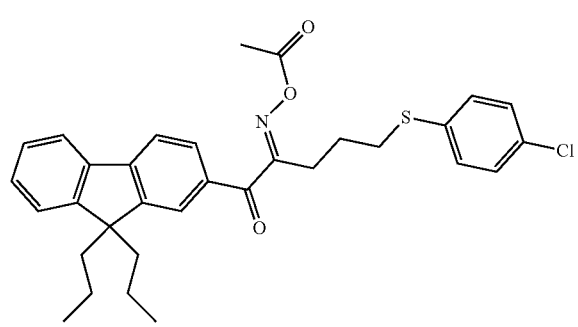
PI-73
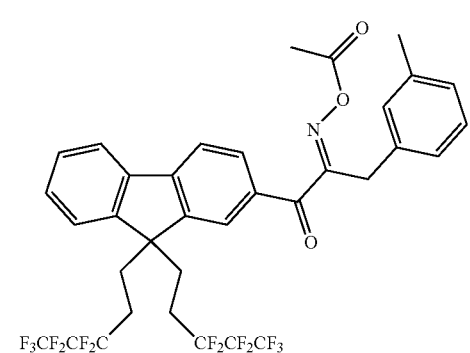
PI-74
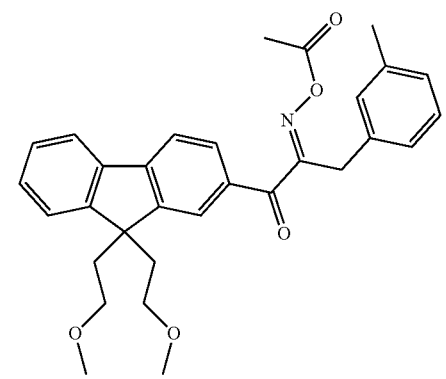
PI-75
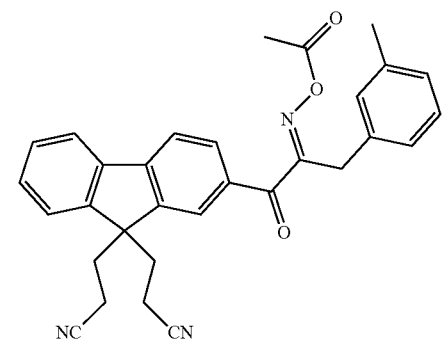
PI-76
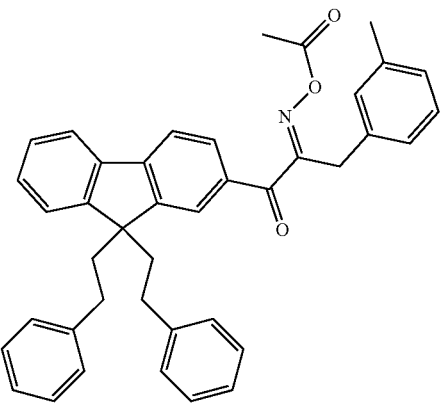
PI-77
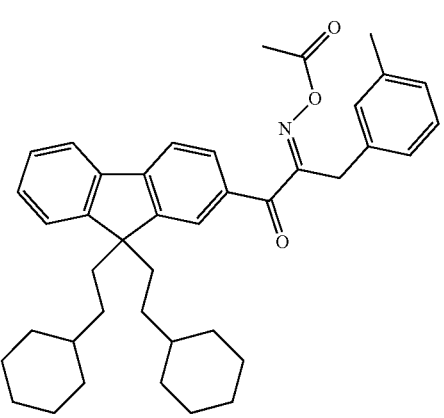
PI-78
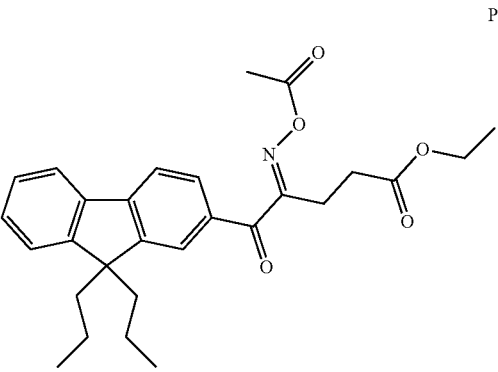
PI-79
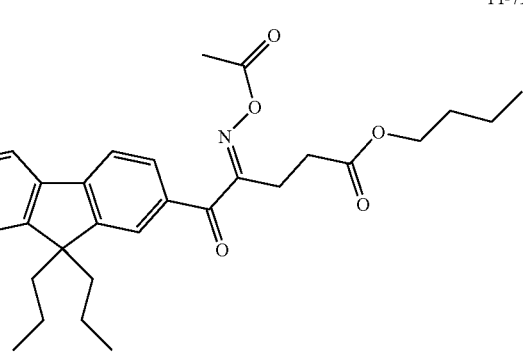

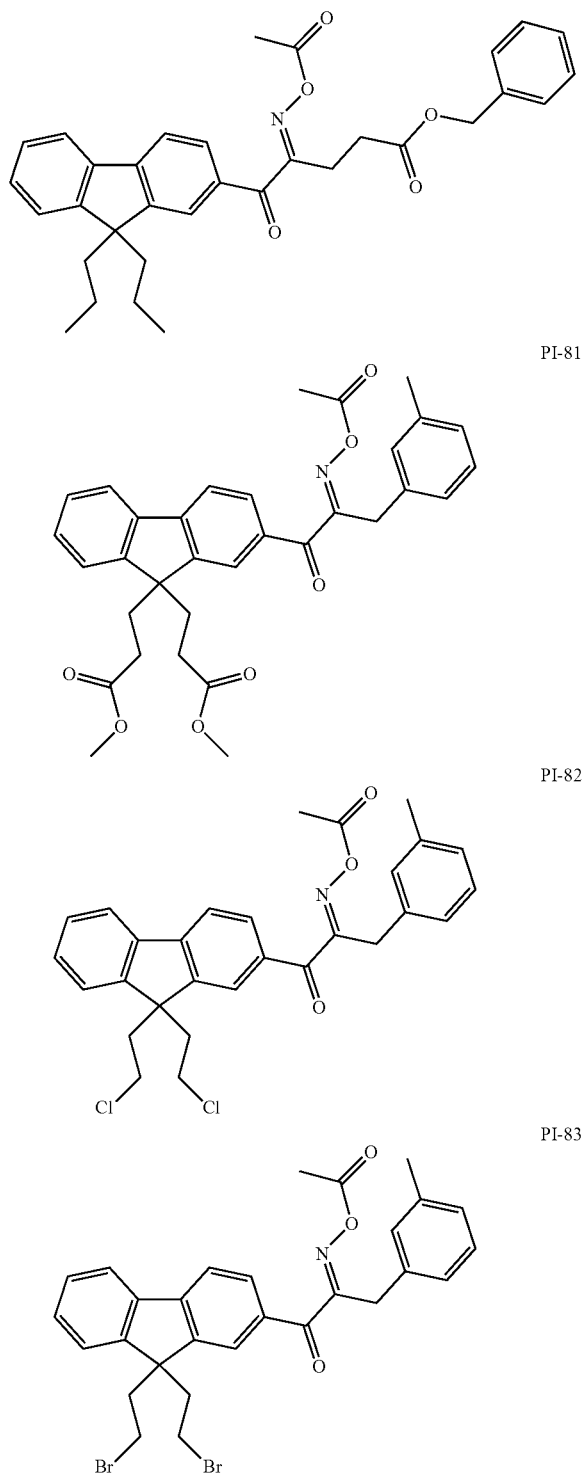

PI-80

PI-81

PI-82

PI-83

The content of the photopolymerization initiator (C) is preferably 0.5% by mass or more and 30% by mass or less, and more preferably 1% by mass or more and 20% by mass or less, based on the mass of the photosensitive resin composition excluding the mass of the below-mentioned organic solvent (S) (the mass of the total solid component). It is possible to obtain a photosensitive resin composition in which defective pattern shapes are less likely to occur by adjusting the content of the photopolymerization initiator (C) in the above range.

The photopolymerization initiator (C) may be used in combination with a photoinitiation auxiliary. Examples of the photoinitiation auxiliary include thiol compounds such as triethanolamine, methyldiethanolamine, N-phenyldiethanolamine, triisopropanolamine, methyl 4-dimethylaminobenzoate, ethyl 4-dimethylaminobenzoate, isoamyl 4-dimethylaminobenzoate, 2-ethylhexyl 4-dimethylaminobenzoate, benzoic acid 2-dimethylaminoethyl, N,N-dimethyl p-toluidine, 4,4'-bis(dimethylamino)benzophenone, 9,10-dimethoxyanthracene, 2-ethyl-9,10-dimethoxyanthracene, 9,10-diethoxyanthracene, 2-ethyl-9,10-diethoxyanthracene, 2-mercaptobenzothiazole, 2-mercaptobenzoxazole, 2-mercaptobenzimidazole, 2-mercapto-5-methoxybenzothiazole, 3-mercaptopropionic acid, methyl 3-mercaptopropionate, pentaerythritol tetramercaptoacetate, and 3-mercaptopropionate. These photoinitiation auxiliaries can be used alone, or two or more photoinitiation auxiliaries can be used in combination.

<Polyfunctional Crosslinkable Compound (D)>

The photosensitive resin composition preferably include a polyfunctional crosslinkable compound (D). The polyfunctional crosslinkable compound (D) is a compound having plural epoxy groups or oxetanyl groups in one molecule. Furthermore, epoxy equivalent or oxetanyl equivalent of the polyfunctional crosslinkable compound (D) is 50 g/eq or more and 350 g/eq or less. In the case where the photosensitive resin composition includes polyfunctional crosslinkable compound having epoxy equivalent or oxetanyl equivalent in such range, when a cured film is formed by using the photosensitive resin composition, it is particularly easy to suppress the generation of a gas from a cured film, since the alkali-soluble resin (A) is densely crosslinked. In addition, since such an effect is more remarkable, epoxy equivalent or oxetanyl equivalent of the polyfunctional crosslinkable compound (D) is more preferably 60 g/eq or more and 320 g/eq or less, further preferably 70 g/eq or more and 300 g/eq or less, and still more preferably 75 g/eq or more and 280 g/eq or less.

In view of crosslinking reactivity when cured film is formed, the polyfunctional crosslinkable compound (D) preferably include an epoxy compound having 2 or more epoxy groups in one molecule, and more preferably include an epoxy compound having 3 or more epoxy groups in one molecule. The content of the epoxy compound having 2 or more epoxy groups in one molecule is preferably 50% by mass or more, more preferably 70% by mass or more, further preferably 80% by mass or more, particularly preferably 90% by mass or more, and the most preferably 100% by mass.

It is possible to use a polyfunctional epoxy compound or a polyfunctional oxetane compound which has conventionally been mixed in various curable compositions as the polyfunctional crosslinkable compound (D) as long as epoxy equivalent or oxetanyl equivalent is within the predetermined range. The molecular weight of the polyfunctional epoxy compound or the polyfunctional oxetane compound included in the polyfunctional crosslinkable compound (D) is not particularly limited as long as it does not interfere with the object of the present invention. The molecular weight of the polyfunctional epoxy compound or the polyfunctional oxetane compound is preferably 5,000 or less, more preferably 4,500 or less, and particularly preferred 4,000 or less, since steric hindrance is small, and molecular chains of the alkali-soluble resin (A) are effectively crosslinked. Lower limit of the molecular weight is not particularly limited, and for example 150 or more.

The polyfunctional crosslinkable compound (D) may be a compound including an aromatic group or a compound including no aromatic group. The polyfunctional crosslinkable compound (D) is preferably the compound including no aromatic group, since it easy to obtain the photosensitive resin composition capable of forming a cured product in which generation of gas is suppressed.

As an example of a suitable polyfunctional crosslinkable compound (D), a polyfunctional alicyclic epoxy compound having alicyclic epoxy groups is exemplified. Specific examples of the alicyclic epoxy compound include 2-(3,4-epoxycyclohexyl-5,5-spiro-3,4-epoxy)cyclohexane-metadioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexane carboxylate, ε-caprolactone-modified 3,4-epoxycyclohexyl-methyl-3',4'-epoxycyclohexane carboxylate, trimethylcaprolactone-modified 3,4-epoxycyclohexylmethyl-3',4'-epoxycyclohexane carboxylate, β-methyl-δ-valerolactone-modified 3,4-epoxycyclohexylmethyl-3',4'-epoxycyclohexane carboxylate, methylenebis(3,4-epoxycyclohexane), di(3,4-epoxycyclohexylmethyl)ether of ethylene glycol, ethylenebis(3,4-epoxycyclohexane carboxylate), a polyfunctional epoxy resin compound having a tricyclodecene oxide group, and a compound represented by the following formulae (d1-1) to (d1-5).

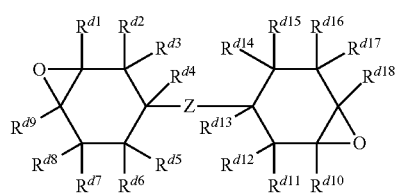

(d1-1)

In the formula (d1-1), Z is a single bond, or a bridging group (divalent group having one or more atoms). $R^{d1}$ to $R^{d18}$ are each independently a group selected from the group consisting of a hydrogen atom, a halogen atom and an organic group.

Example of bridging group Z includes a divalent group selected form the group consisting of a divalent hydrocarbon group, —O—, —O—CO—, —S—, —SO—, —SO$_2$—, —CBr$_2$—, —C(CBr$_3$)$_2$—, —C(CF$_3$)$_2$—, and —R$^{ao19}$—O—CO— or a group formed by bonding plural of these divalent groups.

When the bridging group Z is a divalent hydrocarbon group, example of the hydrocarbon group includes a linear or branched alkylene group having 1 or more and 18 or less carbon atoms, a divalent alicyclic hydrocarbon group, and the like. The linear or branched alkylene group having 1 or more and 18 or less carbon atoms includes, for example, a methylene group, a methylmethylene group, a dimethylmethylene group, a dimethylene group, a trimethylene group, and the like. Above described divalent alicyclic hydrocarbon group includes, for example, a cycloalkylene group (including a cyclohexylidene group) such as a 1,2-cyclopentylene group, a 1,3-cyclopentylene group, a cyclopentylidene group, a 1,2-cyclohexylene group, 1,3-cyclohexylene group, 1,4-cyclohexylene group, and a cyclohexylidene group.

$R^{d19}$ is an alkylene group having 1 or more and 8 or less carbon atoms and preferably a methylene group or an ethylene group.

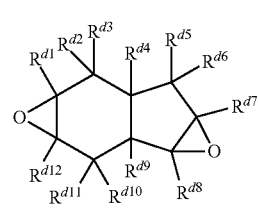

(d1-2)

In the formula (d1-2), $R^{d1}$ to $R^{d12}$ each independently represent a group selected from the group consisting of a hydrogen atom, a halogen atom, and an organic group.

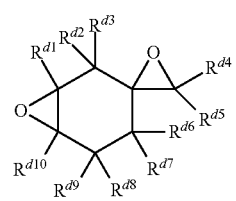

(d1-3)

In the formula (d1-3), $R^{d1}$ to $R^{d10}$ each independently represent a group selected from the group consisting of a hydrogen atom, a halogen atom, and an organic group. $R^{d2}$ and $R^{d8}$ may be combined to each other.

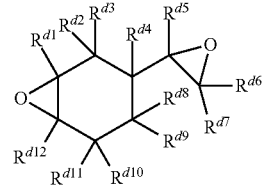

(d1-4)

In the formula (d1-4), $R^{d1}$ to $R^{d12}$ each independently represent a group selected from the group consisting of a hydrogen atom, a halogen atom, and an organic group. $R^{d2}$ and $R^{d10}$ may be combined to each other.

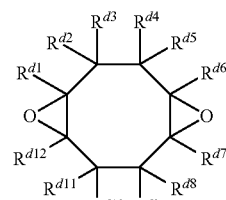

(d1-5)

In the formula (d1-5), $R^{d1}$ to $R^{d12}$ each independently represent a group selected from the group consisting of a hydrogen atom, a halogen atom, and an organic group.

In the formulae (d1-1) to (d1-5), when $R^{d1}$ to $R^{d18}$ are organic groups, the organic group is not particularly limited as long as the object of the present invention is not impaired, and may be a hydrocarbon group, or a group consisting of a carbon atom and a halogen atom, or a group having heteroatoms such as a halogen atom, an oxygen atom, a sulfur atom, a nitrogen atom, and a silicon atom, together with a carbon atom and a hydrogen atom. Examples of the halogen atom include a chlorine atom, a bromine atom, an iodine atom, and a fluorine atom.

The organic group is preferably a group consisting of a hydrocarbon group, a group consisting of a carbon atom, a hydrogen atom, and an oxygen atom; a halogenated hydrocarbon group, a group consisting of a carbon atom, an oxygen atom, and a halogen atom; and a group consisting of a carbon atom, a hydrogen atom, an oxygen atom, and a halogen atom. When the organic group is a hydrocarbon group, the hydrocarbon group may be an aromatic hydrocarbon group, or an aliphatic hydrocarbon group, or a group including an aromatic skeleton and an aliphatic skeleton. The number of carbon atoms of the organic group is preferably 1 or more and 20 or less, more preferably 1 or more and 10 or less, and particularly preferably 1 or more and 5 or less.

Specific examples of the hydrocarbon group include chain alkyl groups such as a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group, an n-decyl group, an n-undecyl group, an n-tridecyl group, an n-tetradecyl group, an n-pentadecyl group, an n-hexadecyl group, an n-heptadecyl group, an n-octadecyl group, an n-nonadecyl group, and an n-icosyl group; chain alkenyl groups such as a vinyl group, a 1-propenyl group, a 2-n-propenyl group(allyl group), a 1-n-butenyl group, a 2-n-butenyl group, and a 3-n-butenyl group; cycloalkyl groups such as a cyclopropyl group, a cyclobutyl group, a cyclopentyl group, a cyclohexyl group, and a cycloheptyl group; aryl groups such as a phenyl group, an o-tolyl group, an m-tolyl group, a p-tolyl group, an α-naphthyl group, a β-naphthyl group, a biphenyl-4-yl group, a biphenyl-3-yl group, a biphenyl-2-yl group, an anthryl group, and a phenanthryl group; and aralkyl groups such as a benzyl group, a phenethyl group, an α-naphthylmethyl group, a β-naphthylmethyl group, an α-naphthylethyl group, and a β-naphthylethyl group.

Specific examples of the halogenated hydrocarbon group include halogenated chain alkyl groups such as a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a 2,2,2-trifluoroethyl group, a pentafluoroethyl group, a heptafluoropropyl group, a perfluorobutyl group, and a perfluoropentyl group, a perfluorohexyl group, a perfluoroheptyl group, a perfluorooctyl group, a perfluorononyl group, and a perfluorodecyl group; halogenated cycloalkyl groups such as a 2-chlorocyclohexyl group, a 3-chlorocyclohexyl group, a 4-chlorocyclohexyl group, a 2,4-dichlorocyclohexyl group, a 2-bromocyclohexyl group, a 3-bromocyclohexyl group, and a 4-bromocyclohexyl group; halogenated aryl groups such as a 2-chlorophenyl group, a 3-chlorophenyl group, a 4-chlorophenyl group, a 2,3-dichlorophenyl group, a 2,4-dichlorophenyl group, a 2,5-dichlorophenyl group, a 2,6-dichlorophenyl group, a 3,4-dichlorophenyl group, a 3,5-dichlorophenyl group, a 2-bromophenyl group, a 3-bromophenyl group, a 4-bromophenyl group, a 2-fluorophenyl group, a 3-fluorophenyl group, and a 4 fluorophenyl group; and halogenated aralkyl groups such as a 2-chlorophenylmethyl group, a 3-chlorophenylmethyl group, a 4-chlorophenylmethyl group, a 2-bromophenylmethyl group, a 3-bromophenylmethyl group, a 4-bromophenylmethyl group, a 2-fluorophenylmethyl group, a 3-fluorophenylmethyl group, and a 4-fluorophenylmethyl group.

Specific examples of the group consisting of a carbon atom, a hydrogen atom, and an oxygen atom include hydroxy chain alkyl groups such as a hydroxymethyl group, a 2-hydroxyethyl group, a 3-hydroxy-n-propyl group, and a 4-hydroxy-n-butyl group; halogenated cycloalkyl groups such as a 2-hydroxycyclohexyl group, a 3-hydroxycyclohexyl group, and a 4-hydroxycyclohexyl group; hydroxyaryl groups such as a 2-hydroxyphenyl group, a 3-hydroxyphenyl group, a 4-hydroxyphenyl group, a 2,3-dihydroxyphenyl group, a 2,4-dihydroxyphenyl group, a 2,5-dihydroxyphenyl group, a 2,6-dihydroxyphenyl group, a 3,4-dihydroxyphenyl group, and a 3,5-dihydroxyphenyl group; hydroxyaralkyl groups such as a 2-hydroxyphenylmethyl group, a 3-hydroxyphenylmethyl group, and a 4-hydroxyphenylmethyl group; chain alkoxy groups such as a methoxy group, an ethoxy group, an n-propoxy group, an isopropoxy group, an n-butyloxy group, an isobutyloxy group, a sec-butyloxy group, a tert-butyloxy group, an n-pentyloxy group, an n-hexyloxy group, an n-heptyloxy group, an n-octyloxy group, a 2-ethylhexyloxy group, an n-nonyloxy group, an n-decyloxy group, an n-undecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group, and an n-icosyloxy group; chain alkenyloxy groups such as a vinyloxy group, a 1-propenyloxy group, a 2-n-propenyloxy group (allyloxy group), a 1-n-butenyloxy group, a 2-n-butenyloxy group, and a 3-n-butenyloxy group; aryloxy groups such as a phenoxy group, an o-tolyloxy group, an m-tolyloxy group, a p-tolyloxy group, an α-naphthyloxy group, a β-naphthyloxy group, a biphenyl-4-yloxy group, a biphenyl-3-yloxy group, a biphenyl-2-yloxy group, an anthryloxy group, and a phenanthryloxy group; aralkyloxy groups such as a benzyloxy group, a phenethyloxy group, an α-naphthylmethyloxy group, a β-naphthylmethyloxy group, an α-naphthylethyloxy group, and a β-naphthylethyloxy group; alkoxyalkyl groups such as a methoxymethyl group, an ethoxymethyl group, an n-propoxymethyl group, a 2-methoxyethyl group, a 2-ethoxyethyl group, a 2-n-propoxyethyl group, a 3-methoxy-n-propyl group, a 3-ethoxy-n-propyl group, a 3-n-propoxy-n-propyl group, a 4-methoxy-n-butyl group, a 4-ethoxy-n-butyl group, and a 4-n-propoxy-n-butyl group; alkoxyalkoxy groups such as a methoxymethoxy group, an ethoxymethoxy group, an n-propoxymethoxy group, a 2-methoxyethoxy group, a 2-ethoxyethoxy group, a 2-n-propoxyethoxy group, a 3-methoxy-n-propoxy group, a 3-ethoxy-n-propoxy group, a 3-n-propoxy-n-propoxy group, a 4-methoxy-n-butyloxy group, a 4-ethoxy-n-butyloxy group, and a 4-n-propoxy-n-butyloxy group; alkoxyaryl groups such as a 2-methoxyphenyl group, a 3-methoxyphenyl group, and a 4-methoxyphenyl group; alkoxyaryloxy groups such as a 2-methoxyphenoxy group, a 3-methoxyphenoxy group, and a 4-methoxyphenoxy group; aliphatic acyl groups such as a formyl group, an acetyl group, a propionyl group, a butanoyl group, a pentanoyl group, a hexanoyl group, a heptanoyl group, an octanoyl group, a nonanoyl group, and a decanoyl group; aromatic acyl groups such as a benzoyl group, an α-naphthoyl group, and a β-naphthoyl group; chain alkyloxycarbonyl groups such as a methoxycarbonyl group, an ethoxycarbonyl group, an n-propoxycarbonyl group, an n-butyloxycarbonyl group, an n-pentyloxycarbonyl group, an n-hexylcarbonyl group, an n-heptyloxycarbonyl group, an n-octyloxycarbonyl group, an n-nonyloxycarbonyl group, and an n-decyloxycarbonyl group; aryloxycarbonyl groups such as a phenoxycarbonyl group, an α-naphthoxycarbonyl group, and a β-naphthoxycarbonyl group; aliphatic acyloxy groups such as a formyloxy group, an acetyloxy group, a propionyloxy group, a butanoyloxy group, a pentanoyloxy group, a hexanoyloxy group, a heptanoyloxy group, an octanoyloxy group, a nonanoyloxy group, and a decanoyloxy group; and aromatic acyloxy groups such as a benzoyloxy group, an α-naphthoyloxy group, and a β-naphthoyloxy group.

$R^{d1}$ to $R^{d18}$ are preferably each independently a group selected from the group consisting of a hydrogen atom, a halogen atom, an alkyl group having 1 or more and 5 or less carbon atoms, and an alkoxy group having 1 or more and 5 or less carbon atoms and, particularly, all $R^{d1}$ to $R^{d18}$ are more preferably hydrogen atoms in view of the fact that a cured film obtained by using a curable composition has excellent mechanical properties.

In the formulae (d1-2) to (d1-5), $R^{d1}$ to $R^{d12}$ are the same as $R^{d1}$ to $R^{d12}$ in the formula (d1-1). In the formula (d1-2) and the formula (d1-4), the divalent group formed when $R^{d2}$ and $R^{d10}$ are combined to each other includes, for example, —CH$_2$— and —C(CH$_3$)$_2$—. In the formula (d1-3), the divalent group formed when $R^{d2}$ and $R^{d8}$ are combined to each other includes, for example, —CH$_2$— and —C(CH$_3$)$_2$—.

Specific examples of a suitable compound for the alicyclic epoxy compounds represented by the formula (d1-1) include alicyclic epoxy compounds represented by the following formulae (d1-1a), (d1-1b) and (d1-1c), 2,2-bis(3,4-epoxy-cyclohexane-1-yl)propane [=2,2-bis(3,4-epoxy-epoxycyclohexyl)propane], and the like.

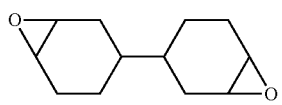
(d1-1a)

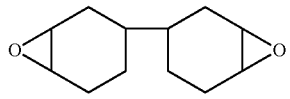
(d1-1b)

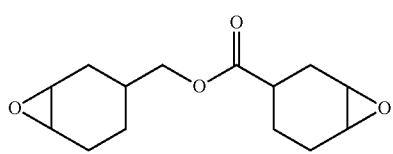
(d1-1c)

Specific examples of suitable compound for the alicyclic epoxy compounds represented by the formula (d1-2) include bicyclononadiene diepoxide represented by the following formula (d1-2a), or dicyclononadiene diepoxide, and the like.

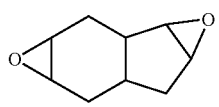
(d1-2a)

Specific examples of suitable compound for the alicyclic epoxy compounds represented by the formula (d1-3) include S-spiro[3-oxatricyclo[3.2.1.0$^{2,4}$]octane-6,2'-oxirane], and the like.

Specific examples of suitable compound for the alicyclic epoxy compounds represented by the formula (d1-4) include 4-vinylcyclohexene dioxide, dipentene dioxide, limonene dioxide, 1-methyl-4-(3-methyloxirane-2-yl)-7-oxabicyclo[4.1.0]heptane, and the like.

Specific examples of suitable compound for the alicyclic epoxy compounds represented by the formula (d1-5) include 1,2,5,6-diepoxycyclooctane, and the like.

Examples of other epoxy compound, which can be used as the polyfunctional crosslinkable compound (D), than above-described alicyclic epoxy compounds include bifunctional epoxy resins such as bisphenol A type epoxy resin, bisphenol F type epoxy resin, bisphenol S type epoxy resin, bisphenol AD type epoxy resin, naphthalene type epoxy resin and biphenyl type epoxy resin; novolak epoxy resins such as phenol novolak type epoxy resin, brominated phenol novolak type epoxy resin, orthocresol novolak type epoxy resin, bisphenol A novolak type epoxy resin, and bisphenol AD novolak type epoxy resin; cyclic aliphatic epoxy resins such as epoxidized product of dicyclopentadiene type phenol resin; aromatic epoxy resins such as epoxidized product of naphthalene type phenol resin; epoxy group-containing fluorene compounds such as 9,9-bis[4-(glycidyloxy)phenyl]-9H-fluorene, 9,9-bis[4-[2-(glycidyloxy)ethoxy]phenyl]-9H-fluorene, 9,9-bis[4-[2-(glycidyloxy)ethyl]phenyl]-9H-fluorene, 9,9-bis[4-(glycidyloxy)-3-methylphenyl]-9H-fluorene, 9,9-bis[4-(glycidyloxy)-3,5-dimethylphenyl]-9H-fluorene, and 9,9-bis(6-glycidyloxynaphthalene-2-yl)-9H-fluorene; glycidylester type epoxy resin such as dimer acid glycidylester, and triglycidylester; glycidyl amine type epoxy resins such as tetraglycidylamino diphenylmethane, triglycidyl-p-aminophenol, tetraglycidyl metaxylylenediamine, and tetraglycidyl bisaminomethylcyclohexane; heterocyclic epoxy resins such as triglycidyl isocyanurate; trifunctional epoxy resins such as phloroglucinol triglycidylether, trihydroxybiphenyl triglycidylether, trihydroxymethane triglycidylether, glycerin triglycidylether, 2-[4-(2,3-epoxypropoxy)phenyl]-2-[4-[1,1-bis[4-(2,3-epoxypropoxy)phenyl]ethyl]phenyl]propane, and 1,3-bis[4-[1-[4-(2,3-epoxypropoxy)phenyl]-1-[4-[1-[4-(2,3-epoxypropoxy)phenyl]-1-methylethyl]phenyl]ethyl]phenoxy]-2-propanol; tetrafunctional epoxy resins such as tetrahydroxyphenlethane tetraglycidylether, tetraglycidylbenzophenone, bis resorcinol tetraglycidylether, and tetraglycidoxybiphenyl; and 1,2-epoxy-4-(2-oxyranyl)cyclohexane adduct of 2,2-bis(hydroxymethyl)-1-butanol. The 1,2-epoxy-4-(2-oxiranyl)cyclohexane adduct of 2,2-bis(hydroxymethyl)-1-butanol is commercially available as EHPE-3150 (manufactured by Daicel Corporation).

Examples of the oxetane compound which can be used as the polyfunctional crosslinkable compound (D) include divalent oxetane compounds such ad bis-1-ethyl-3-oxetanylmethylether, and 1,4-bis-3-ethyloxetane-3-ylmethoxymethylbenzene.

In addition, it is possible to use a compound represented by the following formula (d1-6) as the polyfunctional crosslinkable compound (D).

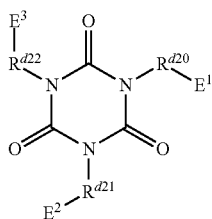

(d1-6)

In the formula (d1-6), $R^{d20}$ to $R^{d22}$ are a linear, branched or cyclic alkylene group, —O—, —C(=O)—, —NH—, and combination thereof. $R^{d20}$ to $R^{d22}$ may be the same or different from each other. Each of $E^1$ to $E^3$ is one selected from the group consisting of an epoxy group, an oxetanyl group, an ethylenically unsaturated group, an alkoxysilyl group, an isocyanate group, a blocked isocyanate group, a thiol group, a carboxy group, a hydroxy group, and a succinic acid anhydride group, or a hydrogen atom. However, each of at least two of $E^1$ to $E^3$ is one selected from the group consisting of an epoxy group and oxetanyl group.

In the formula (d1-6), each of at least two of a group represented by $R^{d20}$ and $E^1$, a group represented by $R^{d21}$ and $E^2$, and a group represented by $R^{d22}$ and $E^3$ is preferably a group represented by the following formula (d1-6a). It is more preferred that all of these groups are groups represented by the following formula (d1-6a). Plural groups represented by the formula (d1-6a) bonding to one compound are preferably the same group. -L-$C^d$ (d1-6a)

In the formula (d1-6a), L is a linear, branched, or cyclic alkylene group, an arylene group, —O—, —C(=O)—, —NH—, or the combination thereof, and $C^d$ is at least one selected from the group consisting of an epoxy group and an oxetanyl group. In the formula (D1-6a), L and $C^d$ may bond to one another to form a ring structure.

In the formula (d1-6a), as a linear, branched, or cyclic alkylene group for L, an alkylene group having 1 or more and 10 or less carbon atoms is preferred. Furthermore, as an arylene group for L, an arylene group having 5 or more and 10 or less carbon atoms is preferred. In the formula (d1-6a), L is preferably a linear alkylene group having 1 or more and 3 or less carbon atoms, a phenylene group, —O—, —C(=O)—, —NH—, or the combination thereof, and more preferably a combination of at least one of a phenylene group, and a linear alkylene group having 1 or more and 3 or less carbon atoms such as a methylene group and with at least one of —O—, —C(=O)—, and —NH—.

In the formula (d1-6a), when L and $C^d$ bond to one another to form a ring structure, examples of the ring structure include a ring structure formed by bonding of a branched chain alkylene group and an epoxy group (a structure having an alicyclic epoxy group) and organic groups represented by the following formula (d1-6b) and (d1-6c).

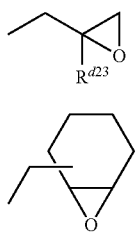

(d1-6b)

(d1-6c)

In the formula (d1-6b), $R^{d23}$ is a hydrogen atom or a methyl group.

Hereinafter, an epoxy compound having at least one group selected from the group consisting of an oxiranyl group, an oxetanyl group, and an alicyclic epoxy group is exemplified as examples of the compound represented by the formula (d1-6), but not limited thereto.

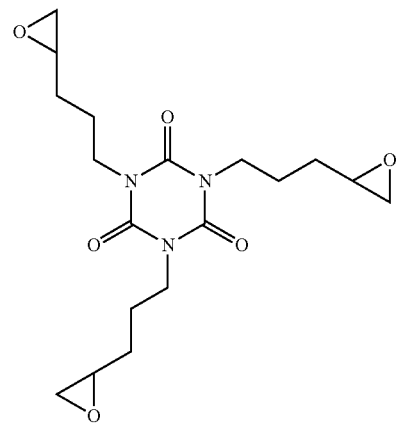

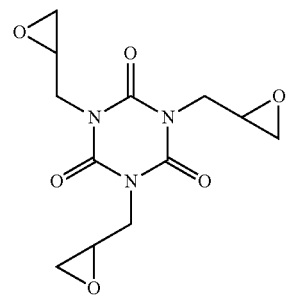

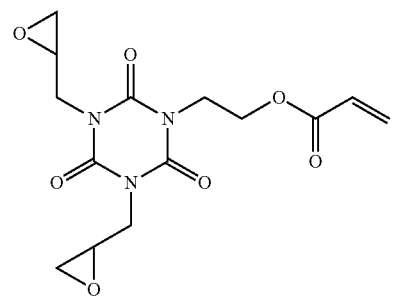

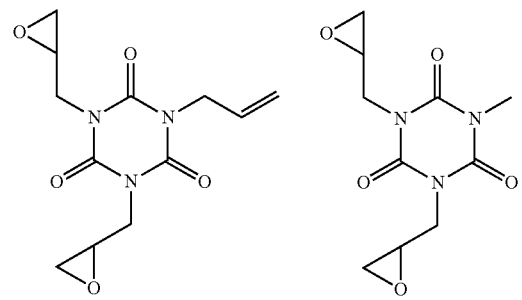

75
-continued
76
-continued
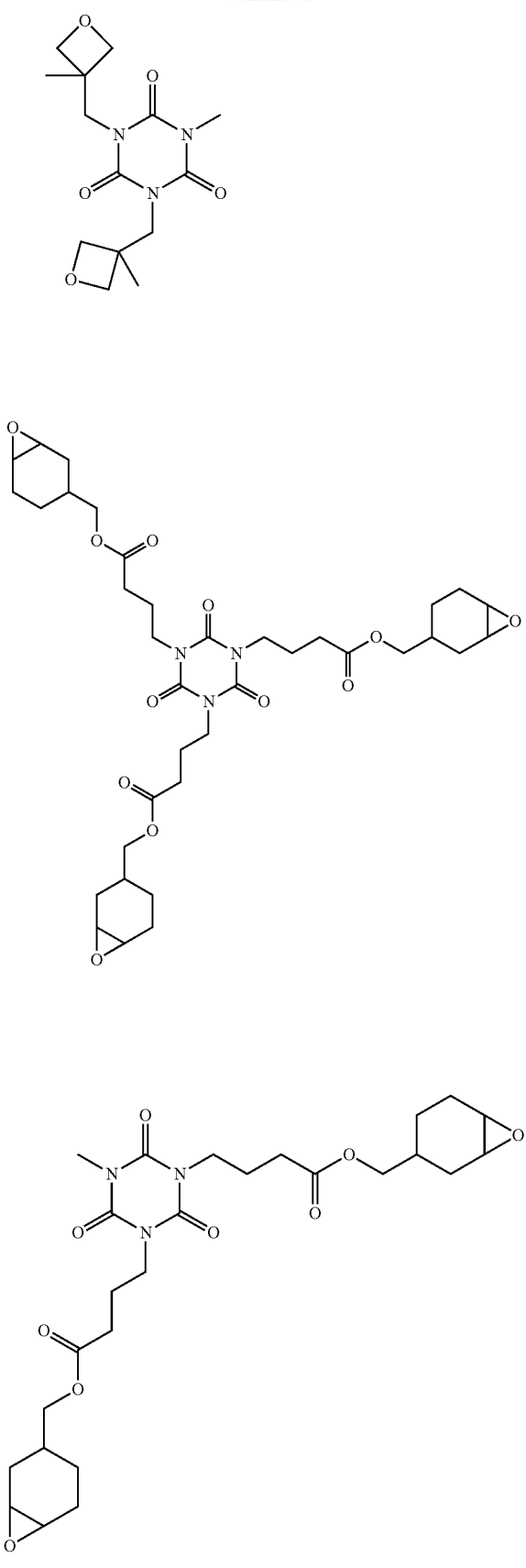
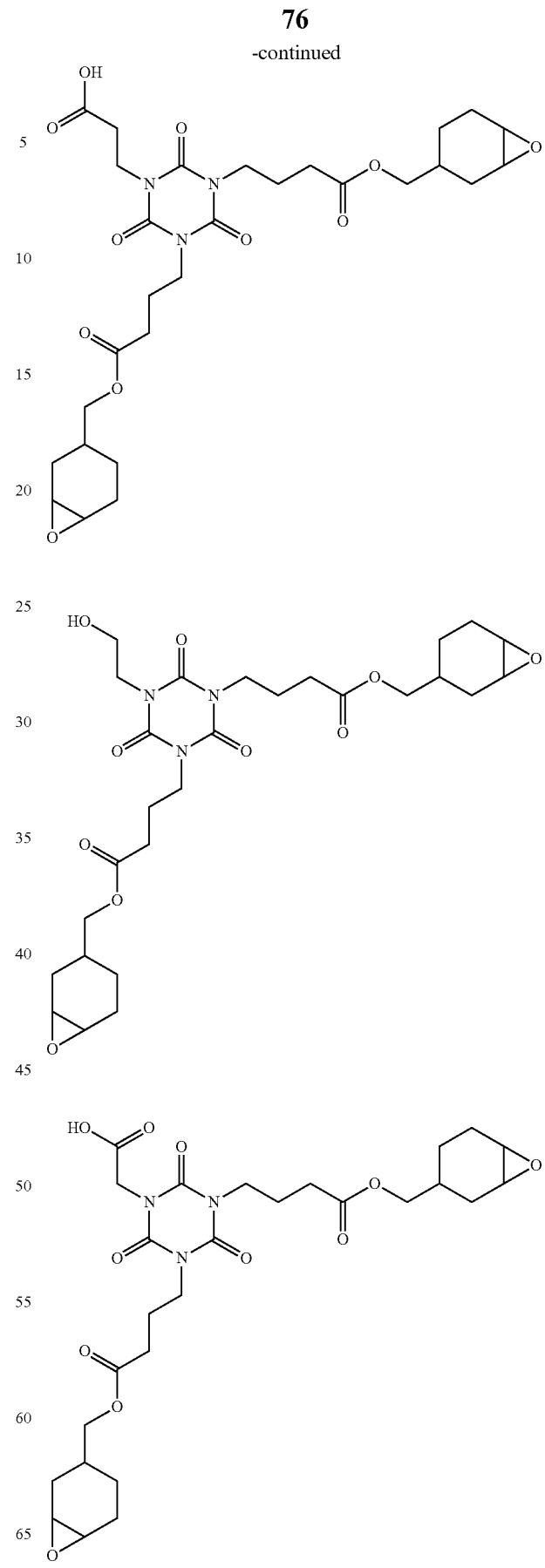

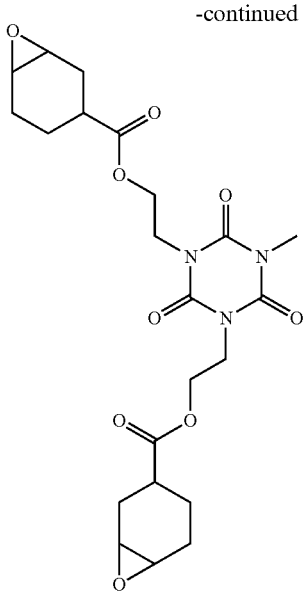

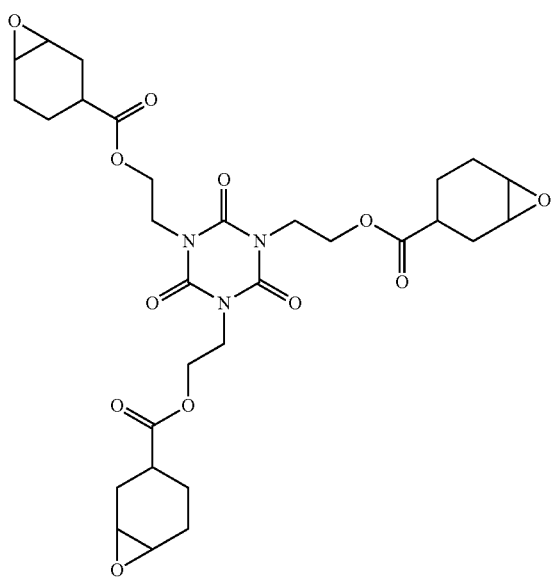

Furthermore, as a compound which can preferably be used as the polyfunctional crosslinkable compound (D), a siloxane compound having two or more glycidyl groups in a molecule (hereinafter also referred to as "siloxane compound") is exemplified.

The siloxane compound is a compound having a siloxane skeleton constituted with siloxane bonds (Si—O—Si) and two or more glycidyl groups in a molecule. Examples of the siloxane skeleton in the siloxane compound include a cyclic siloxane skeleton, a polysiloxane skeleton (for example, a linear or branched silicone (a linear or branched polysiloxane), polyhedral or ladder polysilsesquioxane), and the like.

Among the siloxane compounds, a compound having a cyclic siloxane skeleton represented by the following formula (d1-7) is preferred.

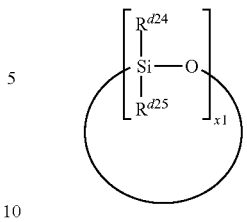

(d1-7)

In the formula (d1-7), each of $R^{d24}$ and $R^{d25}$ represent a monovalent group having a glycidyl group or an alkyl group. However, at least two of x1 $R^{d24}$(s) and X1 $R^{d25}$(s) in the compound represented by the formula (d1-7) are monovalent groups including a glycidyl group. Furthermore, x1 in the formula (d1-7) represents an integer of 3 or more. In a compound represented by the formula (d1-7), $R^{d24}$ and $R^{d25}$ may be the same or different. In addition, plural $R^{d24}$s may be the same or different. Plural $R^{d25}$s may also be the same or different.

As above-mentioned monovalent group including a glycidyl group, a glycidyl ether group represented by -D-O—$R^{d26}$ [where D represents an alkylene group, and $R^{d26}$ represents a glycidyl group] is preferred. Examples of above-mentioned D (alkylene group) include a linear or branched alkylene group having 1 or more and 18 or less carbon atoms such as a methylene group, a methylmethylene group, a dimethylmethylene group, a dimethylene group, and trimethylene group.

Examples of above-mentioned alkyl groups include a linear or branched alkyl group having 1 or more and 18 or less carbon atoms (preferably 1 or more and 6 or less carbon atoms, and particularly preferably 1 or more and 3 or less carbon atoms) such as a methyl group, an ethyl group, a propyl group, and an isopropyl group.

In the (d1-7), x1 represents an integer of 3 or more. x1 is preferably an integer of 3 or more and 6 or less in view of excellent crosslinking reactivity when cured film is formed.

The number of glycidyl groups possessed by the siloxane compound in a molecule is two or more. The number of glycidyl groups is preferably 2 or more and 6 or less, and particularly preferably 2 or more and 4 or less, in view of excellent crosslinking reactivity when cured film is formed.

The photosensitive resin composition may contain, in addition to the siloxane compound represented by the formula (d1-7), compounds including a siloxane skeleton, such as an alicyclic epoxy group-containing cyclic siloxane, an alicyclic epoxy group-containing silicone resin mentioned in Japanese Unexamined Patent Application, Publication No. 2008-248169, and an organopolysilsesquioxane resin having at least two epoxy functional groups in one molecule mentioned in Japanese Unexamined Patent Application, Publication No. 2008-19422.

More specifically, cyclic siloxane compounds represented by the following formulae having two or more glycidyl groups in a molecule are exemplified as the siloxane compound. Furthermore, X-40-2670, X-40-2701, X-40-2728, X-40-2738, and X-40-2740 (all manufactured by Shinetsu Chemical Co., Ltd.) may also be used as the siloxane compound.

79
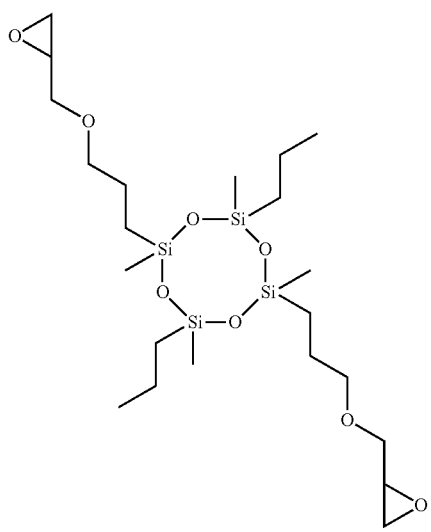
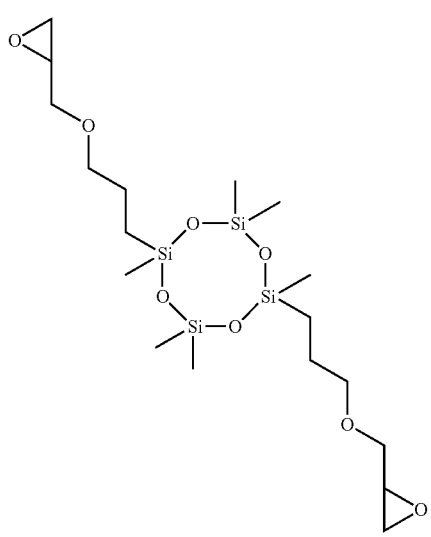
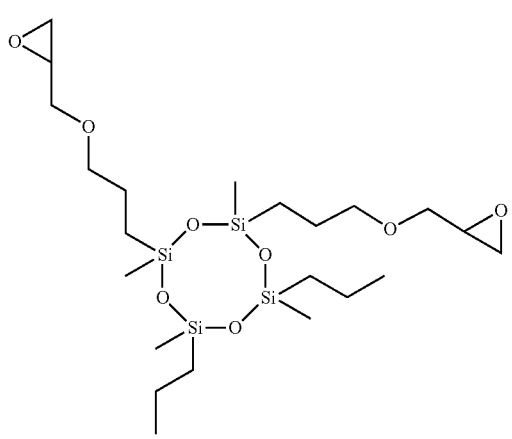
80
-continued
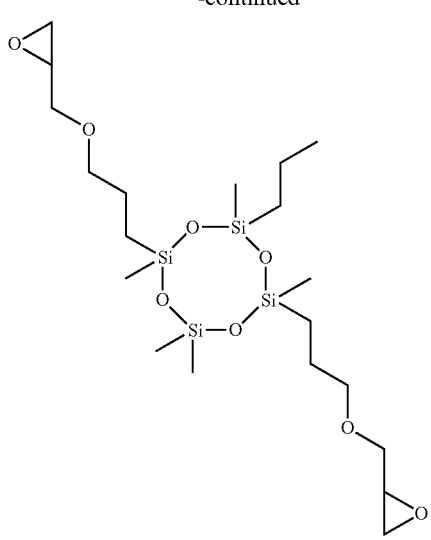
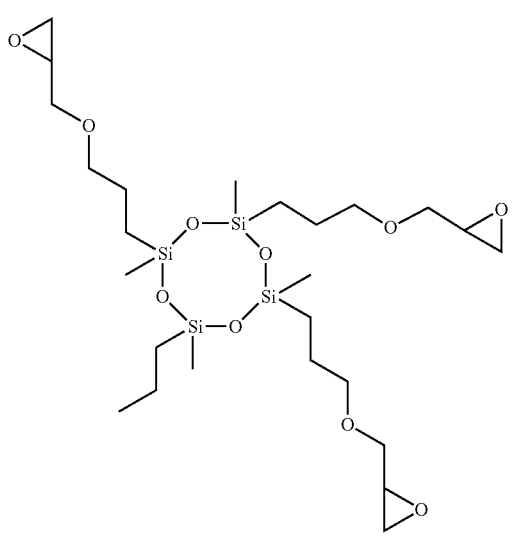
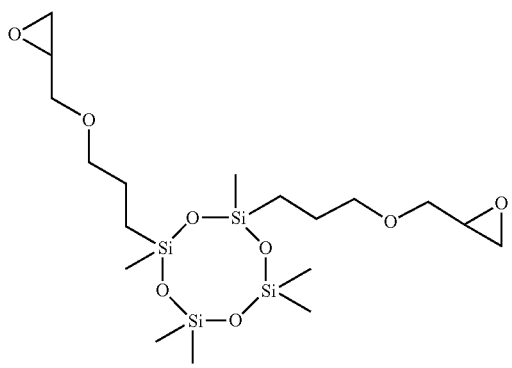

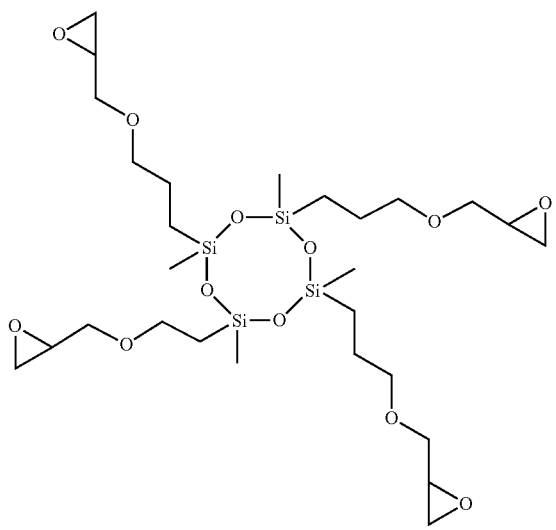

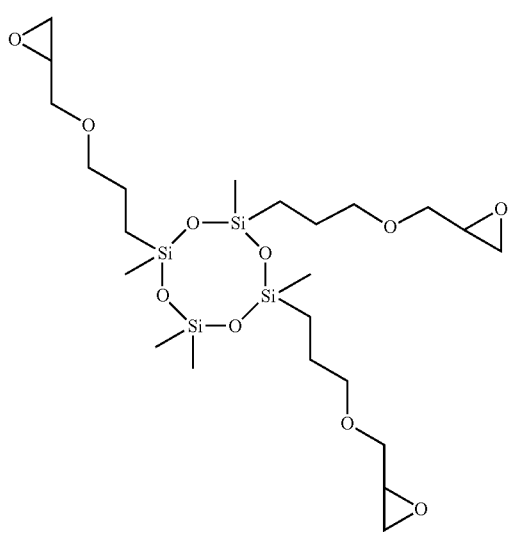

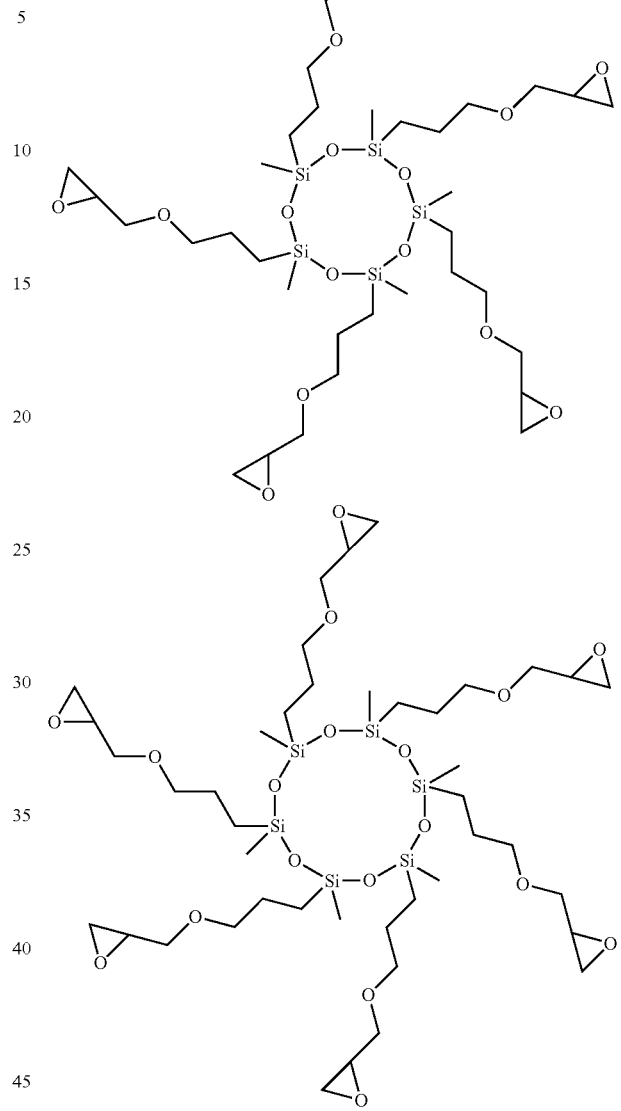

The content of the polyfunctional crosslinkable compound (D) is preferably 1% by mass or more and 40% by mass or less, and more preferably 3% by mass or more and 30% by mass or less, based on the mass (total solid component) of the photosensitive resin composition, excluding the mass of an organic solvent (S) mentioned below. By adjusting the content of the polyfunctional crosslinkable compound (D) in the above range, it is easy to obtain a photosensitive resin composition capable of forming a cured film which scarcely generates a gas.

A ratio of the content [g] of the alkali-soluble resin (A) to the content [g] of the polyfunctional crosslinkable compound (D) in the photosensitive resin composition is preferably within a range of 15:1 to 0.5:1, more preferably 10:1 to 1:1, and still more preferably 8:1 to 2:1. By using the alkali-soluble resin (A) and the polyfunctional crosslinkable compound (D) in such ratio, it is easy to obtain a photosensitive resin composition capable of forming a cured film which scarcely generates a gas.

<Fluorine-based Resin (F)>

The photosensitive resin composition may include a fluorine-based resin (F) (hereinafter also referred to as "component (F)"). When the photosensitive resin composition contains the fluorine-based resin (F), liquid repellency is imparted to a cured film formed by using the photosensitive resin composition. For example, when a luminous layer is formed by a printing method such as an ink jet method in the region demarcated by a bank formed by using the photosensitive resin composition on a substrate for an organic EL element provided with the bank, it is possible to prevent adhesion of the bank to ink and mixing of ink with an adjacent pixel when ink is injected into the region surrounded, due to repelling of ink by the bank.

The fluorine-based resin is a resin containing a fluorine atom, and is not particularly limited as long as the resin can impart liquid repellency to a cured film formed by using the photosensitive resin composition. The fluorine-based resin may be a homopolymer of a monomer containing a fluorine atom, or a copolymer of a monomer containing a fluorine atom and a monomer containing no fluorine atom.

Suitable examples of the fluorine-base polymer include a copolymer in which an (f1) monomer having an ethylenically unsaturated group and a fluorine atom and an (f2) (meth)acrylic acid are copolymerized. When the fluorine-base polymer (F) is used, a cured film having excellent liquid repellency, particularly, a bank having excellent liquid repellency for an organic EL element can easily be formed by using the photosensitive resin composition.

((f1) Monomer having an Ethylenically Unsaturated Group and a Fluorine Atom)

A monomer having an ethylenically unsaturated group and a fluorine atom (hereinafter referred to as "(f1) monomer") is not particularly limited as long as the polymer has an ethylenically unsaturated group and a fluorine atom. A compound represented by the following formula (f1-1) is exemplified as such an (f1) monomer. These (f1) monomers can be used alone or in combination of two or more types thereof.

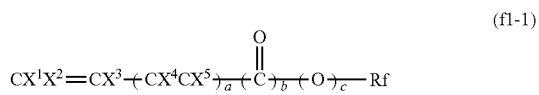

In the formula (f1-1), $X^1$ and $X^2$ each independently represent a hydrogen atom, or a fluorine atom, X3 represents a hydrogen atom, a fluorine atom, a methyl group, or a perfluoromethyl group, and $X^4$ and $X^5$ represent a hydrogen atom, a fluorine atom, or a perfluoromethyl group. Rf represents a fluorinated alkyl group having 1 or more and 40 or less, or a fluorinated alkyl group having an ether bond and 2 or more and 100 or less carbon atoms, a represents an integer of 0 or more and 3 or less, and b and c each independently represent 0 or 1. When Rf is a fluorinated alkylene group, the number of carbon atoms thereof is preferably 2 of more and 20 or less, more preferably 3 or more and 10 or less, and particularly preferably 4 or more and 6 or less. When Rf is a fluorinated alkyl group having an ether bond, the number of carbon atoms thereof is preferably 2 or more and 50 or less, more preferably 3 or more and 20 or less, and particularly preferably 4 or more and 6 or less.

The content of unit derived from the (f1) monomer is preferably 30% by mass or more and 80% by mass or less, more preferably 40% by mass or more and 60% by mass or less with respect to the mass of the fluorine-based polymer (F). When the content of the unit derived from the (f1) monomer in the fluorine-based resin (F) is adjust in the above range, a cured film having excellent liquid repellency can easily be formed by using the photosensitive resin composition, and the compatibility between the fluorine-based resin (F) and other components tend to become satisfactory.

Furthermore, it is preferred that the (f1) monomer has a group represented by $-(CF_2)_tF$ (where t is 1 or more and 10 or less). t is more preferably 1 or more and 8 or less, and further preferably 2 or more and 6 or less. When the (f1) monomer has above-mentioned group, it is easy to form a cured film having excellent liquid repellency by using the photosensitive resin composition.

<(f2) (Meth)Acrylic Acid>

The fluorine-based resin (F) preferably include a unit derived from an (f2) (meth)acrylic acid which is a monomer having a carboxy group.

The content of a unit derived from the (f2) (meth)acrylic acid is preferably 0.1% by mass or more and 20% by mass or less with respect to the mass of the fluorine-based resin (F). When the content of the unit derived from the (f2) (meth)acrylic acid in the fluorine-based resin (F) is adjust in the above range, it is easy to obtain the photosensitive resin composition having excellent developability and capable of forming a cured film having excellent liquid repellency.

The fluorine-based resin (F) may be optionally copolymerized with other monomers except for the (f1) monomer and the (f2) monomer mentioned above. Examples of other monomers include various monomers mentioned below.

((f3) Monomer having an Ethylenically Unsaturated Group and an Epoxy Group)

The fluorine-based resin (F) is preferably is a copolymer in which a monomer having a ethylenically unsaturated group and an epoxy group (hereinafter referred to as "(f3) monomer") is further copolymerized. When (f3) monomer is copolymerized, liquid-repellent property of a cured film formed by using the photosensitive resin composition is improved.

Examples of (f3) monomer include glycidyl (meth)acrylate, alicyclic epoxy compound represented by the following formulae (f3-1) to (f3-3), monomer obtainable by reacting a carboxy group of a (meth)acrylic acid with epoxy groups of an epoxy compound having bi- or more functionality, and a monomer obtainable by reacting a hydroxy group or a carboxy group of acrylic monomer having the hydroxy group or the carboxy group in side chain with epoxy groups of an epoxy compound having bi- or more functionality, and the like. Among these, glycidyl (meth)acrylate is preferable. These (f3) monomers can be used alone or in combination of two or more types thereof.

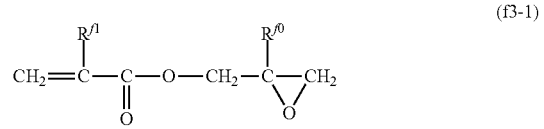

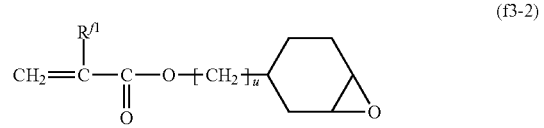

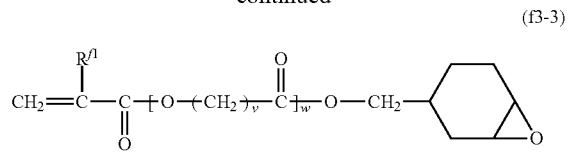

(f3-3)

In the formulae (f3-1), (f3-2), and (f3-3), $R^{f0}$ represents a hydrogen atom or an alkyl group having 1 or more and 6 or less carbon atoms, $R^{f1}$ represents a hydrogen atom or a methyl group, u represents an integer of 1 or more and 10 or less, and v and w each independently represent an integer of 1 or more and 3 or less.

When the fluorine-based resin (F) includes a unit derived from the (f3) monomer, the content of the unit in the fluorine-based resin (F) is preferably 1% by mass or more and 40% by mass or less, and more preferably 5% by mass or more and 15% by mass or less, based on the mass of the fluorine-based resin (F). When the content of the unit derived from the (f3) monomer in the fluorine-based resin (F) is adjust in the above range, it is easy to obtain a photosensitive resin composition capable of forming a cured film having satisfactory liquid repellency.

((f4) Monomer having Structure Represented by Formula (f4-1))

The fluorine-based resin (F) is preferably a copolymer obtained by further copolymerizing a monomer having an ethylenically unsaturated group and a structure represented by the following formula (f4-1) (hereinafter referred to as "(f4) monomer"). By copolymerizing the (f4) monomer, it is easy to obtain a photosensitive resin composition having excellent developability, thus making it possible to improve the compatibility between the fluorine-based resin (F) and other components in the photosensitive resin composition.

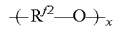

(f4-1)

The (f4) monomer preferably has an ethylenically unsaturated group and a structure represented by the following formula (f4-2).

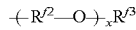

(f4-2)

In the formula (f4-1) and (f4-2), $R^{f2}$ represents an alkylene group having 1 or more and 5 or less carbon atoms, and the alkylene group may be linear or branched. Among the alkylene groups, an alkylene group having 1 or more and 3 or less carbon atoms is preferred, and an ethylene group is the most preferred. $R^{f3}$ represents a hydrogen atom or an optionally substituted alkyl group having 1 or more and 20 or less carbon atoms, and the alkyl group may be linear or branched. Among the alkyl groups, an alkyl group having 1 or more and 3 or less carbon atoms is preferred, and a methyl group is the most preferred. Examples of above-mentioned substituent include a carboxy group, a hydroxy group, and an alkoxy group having 1 or more and 5 or less carbon atoms. x is an integer of 1 or more, preferably an integer of 1 or more and 60 or less, and more preferably an integer of 1 or more and 12 or less.

Examples of such an (f4) monomer include a compound represented by the following formula (f4-3) and the like. These (f4) monomers may be used alone or in combination of two or more types thereof.

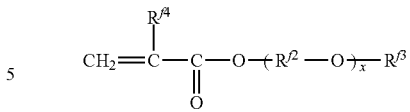

(f4-3)

In the formula (f4-3), $R^{f4}$ represents a hydrogen atom or a methyl group. $R^{f2}$, $R^{f3}$ and x are the same as defined in the above-mentioned formulae (f4-1) and (f4-2).

The content of a unit derived from the (f4) monomer is preferably 1% by mass or more and 40% by mass or less, and more preferably 5% by mass or more and 25% by mass or less, based on the mass of the fluorine-based resin (F). By adjusting the content in the above range, the developability of the photosensitive resin composition, and the compatibility between the fluorine-based resin (F) and other components in the photosensitive resin composition tend to become satisfactory, preferably.

((f5) Silicon Atom-containing Monomer)

Fluorine-based polymer (F) is preferably a copolymer in which a silicon atom-containing monomer (hereinafter referred to as "(f5) monomer") is further copolymerized. The (f5) monomer is not particularly limited as long as the (f5) monomer has an ethylenically unsaturated group and at least one alkoxy group which bonds to a silicon atom. Liquid repellency of cured film formed by using the photosensitive resin composition can be further improved by copolymerization of this (f5) monomer.

Examples of such an (f5) monomer include a compound represented by the following formula (f5-1) and the like. These (f5) monomers may be used alone or in combination of two or more types thereof.

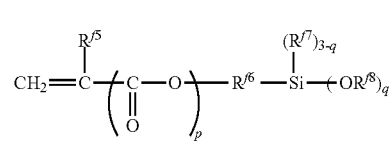

(f5-1)

In the formula (f5-1), $R^{f5}$ is a hydrogen atom or an alkyl group having 1 or more and 10 or less carbon atoms, and preferably a hydrogen atom or a methyl group. $R^{f6}$ is an alkylene group having 1 or more and 20 or less carbon atoms or a phenylene group, and preferably an alkyl group having 1 or more and 10 or less carbon atoms. $R^{f7}$ and $R^{f8}$ are each independently an alkyl group having 1 or more and 10 or less carbon atoms or a phenyl group, preferably 1 or more and 3 or less carbon atoms. When plural $R^{f7}$s bind to Si, the plural $R^{f7}$s may be the same or different. Furthermore, plural $(OR^{f8})$s bind to Si, the plural of $(OR^{f8})$s may be the same or different. P is 0 or 1, and preferably 1. q is an integer of 1 or more and 3 or less, preferably 2 or 3, and more preferably 3.

The content of a unit derived from the (f5) monomer is preferably within a range of 20% by mass or less, and more preferably 10% by mass or less, based on the mass of the fluorine-based resin (F). By adjusting the content in the above range, the liquid repellency and the compatibility between the photosensitive resin composition and other components tend to become satisfactory, preferably.

Various monomers having an ethylenically unsaturated bond can be used as other monomers other than above-mentioned monomers, and acrylic monomers are preferred.

Suitable examples of acrylic monomers include 2-hydroxyethyl methacrylate (HEMA), N-hydroxymethyl acrylamide (N-MAA), methyl methacrylate (MAA), cyclohexyl methacrylate (CHMA), isobornyl methacrylate (IBMA), and the like. The content of the unit derived from these other monomers in the fluorine-based resin (F) is preferably 0% by mass or more and 25% by mass or less with respect to the mass of the fluorine-based resin (F).

It is possible to use, as the method of reacting the (f1) monomer and the (f2) monomer and, if necessary, other monomers to obtain a copolymer, a known method.

Mass average molecular weight of the fluorine-based resin (F) is preferably 2,000 or more and 50,000 or less, and more preferably 5,000 or more and 20,000 or less. When the mass average molecular weight of the fluorinate resin (F) is 2,000 or more, heat resistance and strength of cured film formed by using the photosensitive resin composition can be improved.

The content of the fluorine-based resin (F) in the photosensitive resin composition is preferably 0.1% by mass or more and 10% by mass or less, and more preferably 0.2% by mass or more and 5% by mass or less, based on the mass (total solid component) of the photosensitive resin composition, excluding the mass of an organic solvent (S) mentioned below. When the photosensitive resin composition contains the fluorine-based resin (F) in such amount, while making sensitivity, developability, and resolution of the photosensitive resin composition satisfactory, it is easy to impart satisfactory liquid repellency to a cured film formed by using the photosensitive resin composition.

<Organic solvent (S)>

The photosensitive resin composition preferably contains an organic solvent (S) so as to improve the coatability and to adjust the viscosity.

Specific examples of the organic solvent (S) include (poly)alkyleneglycol monoalkylethers such as ethyleneglycol monomethylether, ethyleneglycol monoethylether, ethyleneglycol mono-n-propylether, ethyleneglycol mono-n-butylether, diethyleneglycol monomethylether, diethyleneglycol monoethylether, diethyleneglycol mono-n-propylether, diethyleneglycol mono-n-butylether, triethyleneglycol monomethylether, triethyleneglycol monoethylether, propyleneglycol monomethylether, propyleneglycol monoethylether, propyleneglycol mono-n-propylether, propyleneglycol mono-n-butylether, dipropyleneglycol monomethylether, dipropyleneglycol monoethylether, dipropyleneglycol mono-n-propylether, dipropyleneglycol mono-n-butylether, tripropyleneglycol monomethylether, and tripropyleneglycol monoethylether; (poly)alkyleneglycol monoalkylether acetates such as ethyleneglycol monomethylether acetate, ethyleneglycol monoethylether acetate, diethyleneglycol monomethyl ether acetate, diethyleneglycol monoethylether acetate, propyleneglycol monomethylether acetate (PGMEA), and propyleneglycol monoethylether acetate; other ethers such as diethyleneglycol dimethylether, diethyleneglycol methylethylether, diethyleneglycol diethylether, and tetrahydrofuran; ketones such as methylethylketone, cyclohexanone, 2-heptanone, and 3-heptanone; lactic acid alkyl esters such as methyl 2-hydroxypropionate, and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene, and xylene; nitrogen-containing polar organic solvents such as N-methyl-2-pyrrollidone, N,N-dimethylformamide, N,N-dimethylacetamide, N,N-dimethylisobutylamide, N,N-diethylacetamide, N,N-diethylformamide, N-methylcaprolactam, 1,3-dimetyl-2-imidazolidinone, pyridine, and N,N,N',N'-tetramethylurea; and the like.

Among these, alkyleneglycol monoalkylethers, alkyleneglycol monoalkylether acetates, above-mentioned other ethers, lactic acid alkyl esters, and above-mentioned other esters are preferred, and alkyleneglycol monoalkylether acetates and above-mentioned other ethers are more preferred. Furthermore, in view of solubility of the respective components and dispersivity or coloring agent (E), it is also preferred that the organic solvent (S) include the nitrogen-containing polar organic solvent. These solvents can be used alone, or two or more solvents can be used in combination.

The content of the organic solvent (S) is not particularly limited and is appropriately set depending on the thickness of a coating film at the concentration which enables application to a substrate. The viscosity of the photosensitive resin composition is preferably 5 cp or more and 500 cp or less, more preferably 10 cp or more and 50 cp or less, and still more preferably 20 cp or more and 30 cp or less. The solid component concentration is preferably 5% by mass or more and 75% by mass or less, more preferably 10% by mass or more and 60% by mass or less, and still more preferably 15% by mass or more and 45% by mass or less.

<other Components>

The photosensitive resin composition can optionally contain additives such as a surfactant, an anticorrosive, a heat crosslinking agent, an adhesion improver, a thermal polymerization inhibitor, a defoamer, and a silane coupling agent. It is possible to use, as any additives, conventionally known additives. The photosensitive resin composition may contain a silane coupling agent since a cured film with excellent adhesion to substrates is formed particularly easily. It is possible to use, as the silane coupling agent, conventionally known one without particular limitation. Examples of the surfactant include anionic, cationic, and nonionic compounds, examples of the thermal polymerization inhibitor include hydroquinone and hydroquinone monoethyl ether, and examples of the defoamer include silicone-based and fluorine-based compounds.

<Method for Producing Photosensitive Resin Composition>

A method for producing the photosensitive resin composition described above is not particularly limited as long as it is a method capable of uniformly mixing an alkali-soluble resin (A), a photopolymerizable monomer (B), a photopolymerization initiator (C), a coloring agent dispersion and, if necessary, any other components so that the solid component concentration of the photosensitive resin composition becomes a desired value. Preferred production method is a method, which comprises the steps of:

dispersing the above pigment (E1) in a dispersion medium in the presence of the above dispersant (E2) to prepare the above coloring agent dispersion, and mixing the thus obtained coloring agent dispersion, alkali-soluble resin (A), a photopolymerizable monomer (B), and a photopolymerization initiator (C).

The step of preparing the coloring agent dispersion is as mentioned as the method for producing a coloring agent dispersion. The step of mixing the coloring agent dispersion, an alkali-soluble resin (A), a photopolymerizable monomer (B), and a photopolymerization initiator (C) is not particularly limited as long as it is a method capable of uniformly mixing these components. When the photosensitive resin composition contains an organic solvent (S), these components may be simultaneously or successively to the organic solvent (S). When these components of the photosensitive resin composition are successively to the organic solvent (S), the order of adding these components is not particularly limited. When the coloring agent dispersion, an alkali-soluble resin (A), a photopolymerizable monomer (B), and a photopolymerization initiator (C) are mixed, optional components other than these components are optionally mixed with these components. A photosensitive resin composition is obtained by mixing the respective components in each predetermined amount, followed by uniformly stirring with a stirrer. To make the thus obtained photosensitive resin composition more uniform, the mixture may be filtered through a filter.

<<Cured Product and organic EL Element>>

The photosensitive resin composition described above is exposed or cured by heating after exposure to form a cured product. Typically, a coating film formed by using the photosensitive resin composition is cured to form a cured product.

Examples of the cured product include an insulation film. When the photosensitive resin composition contains a coloring agent (E), a colored insulation film is formed. Particularly, when the coloring agent (E) is a light shielding agent, a light shielding insulation film is formed. Suitable examples of the light shielding black insulation film include a black barrier rib in a black matrix and a black column spacer, with which a panel for various image display devices is provided. When the photosensitive resin composition contains a coloring agent (E) with a chromatic color, such as RGB, it is possible to produce a color filter by forming a cured product in the form of a colored film in the region demarcated by the black matrix. For example, a color filter including the above black matrix, and a cured film with a chromatic color as the cured product is suitably used in various display devices.

As mentioned above, a gas is scarcely generated from such cured product. Therefore, the cured product formed by using the photosensitive resin composition is suitably used as a bank for demarcation of a luminous layer in an organic EL element. The bank is formed on a substrate for an organic EL element so as to come into contact with an electrode layer made of ITO and a luminous layer composed of an organic light emitting material. The luminous layer is demarcated by the bank to form a pixel. When the electrode layer and the luminous layer are contaminated with a gas containing various components generated from the bank, acceleration of degradation is concerned. However, when the above-described cured film formed by using the photosensitive resin composition is applied as the bank, since the generation of a gas from the bank is suppressed, the electrode layer and the luminous layer are less likely to be degraded, and thus it is considered that the durability of the organic EL element is improved. Namely, it is expected that the organic EL element provided with the above-described cured film formed by using the photosensitive resin composition as the bank is excellent in durability.

The substrate equipped with the bank formed by using the photosensitive resin composition is useful as a substrate for an organic EL element. When using the substrate for an organic EL element, it is possible to produce an organic EL element having excellent durability in which degradation of the electrode layer and the luminous layer is suppressed.

<<Method for Producing Cured Product>>

The method for producing a cured product is not particularly limited as long as it is a method capable of polymerizing a photopolymerizable monomer (B) in a thin film of the photosensitive resin composition. To polymerize the photopolymerizable monomer (B), exposure is usually performed. When the photosensitive resin composition contains a polyfunctional crosslinkable compound (D), a thin film of the exposed or unexposed photosensitive resin composition is preferably heated so as to cause a crosslinking reaction between the alkali-soluble resin (A) and the polyfunctional crosslinkable compound (D).

Examples of suitable method for producing a cured product include a method which comprises the steps of: applying a photosensitive resin composition to form a coating film, and exposing the coating film. In various image display elements such as an organic EL element, when a cured product in the form of a colored film is formed, the cured product is often patterned. When the patterned cured product is formed, a method comprising the steps of:

applying a photosensitive resin composition to form a coating film, subjecting the coating film to regioselective exposure, and developing the exposed coating film, is typically employed.

To form a cured film by using the photosensitive resin composition, the photosensitive resin composition is applied on a substrate selected depending on applications of the cured film to form a coating film. The method for forming a coating film is not particularly limited and performed using, for example, a contact transfer type applicator such as a roll coater, a reverse coater, or a bar coater, or a non-contact type applicator such as a spinner (rotary applicator) or a curtain flow coater.

The thus applied photosensitive resin composition is optionally dried to form a coating film. The drying method is not particularly limited and includes, for example, (1) a method of drying at a temperature of 80° C. or higher and 120° C. or lower, and preferably at 90° C. or higher and 100° C. or lower, for 60 seconds or more and 120 seconds or less using a hot plate, (2) a method of standing at room temperature for several hours or more and several days or less, and (3) a method of placing in a warm air heater or an infrared heater for several tens of minutes to several hours to remove an organic solvent.

Then, the coating film is exposed. Exposure is performed by irradiation with active energy rays such as ultraviolet rays and excimer laser light. Exposure may be regioselectively performed, for example, by a method of exposing through a negative mask. The energy dose irradiated varies depending on the composition of the photosensitive resin composition and is preferably, for example, about 40 mJ/cm$^2$ or more and 200 mJ/cm$^2$ or less.

When the coating film is regioselectively exposed, the exposed film is developed with a developing solution, thus forming a patterned cured film. The development method is not particularly limited and, for example, a dipping method, a spraying method, and the like can be used. The developing solution is appropriately selected depending on the composition of the photosensitive resin composition. It is possible to use, as the developing solution, for example, a basic aqueous solution of sodium hydroxide, potassium hydroxide, sodium carbonate, ammonia, quaternary ammonium salt, and the like.

When the photosensitive resin composition contains a polyfunctional crosslinkable compound (D), the exposed coating film, or the patterned coating film after the development is preferably heated to form a cured product. During curing, heating causes a crosslinking reaction between the alkali-soluble resin (A) and the polyfunctional crosslinkable compound (D). Therefore, the exposed coating film, or the patterned coating film after the development is baked so as to perform curing. The baking temperature is not particularly limited as long as curing satisfactorily proceeds, and is preferably 180° C. or higher and 280° C. or lower, and more preferably 190° C. or higher and 260° C. or lower. By baking as mentioned above, a cured product of the photosensitive resin composition cured by heating is obtained.

<<Method for Producing Bank for Demarcation of Luminous Layer in Organic El Element>>

The method for producing a bank for demarcation of a luminous layer in an organic EL element is not particularly limited as long as it is a method capable of producing a bank at a predetermined position of a substrate for an organic EL element. Examples of preferably method include a method which comprises the steps of:

applying a photosensitive resin composition to form a coating film on a substrate for an organic EL element, subjecting the position corresponding to a bank in the coating film to regioselective exposure, developing the exposure coating film, and optionally heating to cure the developed coating film.

Typical examples of the substrate include a transparent substrate provided with a transparent electrode layer (anode) made of ITO at the position corresponding to the position where a luminous layer is formed on the one main surface. The bank is formed so as to surround a region where a luminous layer is formed while being contacted with the end of the transparent electrode layer.

A method of applying a photosensitive resin composition to a substrate for an organic EL element, a method of subjecting the position corresponding to the position of a bank in a coating film to regioselective exposure, a method of developing the exposed coating film, and a method of curing the developed coating film are the same as those mentioned about the method for producing a cured film.

By the method described above, a substrate provided with a bank for demarcation of a luminous layer at a predetermined position of a substrate for an organic EL element is obtained.

<<Method for Producing Organic EL Element>>

Using the above-described substrate for an organic EL element, provided with a bank composed of a cured product of the photosensitive resin composition, an organic EL element is produced. The method includes the step of forming a luminous layer in a region demarcated by the bank in the substrate for an organic EL element. Regarding the substrate for an organic EL element, provided with the bank, a transparent electrode layer (anode) composed of ITO is exposed in the region demarcated by the bank. By a typical method, a hole transporting layer is laminated on an electrode layer (anode). On the hole transporting layer, an electron transporting layer and an electrode layer (cathode) are laminated in this order, thus producing an organic EL element. If necessary, TFT, a color filter and the like are appropriately used in combination. The method of forming a hole transporting layer, a luminous layer, an electron transporting layer and the like in the region demarcated by the bank is not particularly limited, and may be either a vapor deposition method or a printing method. Since loss of the material for formation of a layer is eliminated and a layer having a desired thickness is quickly formed at a predetermined position with ease, the printing method is preferred and an ink jet method is particularly preferred as the printing method.

The organic EL element produced by the above method is provided with a bank which scarcely generates a gas, so that degradation of an electrode layer and a luminous layer is suppressed, leading to excellent durability.

EXAMPLES

The present invention will be more specifically described below by way of Examples, but the scope of the present invention is not limited to these Examples.

Preparation Example 1

3-Aminopropyltrimethoxysilane (0.027 mol) and a mixture of hexahydrophthalic anhydride and methylhexahydrophthalic anhydride (MH700G, manufactured by New Japan Chemical Co., Ltd.) (0.027 mol) were dissolved in 24 g of methyl isobutyl ketone, followed by stirring at room temperature for 1 hour. After confirming the disappearance of MH700G by gas chromatography, methyl isobutyl ketone was distilled off to obtain a mixture of the following three silane compounds.

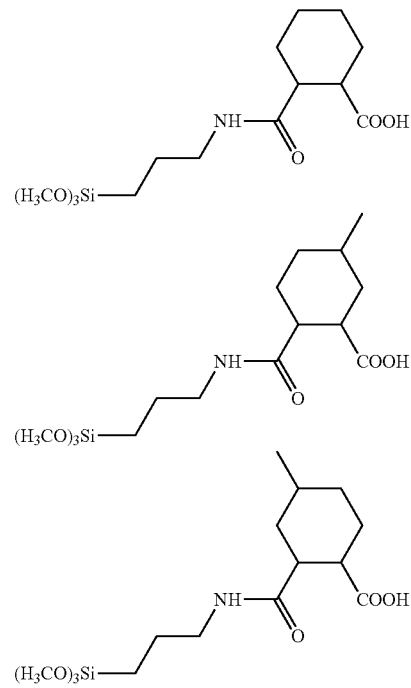

In a reaction vessel equipped with a stirrer and a thermometer, 100 g of methyl isobutyl ketone, 7.4 g (tetramethyammonium hydroxide: 0.02 mol) of an aqueous solution with a concentration of 20% by mass of tetramethyammonium hydroxide, and 20.8 g (1.49 mol) of distilled water were charged. To the reaction vessel, 68.7 g (0.20 mol) of the mixture of silane compounds obtained by the above method, 46.9 g (0.2 mol) of 3-acryloxypropyltrimethoxysilane, and 29.7 g (0.10 mol) of phenyltrimethoxysilane were gradually added at 40 to 45° C., and a reaction was performed by stirring contents in the reaction vessel at the same temperature for 3 hours. During the reaction, 100 g of methyl isobutyl ketone was added in the reaction vessel and distilled water was added to the reaction vessel by 50 g, and then the organic layer was repeatedly washed with water until the pH of the aqueous layer becomes approximately 7. Sodium carbonate was added to the thus washed organic layer and, after drying, the organic layer was filtered. Methyl isobutyl ketone was distilled off from the thus filtered organic layer to obtain a silsesquioxane compound which is used as the dispersant (E2) composed of the following constituent units (i) to (v). In silsesquioxane, the total of the contents of the constituent units (i) to (iii) is 40 mol %, the content of the constituent unit (iv) is 40 mol %, and the content of the constituent unit (v) is 20 mol %.

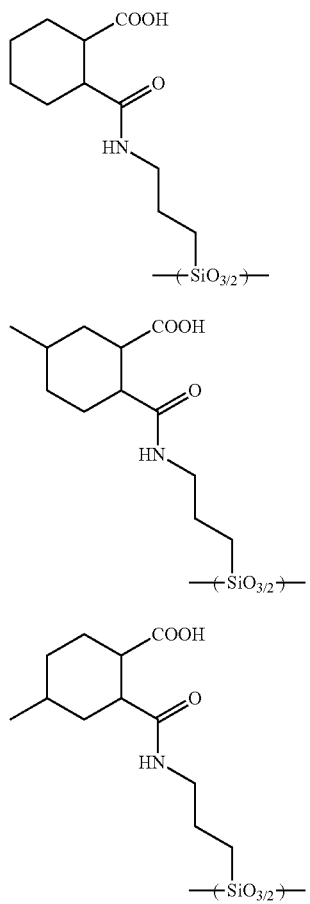

(i)

(ii)

(iii)

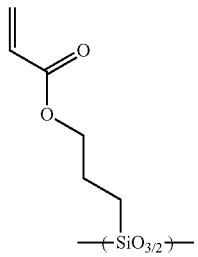

(iv)

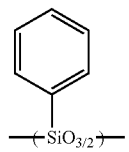

(v)

Preparation Example 2

In a 1,500 ml four-necked flask, 275 g (0.5 mol, epoxy equivalent of 292) of an epoxy compound represented by the following formula, 100 mg of 2,6-di-tert-butyl-4-methyl-phenol, and 72 g of acrylic acid were charged together with a catalyst, followed by dissolution with heating at 90 to 100° C. while blowing air at a rate of 25 mL/minute.

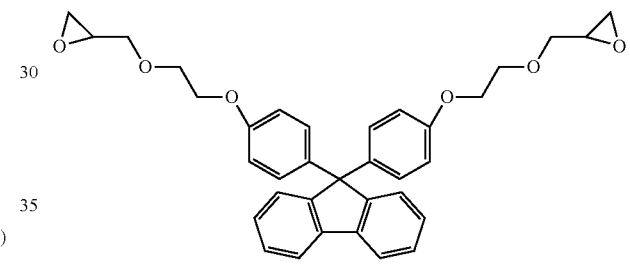

The temperature was gradually raised in a state where the solution is in a white turbid state, followed by complete dissolution by heating to 120° C. Although the solution gradually becomes transparent and viscous, stirring was continued. During stirring, an acid value was measured and stirring with heating was continued until the acid value became less than 1.0 mgKOH/g. It required 12 hours until the acid value reaches the target. After cooling to room temperature, a bisphenol fluorene-type epoxy acrylate of a structure represented by the following formula, which is colorless and transparent, and is solid, was obtained.

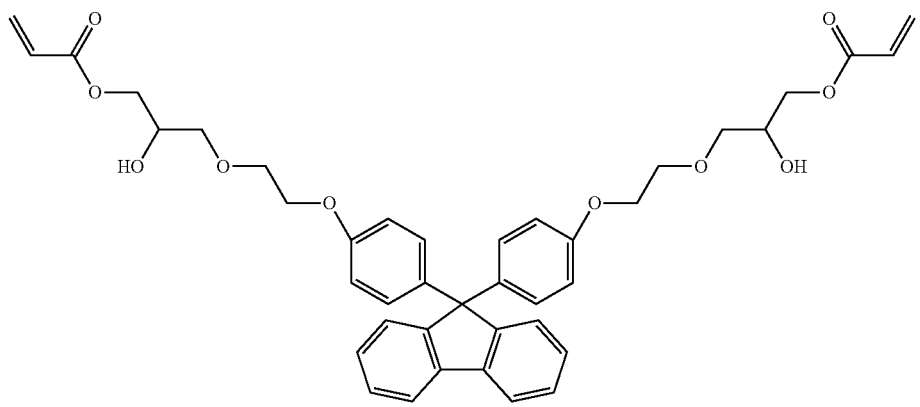 [SMILES: C=CC(=O)OCC(O)COCCOc1ccc(C2(c3ccc(OCCOCC(O)COC(=O)C=C)cc3)c3ccccc3-c3ccccc32)cc1]

After dissolving 347.4 g (0.5 mol) of the thus obtained bisphenol fluorene-type epoxy acrylate by adding 650 g of propylene glycol monomethyl ether acetate thereto, a compound represented by the following formula (b1)-1 (hereinafter also referred to as "compound (b1)-1") (0.25 mol) was mixed together with a catalyst, and then a reaction was performed at 130° C. for 4 hours after gradually raising the temperature. The compound (b1)-1 is tetracarboxylic dianhydride represented by the following formula (norbornane-2-spiro-α-cyclopentanone-α'-spiro-2"-norbornane-5,5",6,6"-tetracarboxylic dianhydride).

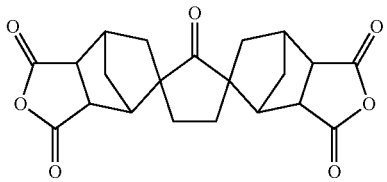

(b1)-1

After confirming the disappearance of an acid anhydride group, 30 g of 1,2,3,6-tetrahydrophthalic anhydride was mixed, followed by a reaction at 90° C. for 6 hours reaction to obtain a resin A1 which is a cardo resin produced from a bisphenol fluorene-type epoxy acrylate and acid anhydride (compound (b1)-1). Disappearance of acid anhydride was confirmed by IR spectrum.

Example 1

After adding 75 parts by mass of a lactam-based pigment ("Irgaphor" (registered trademark) Black S0100CF; manufactured by BASF Ltd.), 15 parts by mass of the silsesquioxane compound obtained in Preparation Example 1, and 10 parts by mass of a urethane resin-based dispersant to propylene glycol monomethyl ether acetate so that the solid component concentration became 20% by mass, a dispersion treatment was performed to obtain a coloring agent dispersion. Regarding the thus obtained coloring agent dispersion, the dispersibility of the pigment was evaluated in accordance with the following criteria. The evaluation results are shown in Table 3.

Good: Sedimentation of a pigment is not confirmed even when dispersion is left to stand at room temperature for one week.

Bad: Sedimentation of a pigment is confirmed when dispersion is left to stand at room temperature for one week.

225 Parts by mass (total of pigment and dispersant: 45 parts by mass) of the thus obtained coloring agent dispersion, 30 parts by mass of a resin A1 (alkali-soluble resin (A)) obtained in Preparation Example 2, 7 parts by mass of dipentaerythritol hexaacrylate (photopolymerizable monomer (B)), 8 parts by mass of an oxime ester compound having the following structure (photopolymerization initiator (C)), and 10 parts by mass of the following D1 (polyfunctional crosslinkable compound (D)) were mixed, and propylene glycol monomethyl ether acetate was added again so that the solid component concentration became 20% by mass to obtain a photosensitive resin composition.

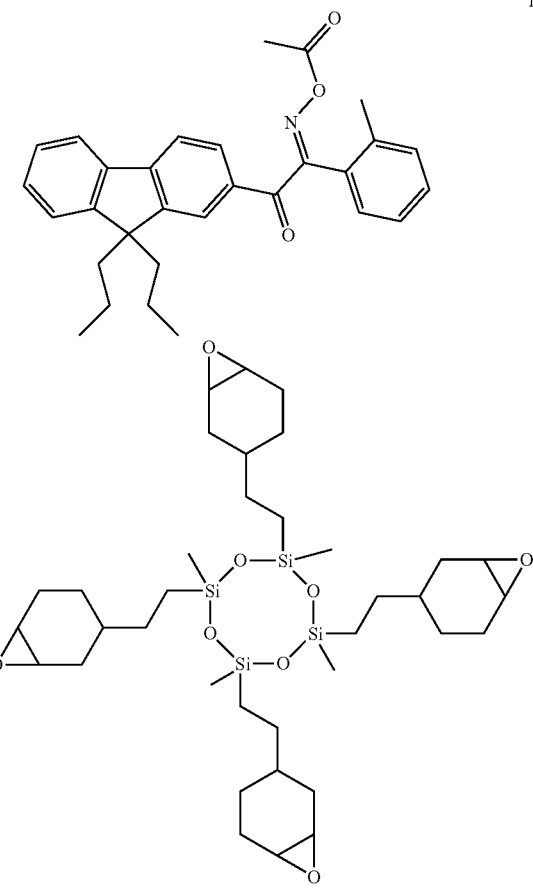

D1

Using the thus obtained photosensitive resin composition, the generation of a gas from the cured product was evaluated in accordance with the following method.

<Evaluation of Gas Generation>

On a glass substrate measuring 10 cm×10 cm, a photosensitive resin composition was applied and then dried at 100° C. for 120 seconds to form a coating film. Using an exposure device with a high-pressure mercury lamp, a coating film was exposed over the entire surface at an exposure dose of 50 mJ/cm². The exposed coating film was post-baked at 230° C. for 30 minutes to obtain a cured film having a thickness of 2 μm.

Using the thus formed cured film as a sample, the amount of a gas generated was evaluated by gas chromatography mass spectrometry (P&T-GC/MS) to which purge and trap sampler (thermal desorption device) is attached. The measurement and the determination of the gas were performed by the following procedures (i) to (iii).

(i) Gas Generation and Collection to Secondary Adsorption Tube

After placing 1 mg of a cured film in a primary trap tube, heating was performed at 230° C. for 10 minutes using a thermal desorption device (manufactured by Perkin Elmer: Tarbo Matrix ATD), and thus the desorbed gas was adsorbed to a secondary trap tube.

(ii) GC/MS Analysis

After heating a secondary trap tube at 250° C. for 1 minute, the desorbed gas was analyzed by GC/MS (manufactured by Agilent Technologies: 7890B(GC), 5977AMSD(MS)).

(iii) Quantitative Analysis

Determination was performed from each peak area of a chart obtained by PT-GC/MS analysis of a resin composition. Specifically, a total area % of a peak of an outgas thus detected was defined as an evaluation value.

Based on the thus obtained evaluation value (total area %), the amount of a gas generated was evaluated in accordance with the following criteria. When the evaluation value is within a range of 3 to 5, it is considered that a gas is scarcely generated. The evaluation results are shown in Table 1.

5: The value of evaluation value is less than $1.0E^8$.
4: The value of the evaluation value is $1.0E^8$ or more and less than $2.5E^8$.
3: The value of the evaluation value is $2.5E^8$ or more and less than $5.0E^8$.
2: The value of the evaluation value is $5.0E^8$ or more and less than $1.0E^9$.
1: The value of the evaluation value is $1.0E^9$ or more.

Comparative Examples 1 to 3

In the same manner as in Example 1, except that the dispersant is changed to the dispersant mentioned in Table 3, a coloring agent dispersion and a photosensitive resin composition were prepared. Regarding the thus obtained coloring agent dispersion and photosensitive resin composition, dispersibility of the pigment and the generation of a gas from the cured film were evaluated in the same manner as in Example 1. The evaluation results are shown in Table 3. Regarding Comparative Example 3, since pigment dispersion could not be satisfactorily performed, gas generation was not evaluated.

Example 2 and Comparative Example 4

In Example 2, silver-tin alloy fine particles having an average particle diameter of 200 to 300 nm were used as the pigment in place of the lactam-based pigment used in Example 1 to obtain coloring agent dispersion. Regarding the thus obtained coloring agent dispersion, the dispersibility was evaluated in the same manner as in Example 1, and a photosensitive resin composition was prepared and gas generation was evaluated. In Comparative Example 4, silver-tin alloy fine particles having an average particle diameter of 200 to 300 nm were used as the pigment in place of the lactam-based pigment used in Comparative Example 2 to obtain coloring agent dispersion. Regarding the thus obtained coloring agent dispersion, the dispersibility was evaluated in the same manner as in Example 1, and a photosensitive resin composition was prepared and gas generation was evaluated.

TABLE 3

| | Type of dispersant | Dispersivity of pigment | Evaluation of gas generation |
|---|---|---|---|
| Example 1 (Lactam-based pigment) | Silsesquioxane compound/ Urethane resin-based dispersant | Good | 5 |
| Comparative Example 1 (Lactam-based pigment) | Urethane resin-based dispersant | Good | 2 |
| Comparative Example 2 (Lactam-based pigment) | Acrylic resin-based dispersant | Good | 1 |
| Comparative Example 3 (Lactam-based pigment) | Polyimide resin-based dispersant | Bad | — |
| Example 2 (AgSn alloy) | Silsesquioxane compound/ Urethane resin-based dispersant | Good | 5 |
| Comparative Example 4 (AgSn Alloy) | Acrylic resin-based dispersant | Good | 1 |

As is apparent from Example in Table 3, when a pigment is dispersed using a dispersant containing a silsesquioxane compound of a predetermined structure to prepare a coloring agent dispersion, the pigment is satisfactorily dispersed and the generation of a gas from a cured product of a photosensitive resin composition prepared by using the thus obtained coloring agent dispersion is remarkably suppressed. As is apparent from Comparative Examples 1 to 4, when the silsesquioxane compound of a predetermined structure is not used as the dispersant, pigment dispersion cannot be satisfactorily performed, or the generation of a gas from the photosensitive resin composition can be hardly suppressed even if the pigment can be satisfactorily dispersed.

What is claimed is:

1. A coloring agent dispersion comprising a coloring agent (E), wherein the coloring agent (E) contains a pigment (E1) and a dispersant (E2),
a content of the pigment (E1) is 30% by mass or more and 95% by mass or less based on the mass of the total solid component of the coloring agent dispersion,
the dispersant (E2) contains a silsesquioxane compound including a constituent unit represented by the following formula (e2a):

wherein $R^{e1}$ is a monovalent organic group, and
the silsesquioxane compound comprises at least one selected from the group consisting of an amide bond and a urethane bond.

2. The coloring agent dispersion according to claim 1, wherein the Re1 includes at least one selected from the group consisting of an aromatic group, an amide bond, and a urethane bond.

3. The coloring agent dispersion according to claim 1, wherein the $R^{e1}$ is a group represented by the following formula (e2a-I):

$$-X^e-B^e-Y^e-COOH \qquad \text{(e2a-I)}$$

or a group represented by the following formula (e2a-II):

$$-Z^e-A^e \qquad \text{(e2a-II)}$$

wherein $X^e$ is a single bond, an alkylene group having 1 or more and 6 or less carbon atoms, an arylene group having 6 or more and 12 or less carbon atoms, or a group represented by $-R^{e6}-NH-R^{e7}-$,
$R^{e6}$ and $R^{e7}$ each independently represent an alkylene group having 1 or more and 3 or less carbon atoms, $Y^e$ is a divalent cyclic organic group, or a straight-chain aliphatic hydrocarbon group having 1 to 20 carbon atoms, $B^e$ is —NH—CO—, —CO—NH—, —NH—CO—O—, —O—CO—NH—, or —NH—CO—NH—, $X^e$ and $Y^e$ each independently may be substituted with one or more groups selected from the group consisting of a (meth)acryloyloxy group, a vinyl group, and an epoxy group-containing organic group, $Z^e$ is a single bond, an alkylene group having 1 to 6 carbon atoms, or an arylene group having 6 or more and 12 or less carbon atoms, and $A^e$ is a (meth)acryloyloxy group, a vinyl group, or an epoxy group-containing organic group, and wherein the silsesquioxane compound includes, as a constituent unit represented by the formula (e2a), a constituent unit (A) having a group represented by the formula (e2a-I) as the $R^{e1}$, and wherein in all of the constituent units (A) in the silsesquioxane compound, when the $R^{e1}$ is not substituted with a (meth)acryloyloxy group, a vinyl group, or an epoxy group-containing organic group, the silsesquioxane compound includes a constituent unit (B) which is represented by the formula (e2a) and has a group represented by the formula (e2c) as the $R^{e1}$.

4. The coloring agent dispersion according to claim 1, wherein the amount of the dispersant (E2) is 5% by mass or more and 70% by mass or less based on the mass of the total solid component of the coloring agent dispersion.

5. The coloring agent dispersion according to claim 1, wherein the pigment (E1) contains a light shielding agent.

6. A photosensitive resin composition comprising an alkali-soluble resin (A), a photopolymerizable monomer (B), a photopolymerization initiator (C), and the coloring agent dispersion according to claim 1.

7. The photosensitive resin composition according to claim 6, wherein the content of the pigment (E1) is within a range of 5% by mass or more and 80% by mass or less based on the mass of the total solid component of the photosensitive resin composition.

8. The photosensitive resin composition according to claim 6, wherein the alkali-soluble resin (A) contains a resin including a cardo skeleton.

9. The photosensitive resin composition according to claim 8, wherein the resin including a cardo skeleton is a resin represented by the following formula (a-1):

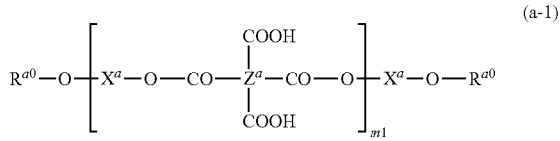

(a-1)

Wherein $X^a$ represents a group represented by the following formula (a-2):

wherein $R^{a1}$ each independently represent a hydrogen atom, a hydrocarbon atom having 1 or more and 6 or less carbon atoms, or a halogen atom, $R^{a2}$ each independently represent a hydrogen atom or a methyl group, $R^{a3}$ each independently represent a straight-chain or branched-chain alkylene group, m2 represents 0 or 1, and $W^a$ represents a group represented by the following formula (a-3):

(a-3)

Wherein a ring A represents an aliphatic ring which may be fused with an aromatic ring and may have a substituent, $R^{a0}$ is a hydrogen atom or a group represented by —CO—$Y^a$—COOH, $Y^a$ represents a divalent residue in which an acid anhydride group is eliminated from dicarboxylic anhydride, and $Z^a$ represents a tetravalent residue in which two acid anhydride groups are eliminated from tetracarboxylic dianhydride, and wherein, in the formula (a-1), m1 represents an integer of 0 or more and 20 or less.

10. The photosensitive resin composition according to claim 6, further comprising a polyfunctional crosslinkable compound (D) having plural epoxy groups or oxetanyl groups in one molecule, wherein epoxy equivalent or oxetanyl equivalent of the polyfunctional crosslinkable compound (D) is 50 g/eq or more and 350 g/eq or less.

11. The photosensitive resin composition according to claim 10, wherein the polyfunctional crosslinkable compound (D) contains an epoxy compound having two or more epoxy groups per one molecule.

12. A cured product obtained by curing the photosensitive resin composition according to claim 6.

13. An organic electroluminescent (EL) element comprising the cured product according to claim 12.

14. A method for forming a pattern, the method comprising:
applying the photosensitive resin composition according to claim 6 to form a coating film;
subjecting the coating film to regioselective exposure; and
developing the exposed coating film.

15. A method for producing the photosensitive resin composition according to claim 6, the method comprising:
dispersing the pigment (E1) in a liquid in the presence of the dispersant (E2) to prepare the coloring agent dispersion; and (a-2)

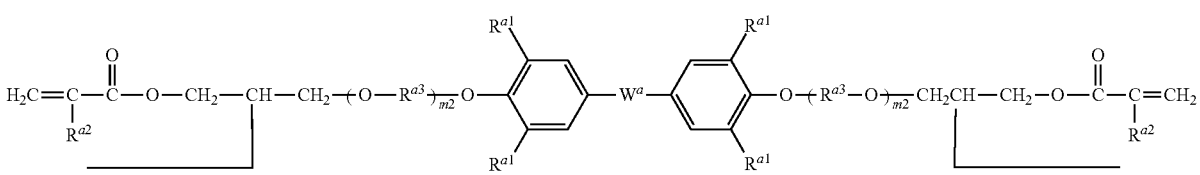

mixing the coloring agent dispersion, the alkali-soluble resin (A), the photopolymerizable monomer (B), and the photopolymerization initiator (C).

16. A coloring agent dispersion comprising a coloring agent (E), wherein
the coloring agent (E) comprises a pigment (E1) and a dispersant (E2),
the content of the pigment (E1) is 30% by mass or more and 95% by mass or less based on the mass of the total solid component of the coloring agent dispersion,
the dispersant (E2) contains a silsesquioxane compound including a constituent unit represented by the following formula (e2a):

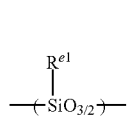

(e2a)

wherein, in the formula (e2a), $R^{e1}$ is a monovalent organic group, and
the dispersant (E2) does not include an acryl resin-based dispersant.

17. The coloring agent dispersion according to claim 1, wherein the silsesquioxane compound does not comprise a (meth)acryloyloxy group.

18. The coloring agent dispersion according to claim 1, wherein the silsesquioxane compound does not comprise an acryl resin-based constituent unit.

* * * * *